United States Patent
Shimabukuro et al.

(10) Patent No.: US 9,728,499 B2
(45) Date of Patent: Aug. 8, 2017

(54) SET OF STEPPED SURFACES FORMATION FOR A MULTILEVEL INTERCONNECT STRUCTURE

(71) Applicant: SanDisk Technologies, Inc., Plano, TX (US)

(72) Inventors: Seiji Shimabukuro, Yokkaichi (JP); Hiroaki Iuchi, Yokkaichi (JP); Michiaki Sano, Yokkaichi (JP); Naoki Takeguchi, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/554,685

(22) Filed: Nov. 26, 2014

(65) Prior Publication Data
US 2016/0148835 A1 May 26, 2016

(51) Int. Cl.
*H01L 21/768* (2006.01)
*H01L 23/522* (2006.01)
*H01L 27/11556* (2017.01)
*H01L 27/11582* (2017.01)
(Continued)

(52) U.S. Cl.
CPC .... *H01L 23/5226* (2013.01); *H01L 21/76816* (2013.01); *H01L 21/76838* (2013.01); *H01L 27/11556* (2013.01); *H01L 27/11565* (2013.01); *H01L 27/11573* (2013.01); *H01L 27/11582* (2013.01); H01L 2924/0002 (2013.01)

(58) Field of Classification Search
CPC ......... H01L 21/76802; H01L 21/76877; H01L 23/5226; H01L 27/11556; H01L 27/11582
See application file for complete search history.

(56) References Cited

U.S. PATENT DOCUMENTS

| 5,915,167 | A | 6/1999 | Leedy | |
|---|---|---|---|---|
| 8,008,732 | B2 * | 8/2011 | Kiyotoshi | H01L 27/105 257/324 |
| 9,087,790 | B2 * | 7/2015 | Oh | H01L 21/31144 |

(Continued)

OTHER PUBLICATIONS

U.S. Appl. No. 14/133,979, filed Dec. 19, 2013, SanDisk Technologies, Inc.

(Continued)

*Primary Examiner* — Peter Bradford
(74) *Attorney, Agent, or Firm* — The Marbury Law Group PLLC

(57) ABSTRACT

A trench can be formed through a stack of alternating plurality of first material layers and second material layers. A dielectric material liner and a trench fill material portion can be formed in the trench. The dielectric material liner and portions of first material layer can be simultaneously etched to form laterally-extending cavities having level-dependent lateral extents. A set of stepped surfaces can be formed by removing unmasked portions of the second material layers. Alternately, an alternating sequence of processing steps including vertical etch processes and lateral recess processes can be employed to laterally recess second material layers and to form laterally-extending cavities having level-dependent lateral extents. Lateral cavities can be simultaneously formed in multiple levels such that levels having laterally-extending cavities of a same lateral extent are offset across multiple integrated cavities.

12 Claims, 48 Drawing Sheets

(51) Int. Cl.
  *H01L 27/11565* (2017.01)
  *H01L 27/11573* (2017.01)

(56) References Cited

U.S. PATENT DOCUMENTS

| | | |
|---|---|---|
| 2009/0242967 A1 | 10/2009 | Katsumata et al. |
| 2012/0003831 A1* | 1/2012 | Kang ................ H01L 27/11551 438/639 |
| 2012/0171861 A1 | 7/2012 | Park et al. |
| 2012/0238093 A1* | 9/2012 | Park .................. H01L 21/76838 438/675 |
| 2013/0062683 A1 | 3/2013 | Fukuzumi et al. |
| 2013/0062735 A1* | 3/2013 | Fu .................... H01L 21/31144 257/618 |
| 2014/0057429 A1* | 2/2014 | Oh ...................... H01L 21/308 438/613 |
| 2014/0273462 A1 | 9/2014 | Simsek-Ege et al. |
| 2015/0036407 A1* | 2/2015 | Nakajima ............ H01Q 1/2283 365/63 |
| 2015/0079743 A1 | 3/2015 | Pachamuthu et al. |
| 2015/0255484 A1* | 9/2015 | Imamura ........... H01L 27/11582 257/314 |

OTHER PUBLICATIONS

U.S. Appl. No. 14/225,116, filed Mar. 25, 2014, SanDisk Technologies, Inc.
U.S. Appl. No. 14/225,176, filed Mar. 25, 2014, SanDisk Technologies, Inc.
Office Communication for U.S. Appl. No. 14/554,512, dated Mar. 10, 2016, 8 pages.
International Search Report and Written Opinion for International Application No. PCT/US2015/055374, dated Feb. 18, 2016, 15 pages.
International Preliminary Report on Patentability and Written Opinion of the International Searching Authority for International Application No. PCT/US2015/055374, dated Jun. 8, 2017, 11 pages.

\* cited by examiner

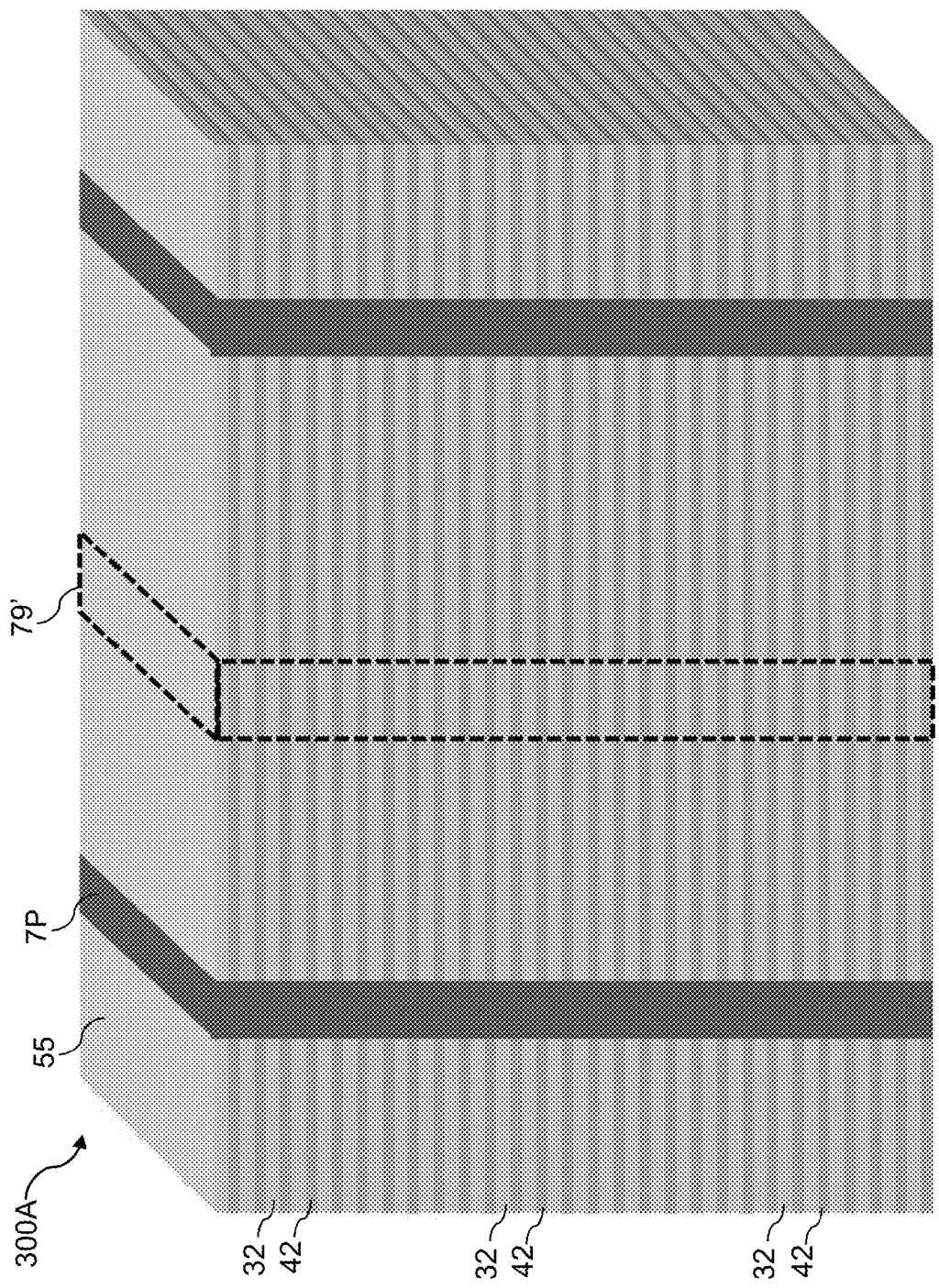

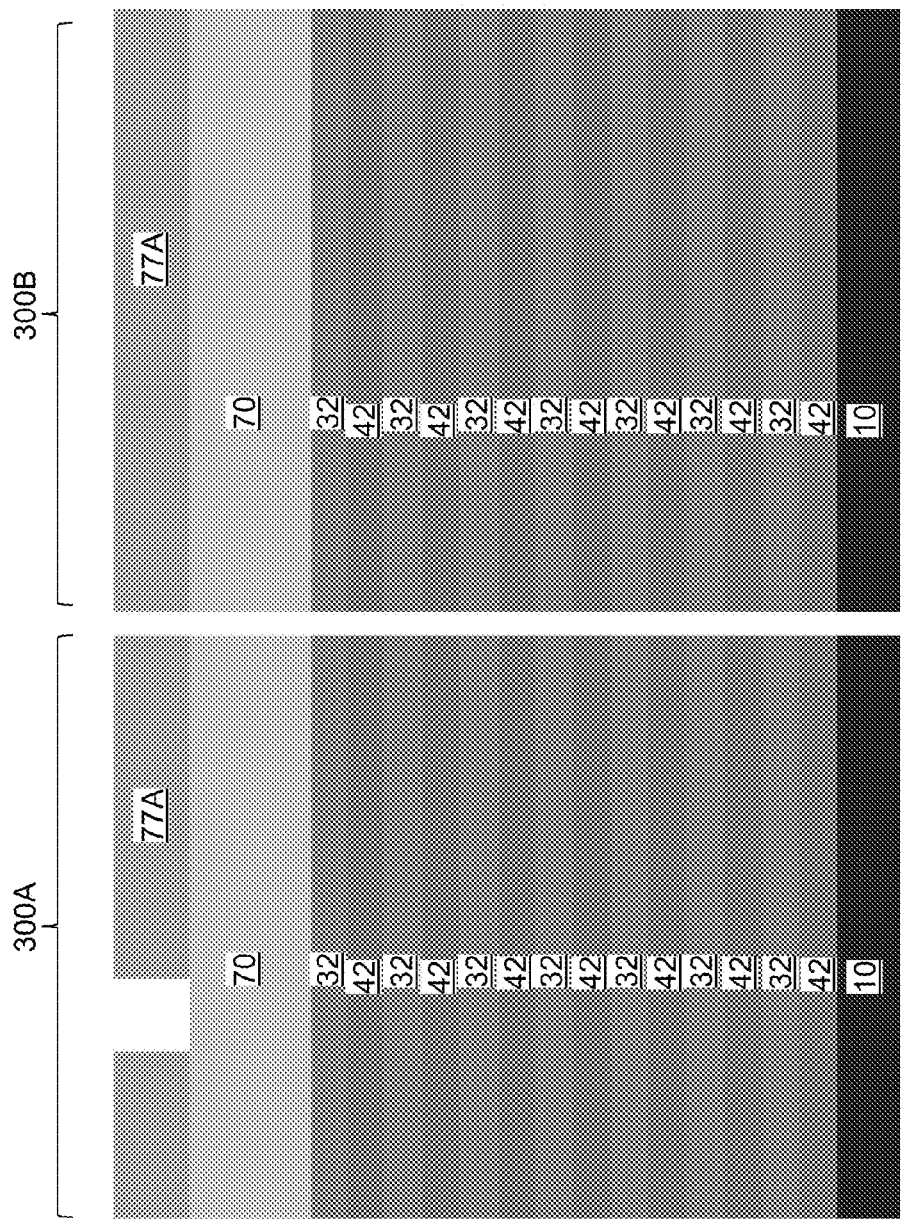

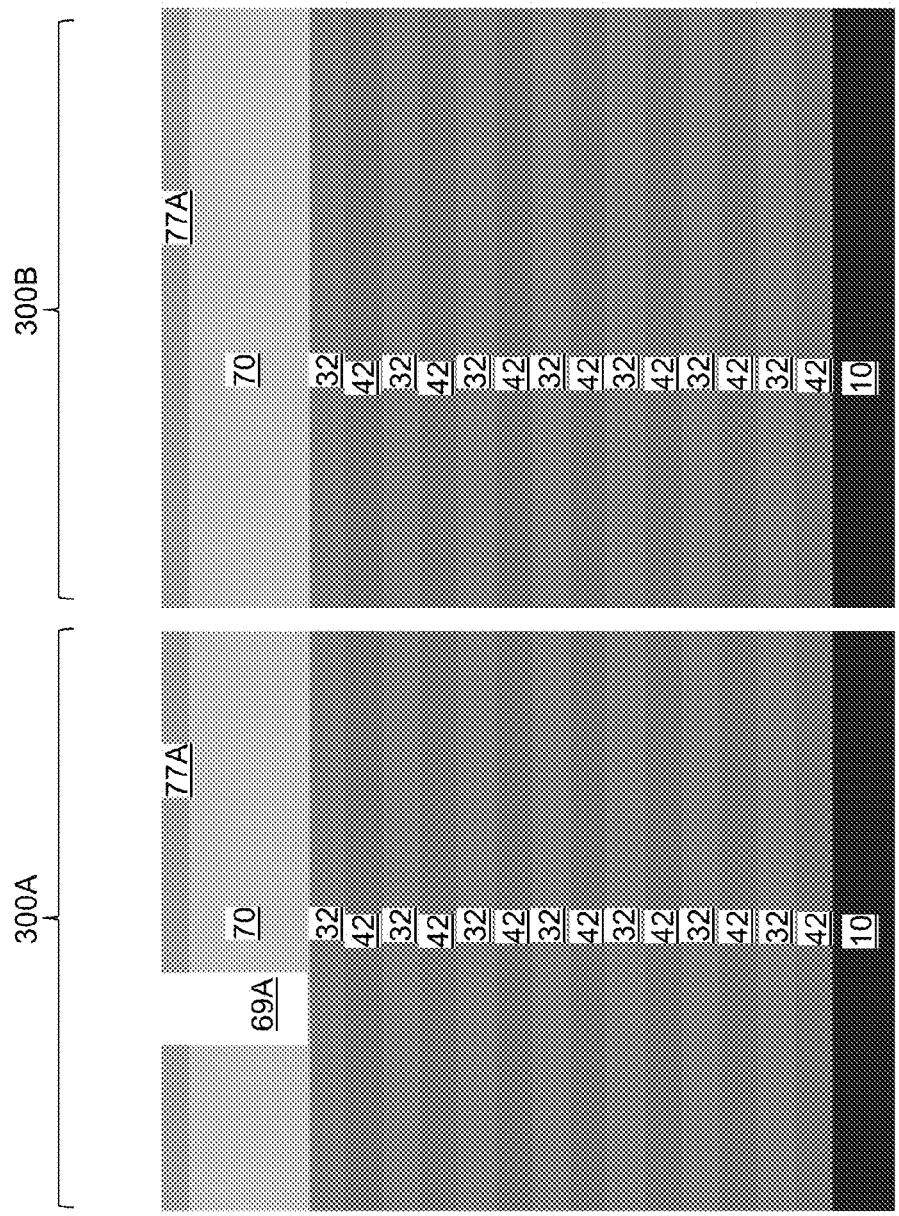

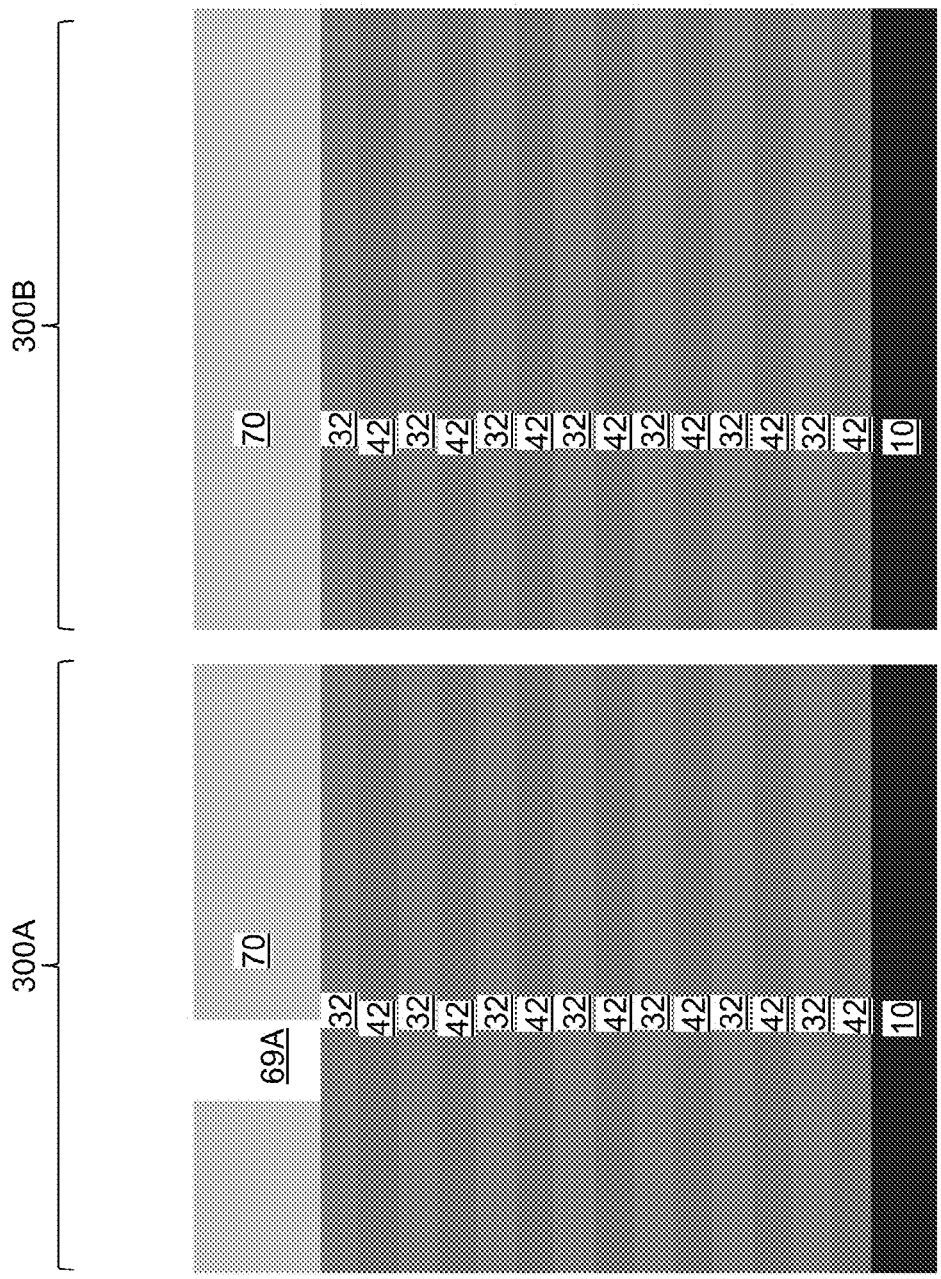

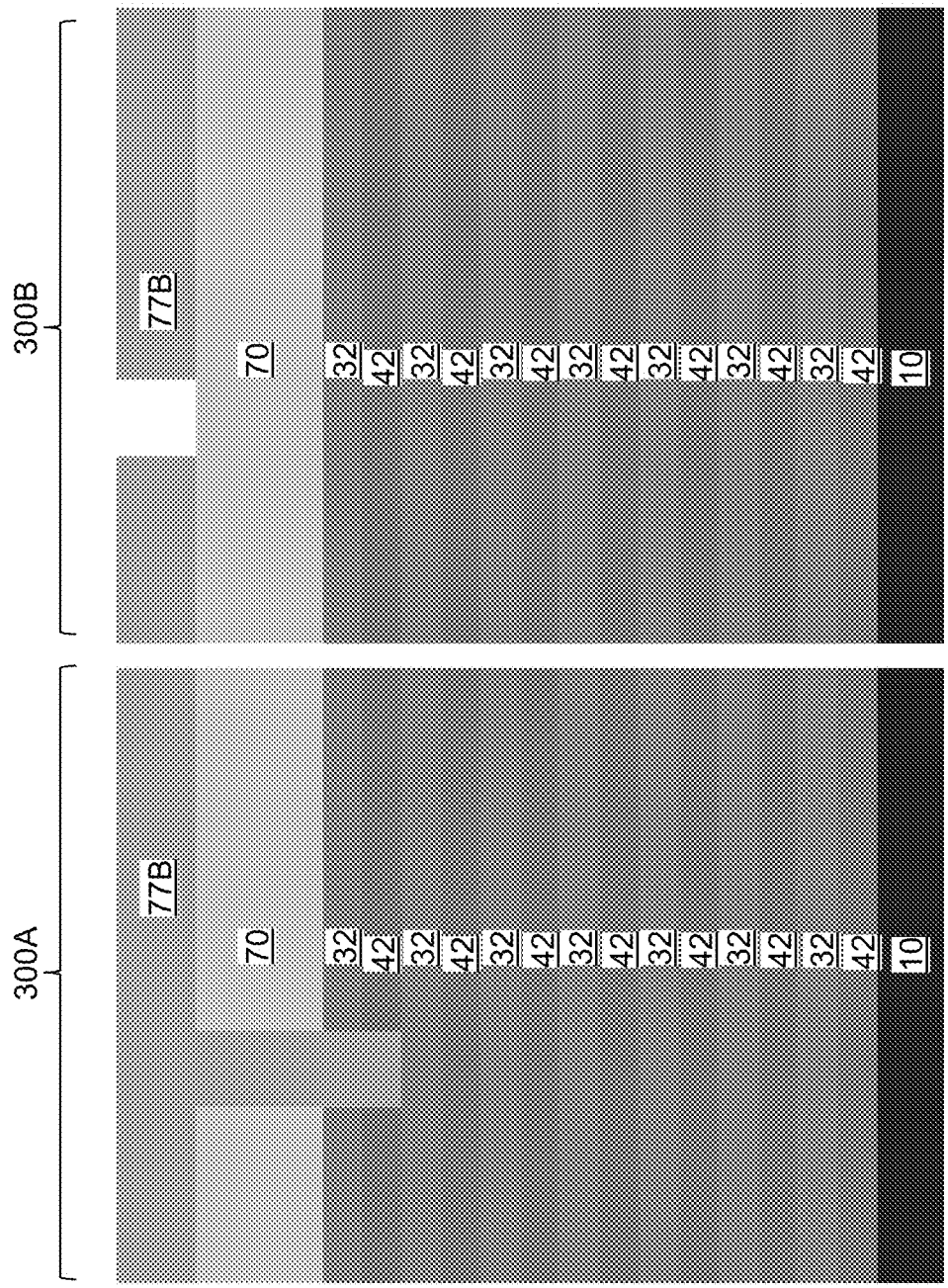

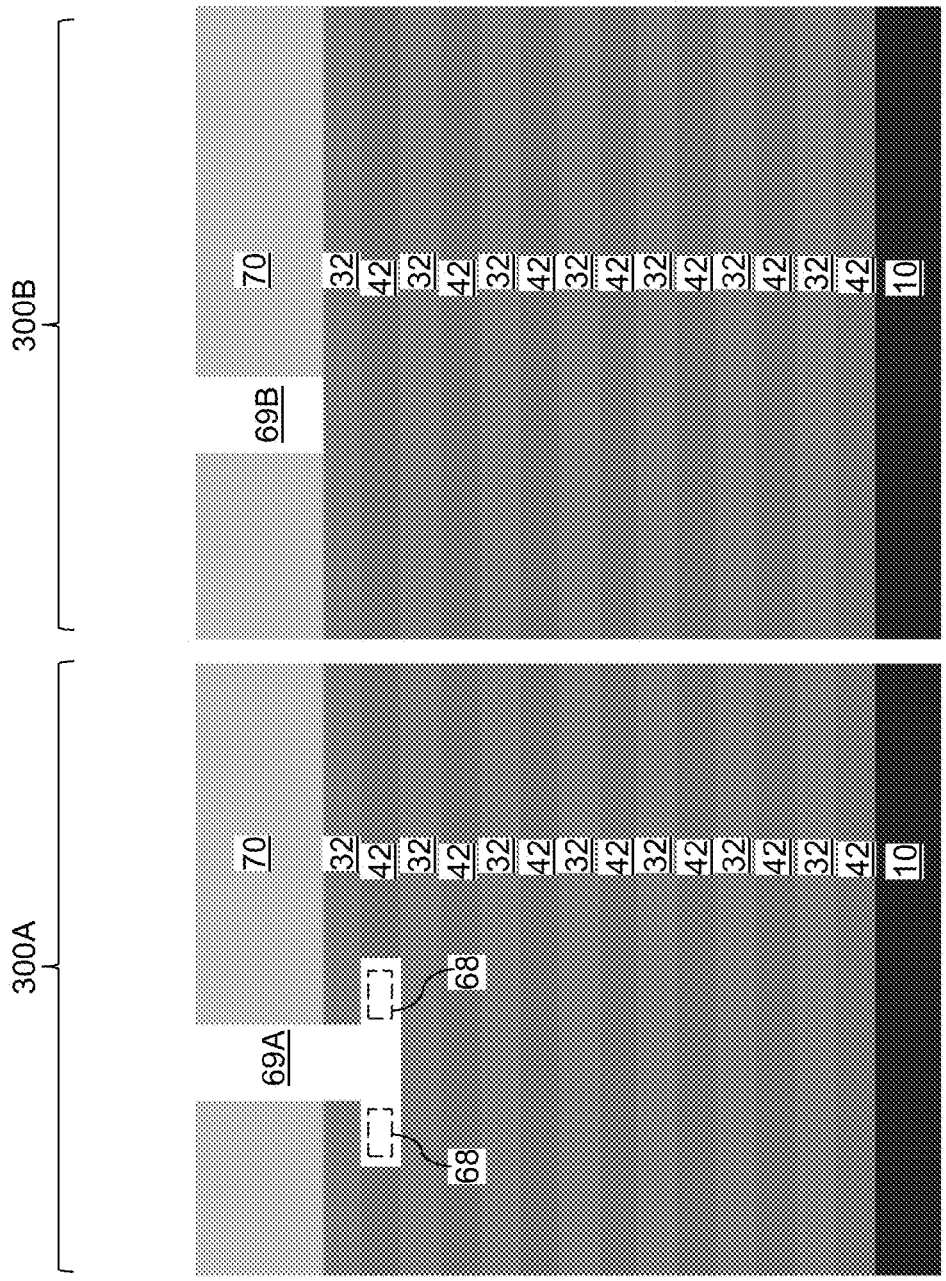

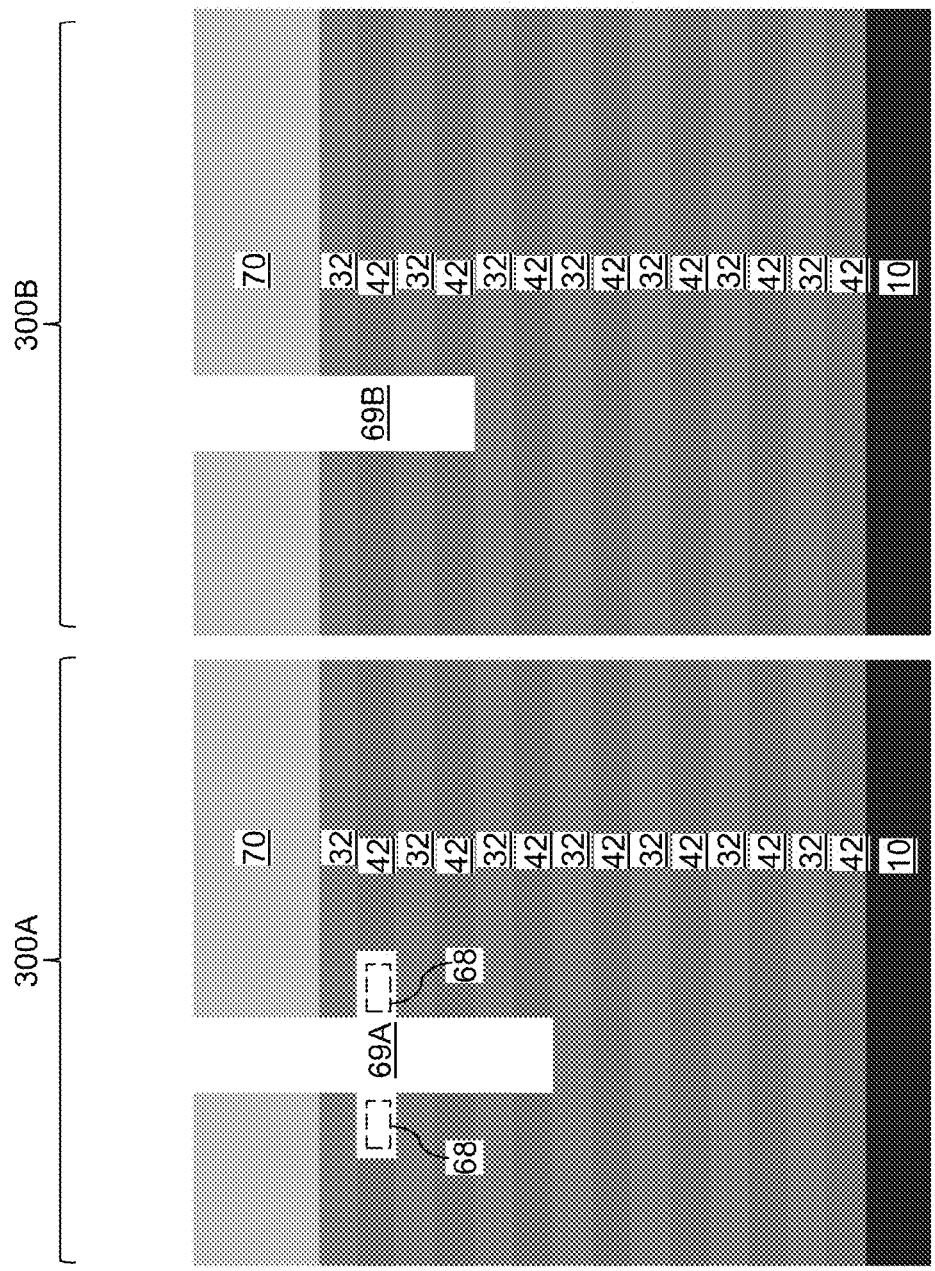

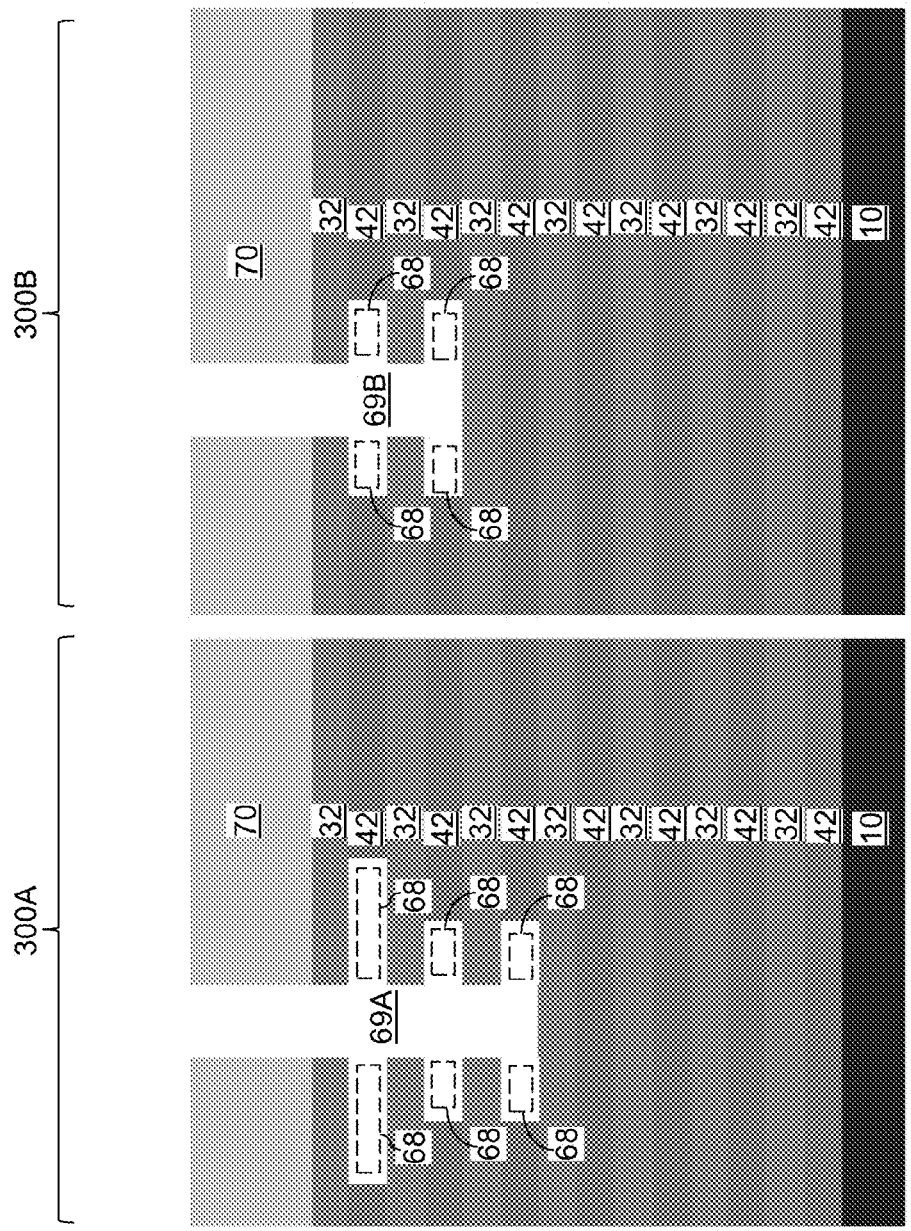

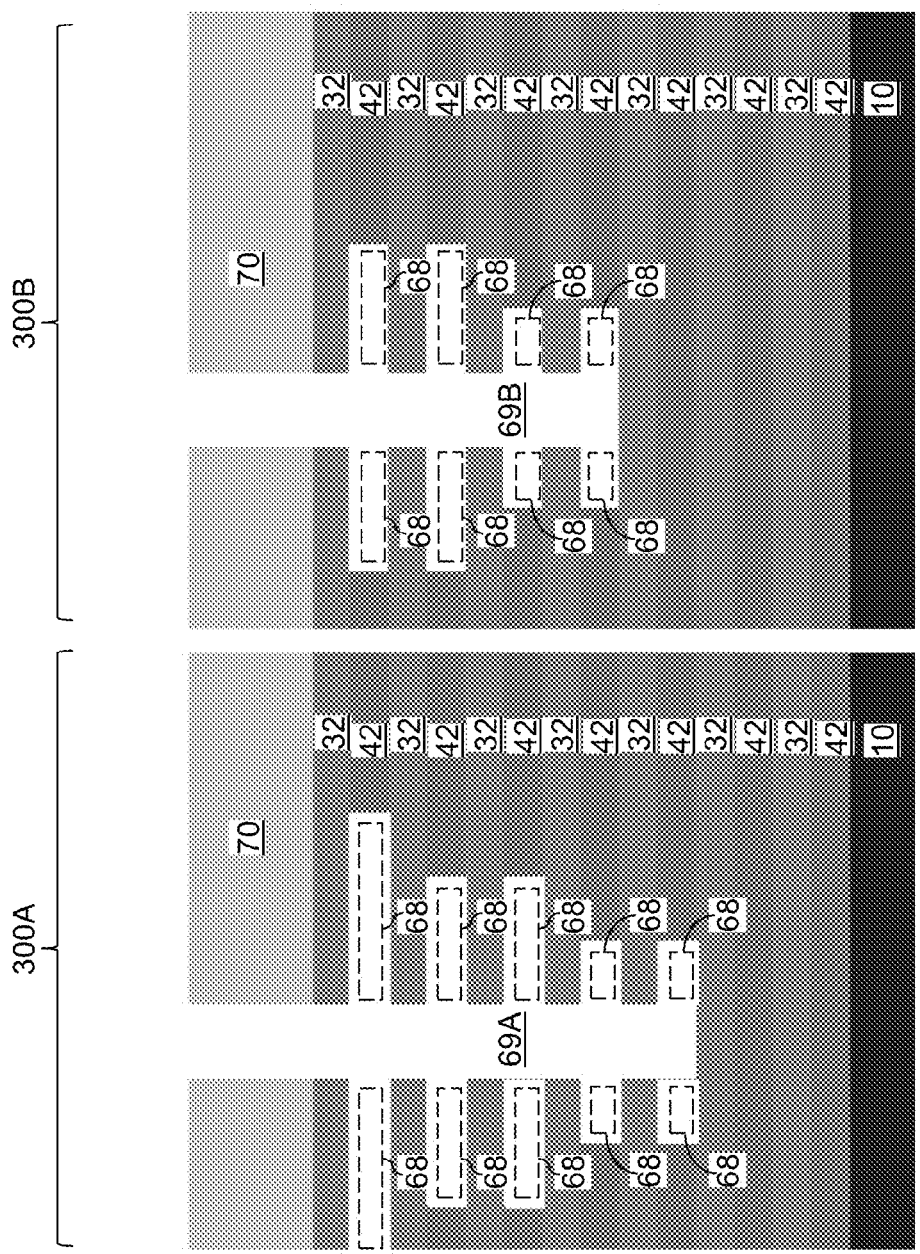

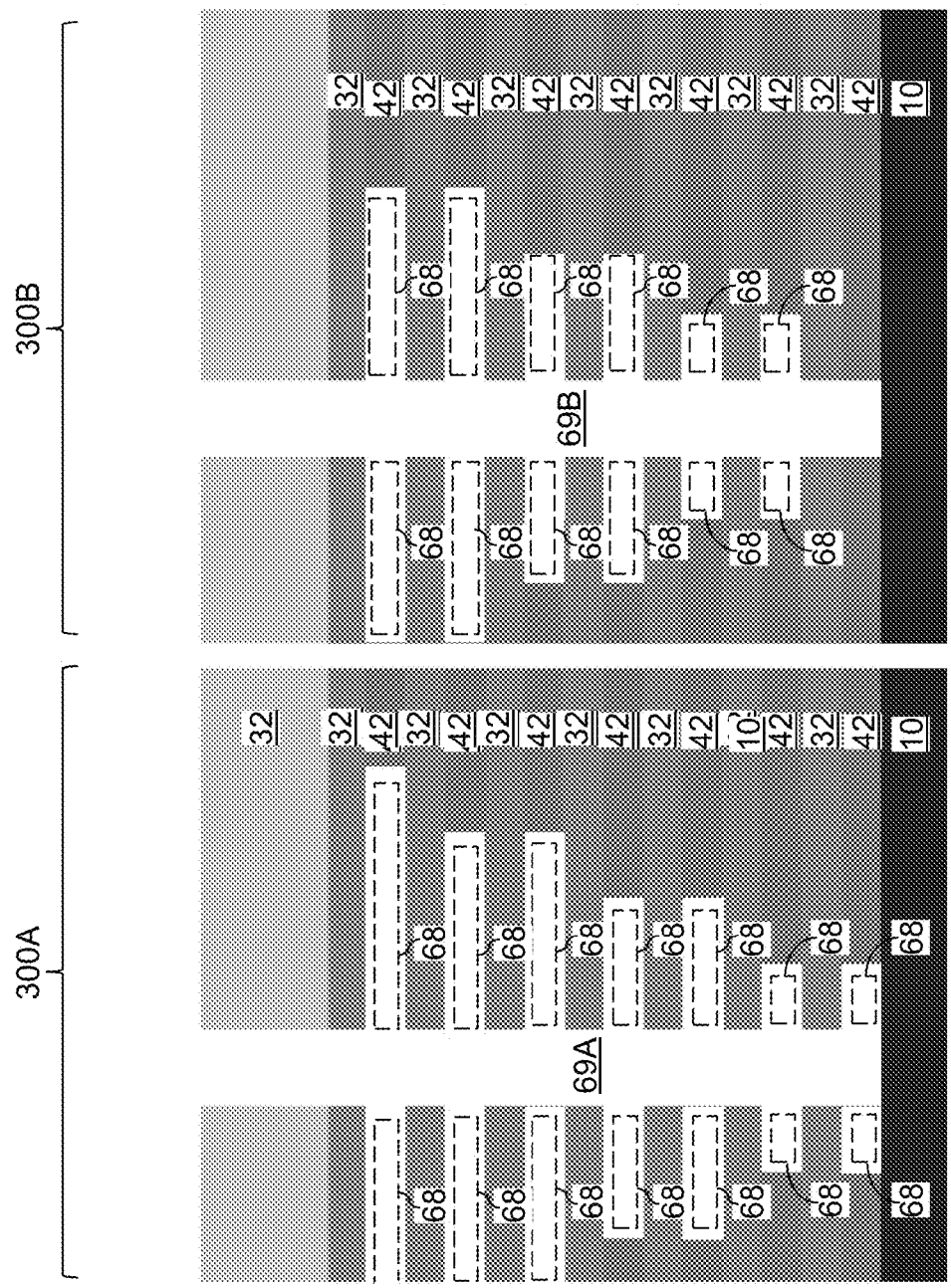

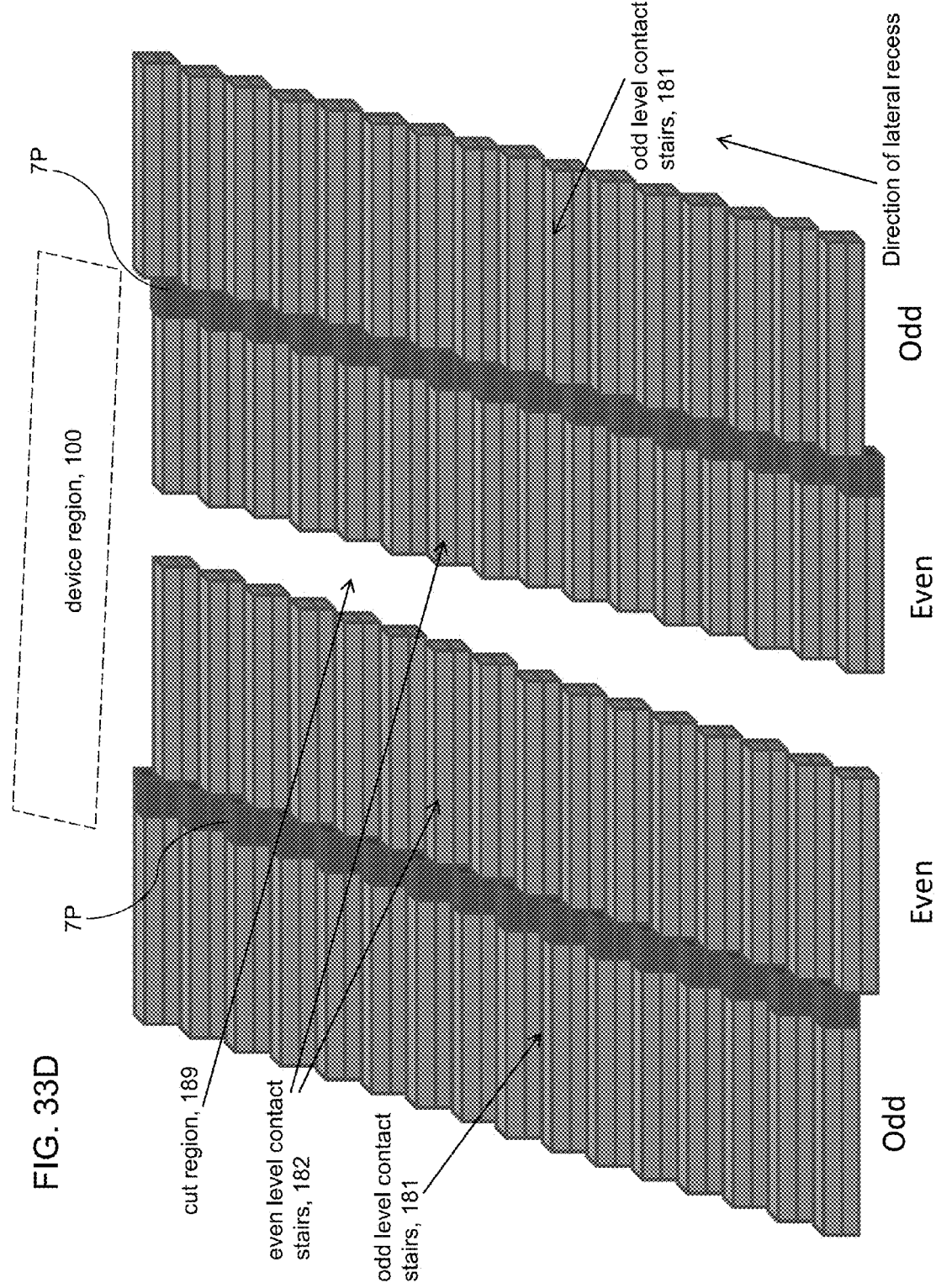

SET OF STEPPED SURFACES FORMATION FOR A MULTILEVEL INTERCONNECT STRUCTURE

RELATED APPLICATION

The instant application is related to a copending U.S. application Ser. No. 14/554,512, the entire contents of which are incorporated herein by reference.

FIELD

The present disclosure relates generally to the field of metal interconnect structures, and specifically to multilevel metal interconnect structures including electrically conductive via contacts employing a set of stepped surfaces, and methods of manufacturing the same.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. Recently, ultra high density storage devices have been proposed using a three-dimensional (3D) stacked memory structure sometimes referred to as a Bit Cost Scalable (BiCS) architecture. Such ultra high density storage devices include a large number of interconnect wiring levels. For example, a 3D NAND stacked memory device may include at least as many number of wiring levels as the total number of control gate electrodes employed for the 3D NAND stacked memory device. A method of providing electrical contacts to multiple levels of conductive metal lines at low cost and with minimal processing complexity is desired.

SUMMARY

According to an aspect of the present disclosure, a method of forming a three-dimensional structure is provided. A stack including an alternating plurality of first material layers and second material layers is formed on a substrate. A trench vertically extending through the stack is formed. A dielectric material liner is formed on a bottom surface and sidewalls of the trench. A trench fill material portion is formed within the trench on the dielectric material liner. A top surface of the trench fill material portion is recessed below a topmost surface of the dielectric material liner. Portions of the dielectric material liner and portions of the second material layers are removed employing an etch process. For each pair of an overlying second material layer and an underlying second material layer, the overlying second material layer is laterally recessed to a greater lateral extent than the underlying second material layer.

According to another aspect of the present disclosure, a method of forming a three-dimensional structure is provided. A stack including an alternating plurality of separator layers and interlayers is formed on a substrate. A first sidewall of a first interlayer located between first and second separator layers is exposed without exposing a second sidewall of a second interlayer that is located below the first and second separator layers and above a third separator layer. The first interlayer is laterally recessed without etching the second interlayer. The second sidewall of the second interlayer is exposed without exposing a third sidewall of the third interlayer. The first interlayer and the second interlayer are laterally recessed simultaneously. Exposing the second sidewall and laterally recessing the first interlayer are performed at a same processing step employing a same etch chemistry.

According to even another aspect of the present disclosure, a three-dimensional structure is provided, which comprises a stack including an alternating plurality of first material layers and second material layers located on a substrate. A portion of the stack is configured as a set of stepped surfaces at which each vertically adjoined pair of a first material layer and a second material layer laterally protrudes farther outward than an immediately overlying vertically adjoined pair of another first material layer and another second material layer. The three-dimensional structure further comprises a retro-stepped dielectric material portion contacting surfaces of the set of stepped surfaces and having a vertically-varying horizontal cross-sectional area that increases stepwise at each step of the set of stepped surfaces as a function of a vertical distance from a top surface of the substrate. In addition, the three-dimensional structure comprises a horizontal dielectric material liner contacting a bottom surface of, and having a different composition from, the retro-stepped dielectric material portion. An entire the horizontal dielectric material liner is located below the retro-stepped dielectric material portion. In one embodiment, the entire periphery of the horizontal dielectric material liner is on, or within, an area defined by a set of sidewalls of the retro-stepped dielectric material portion, the set of sidewalls being located at a level of a bottommost layer among the alternating plurality.

According to yet another aspect of the present disclosure, a method of forming a three-dimensional structure is provided. A stack including an alternating plurality of first material layers and second material layers is formed on a substrate. A trench vertically extending through at least one second material layer is formed. Each of the at least one second material layer is laterally recessed around the trench. A set of processing steps is repeatedly performed. The set of processing steps includes a first processing step of vertically extending the trench through n additional first material layers and n additional second material layers, wherein n is an integer greater than 1, and a second processing step of laterally recessing each second material layer that is physically exposed to the trench or a laterally-extending cavity adjoined to the trench.

According to still another aspect of the present disclosure, a method of forming a three-dimensional structure is provided. A stack including an alternating plurality of separator layers and interlayers is formed on a substrate. A first sidewall of a first interlayer located between first and second separator layers is exposed without exposing a second sidewall of a second interlayer that is located below the first and second separator layers and above a third separator layer. The first interlayer is laterally recessed without etching the second interlayer. The second sidewall of the second interlayer is exposed without exposing a third sidewall of the third interlayer. The first interlayer and the second interlayer are laterally recessed simultaneously. Exposing the second sidewall and laterally recessing the first interlayer are performed at separate processing steps employing different etch processes.

According to further another aspect of the present disclosure, a three-dimensional structure is provided, which includes a stack including an alternating plurality of first material layers and second material layers located on a substrate, and a first integrated dielectric structure comprising a dielectric pillar and horizontal dielectric fins that are vertically spaced apart and adjoined to the dielectric pillar. The horizontal dielectric fins include multiple sets of vertically neighboring horizontal dielectric fins, wherein vertically neighboring horizontal dielectric fins within a same set among the multiple sets laterally extend by a same lateral distance from the dielectric pillar. For any pair of an overlying set of vertically neighboring horizontal dielectric fins and an underlying set of vertically neighboring horizontal dielectric fins among the multiple sets, the overlying set of vertically neighboring horizontal dielectric fins laterally protrudes farther than the underlying set of vertically neighboring horizontal dielectric fins.

BRIEF DESCRIPTION OF THE DRAWINGS

FIG. 18 is a bird's eye view of a portion of the third exemplary structure of FIGS. 17A and 17B.

FIGS. 19A and 19B are vertical cross-sectional views of first and second contact regions after applying and patterning a first mask layer with a first pattern according to the second embodiment of the present disclosure.

FIGS. 20A and 20B are vertical cross-sectional views of the first and second contact regions after transferring the first pattern in the first mask layer into the hard mask layer according to the second embodiment of the present disclosure.

FIGS. 21A and 21B are vertical cross-sectional views of the first and second contact regions after removal of the first mask layer according to the second embodiment of the present disclosure.

FIGS. 23A and 23B are vertical cross-sectional views of first and second contact regions after applying and patterning a second mask layer with a second pattern according to the second embodiment of the present disclosure.

FIGS. 25A and 25B are vertical cross-sectional views of the first and second contact regions after removal of the second mask layer and laterally recessing physically exposed portions of the topmost sacrificial material layer according to the second embodiment of the present disclosure.

FIGS. 26A and 26B are vertical cross-sectional views of the first and second contact regions after vertical recessing multiple pairs of insulator layers and sacrificial material layers according to the second embodiment of the present disclosure.

FIGS. 27A and 27B are vertical cross-sectional views of the first and second contact regions after laterally recessing physically exposed portions of sacrificial material layers according to the second embodiment of the present disclosure.

FIGS. 29A and 29B are vertical cross-sectional views of the first and second contact regions after laterally recessing physically exposed portions of sacrificial material layers according to the second embodiment of the present disclosure.

FIGS. 32A and 32B are vertical cross-sectional views of the first and second contact regions after further recessing a pair of an insulator layer and a sacrificial material layer according to the second embodiment of the present disclosure.

FIG. 33D is a bird's eye view of a portion of the third exemplary structure of FIG. 33C from an angle in which the insulator layers are omitted for clarity according to an embodiment of the present disclosure.

DETAILED DESCRIPTION

As discussed above, the present disclosure is directed to multilevel metal interconnect structures including electrically conductive via contacts employing a set of stepped surfaces, and methods of manufacturing the same, the various aspects of which are described below. The embodiments of the disclosure can be employed to form various structures including a multilevel metal interconnect structure, a non-limiting example of which includes semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays. The various three dimensional memory devices of the present disclosure include a monolithic three-dimensional NAND string memory device, and can be fabricated employing the various embodiments described herein.

Figure 1:
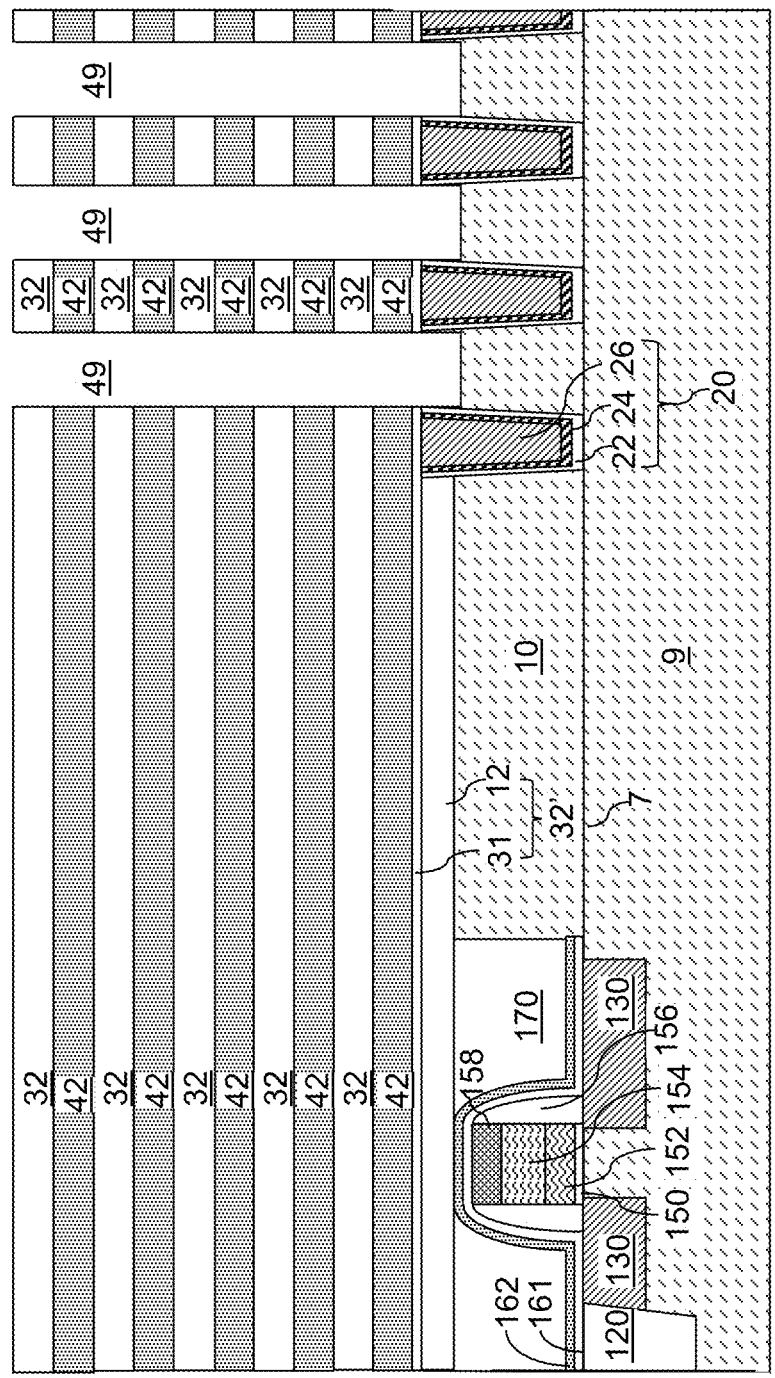
FIG. 1 is a vertical cross-sectional view of a first exemplary structure after formation of a stack of an alternating plurality of material layers and memory openings through the stack according to an embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface.

In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical resistivity in a range from 1.0 S/cm to $1.0 \times 10^5$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

The dielectric pad layer 12 and the dielectric cap layer 31 include insulator materials, and are herein collectively referred to as a bottommost insulator layer 32'. In one embodiment, the bottommost insulator layer 32' can have the same composition as the insulator layers in a stack of alternating layers to be subsequently formed.

A stack of an alternating plurality of first material layers (which can be insulating layers 32) and second material layers (which can be sacrificial material layers 42) is formed over the top surface of the substrate, which can be, for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer 42. In this case, the stack can include an alternating plurality of insulator layers 32 and sacrificial material layers 42.

The stack of the alternating plurality is herein referred to as an alternating stack (32, 42). In one embodiment, the alternating stack (32, 42) can include insulator layers 32 composed of the first material, and sacrificial material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material layers can include lower level second material layers formed at the levels of lower select gate electrodes to be subsequently formed, control gate level second material layers formed at the level of control gate electrodes to be subsequently formed, and upper level second material layers formed at the levels of upper select gate electrodes to be subsequently formed.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Subsequently, a lithographic material stack (not shown) including at least a photoresist layer can be formed over the alternating stack (32, 42), and can be lithographically patterned to form openings therein. The pattern in the lithographic material stack can be transferred through the entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

Figure 2:
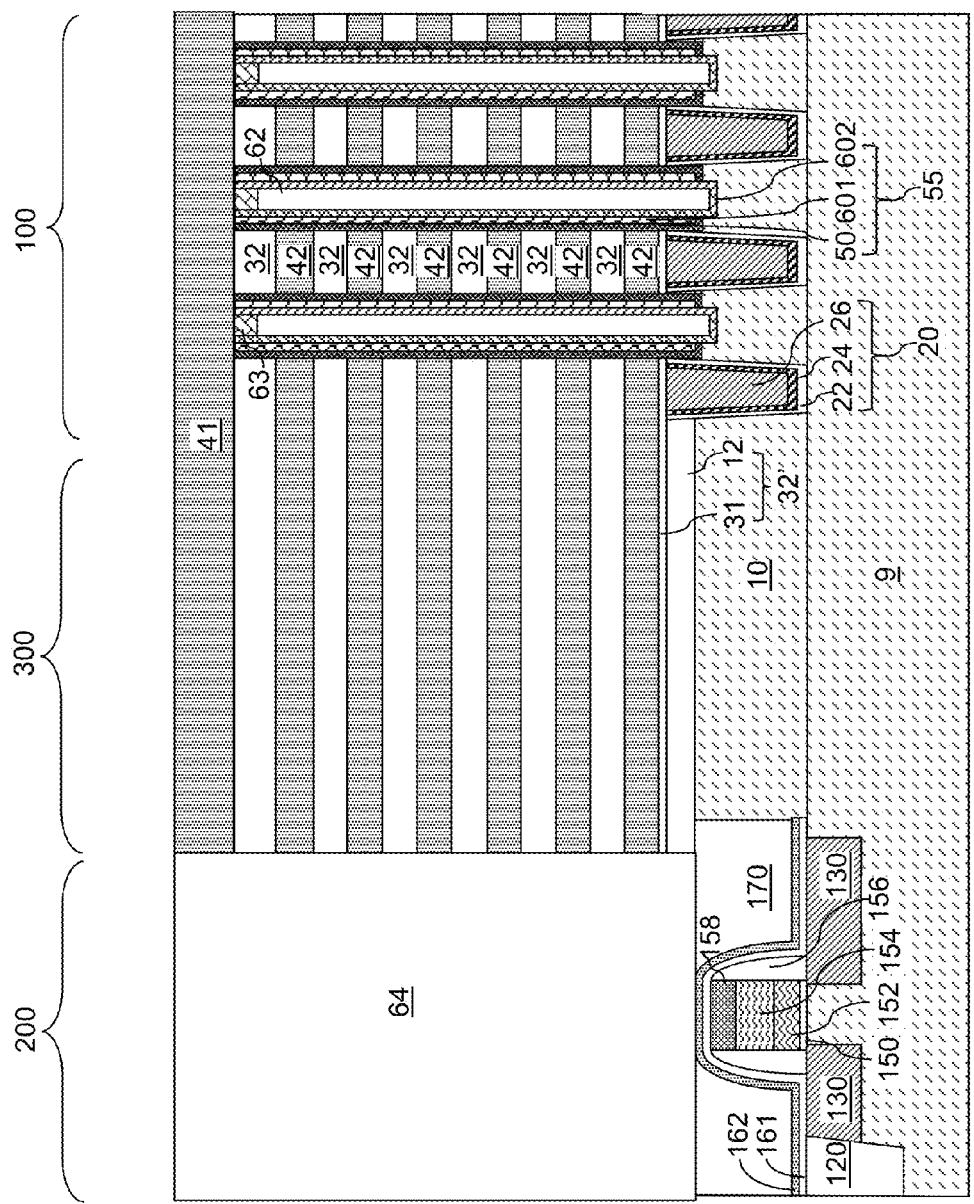
FIG. 2 is a vertical cross-sectional view of the first exemplary structure after formation of memory stack structures and a hard mask layer according to an embodiment of the present disclosure.

Referring to FIG. 2, a memory stack structure 55 can be formed within each memory opening through the alternating stack (32, 42). The memory stack structures 55 can be formed, for example, by depositing a memory film layer in the memory openings and over the alternating stack (32, 42), and by anisotropically etching the memory film layer. The memory film layer can be a stack of contiguous material layers that overlie the entirety of the alternating stack (31, 42). The memory film layer contacts all sidewall surface(s) and all bottom surface(s) of the memory openings. The memory film layer is a contiguous film stack that provides the functionality of charge storage in the absence of an external electrical bias voltage, while enabling charge transfer in the presence of a suitable external electrical bias voltage.

In one embodiment, the memory film layer can be a stack, in the order of formation, of a blocking dielectric layer, a charge storage layer, and a tunnel dielectric layer. In one embodiment, a plurality of floating gates or a charge storage dielectric can be located between the tunneling dielectric layer and the blocking dielectric layer.

The blocking dielectric layer contacts the sidewalls of the memory openings. Specifically, the blocking dielectric layer can contact the sidewalls of the sacrificial layers 42. The blocking dielectric layer may include one or more dielectric material layers that can function as the dielectric material(s) of a control gate dielectric between the sacrificial layers 42 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trench in recesses formed by removal of the sacrificial layers 42 prior to forming the metal control gate electrodes through the backside contact trench.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial layer (such as a dielectric material layer) may be formed on the memory film layer. The memory film layer (and any additional layer such as a permanent channel material layer or a sacrificial layer) can be anisotropically etched so that horizontal portions of the memory film layer (and any additional layer) are removed from above the top surface of the alternating stack (32, 42) and at the bottom of each memory opening. Each remaining vertical portion of the memory film layer that remains within a memory opening after the anisotropic etch constitutes a memory film 50. Each memory film 50 can be homeomorphic to a torus. As used herein, an element is homeomorphic to a geometrical shape if the shape of the element can be mapped to the geometrical shape by continuous deformation without creation or destruction of any hole.

A semiconductor channel (601, 602) can be formed by depositing at least one semiconductor material on the inner sidewalls of the memory films 50 and on semiconductor surfaces of the semiconductor material layer 10 at the bottom of the memory openings. In an illustrative example, a first semiconductor channel layer can be deposited directly on the surfaces of the memory films 50 by a conformal deposition method such as chemical vapor deposition (CVD). The first semiconductor channel layer and the memory films can be anisotropically etched to form an opening at a bottom portion of each memory opening. A top surface of the substrate semiconductor layer 10 is physically exposed at the bottom of each memory opening. Each remaining portion of the first semiconductor channel layer within a memory opening constitutes a first semiconductor channel portion 601. A second semiconductor channel layer can be deposited on the sidewalls of the first semiconductor channel portions 601, physically exposed surfaces of the substrate semiconductor layer 10 within the memory openings. The semiconductor material of the second semiconductor channel layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 62 can be formed within a cavity inside each semiconductor channel 60, for example, by deposition of a dielectric material such as silicon oxide, and subsequent planarization of the dielectric material. The planarization of the dielectric material removes the portion of the deposited dielectric material from above the top surface of the horizontal plane including the top surface of the topmost insulator layer 32. The planarization of the dielectric material can be performed, for example, by chemical mechanical planarization. Each remaining portion of the dielectric material inside a memory opening constitutes a dielectric core 62. The dielectric core 62 is an optional component, and a combination of a memory film 50 and a semiconductor channel 60 may completely fill a memory opening.

The horizontal portion of the second semiconductor channel layer above the top surface of the topmost insulator layer 32 can be removed, for example, by a recess etch. Each remaining portion of the second semiconductor channel layer constitutes a second semiconductor channel 602. Each adjoined pair of a first semiconductor channel 601 and a second semiconductor channel vertically extend through the alternating stack (32, 42), and collectively constitutes a portion of a semiconductor channel (601, 602) for a memory stack structure 55. A set of a memory film 50 and a semiconductor channel (601, 602) within a same memory opening constitutes a memory stack structure 55.

Drain regions 63 can be formed by recessing a top portion of each dielectric core and depositing a doped semiconductor material. The doped semiconductor material can be, for example, doped polysilicon. Excess portions of the deposited semiconductor material can be removed from above the top surface of the alternating stack (32, 42), for example, by chemical mechanical planarization (CMP) or a recess etch. The region in which the array of memory stack structures 55 is formed constitutes a device region 100, and a region which is located in proximity to the device region, and in which contact via structures for conductive material layers to be subsequently formed, is herein referred to as a contact region 300.

A hard mask layer 41 can be formed over the alternating stack (32, 42) and the array of memory stack structures 55. The hard mask layer 41 can include a dielectric material that is different from the first material of the insulator layers 32. For example, the hard mask layer 41 can include silicon nitride. The material of the hard mask layer 41 may, or may not, be the same as the second material of the sacrificial material layers 42. In one embodiment, the material of the hard mask layer 41 can be the same as the second material of the sacrificial material layers 42. The thickness of the hard mask layer 41 can be in a range from 20 nm to 150 nm, although lesser and greater thicknesses can also be employed.

Optionally, a portion of the alternating stack (32, 42) can be removed from a peripheral device region 200, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed. Subsequently, the trench can be filled with an optional dielectric material such as silicon oxide. Excess portions of the dielectric material can be removed from above the top surface of the hard mask layer 70 by a planarization process such as chemical mechanical planarization and/or a recess etch. The top surfaces of the at least one dielectric cap layer (71, 72) can be employed as a stopping surface during the planarization. The remaining dielectric material in the trench constitutes a dielectric material portion 64.

Figure 3:
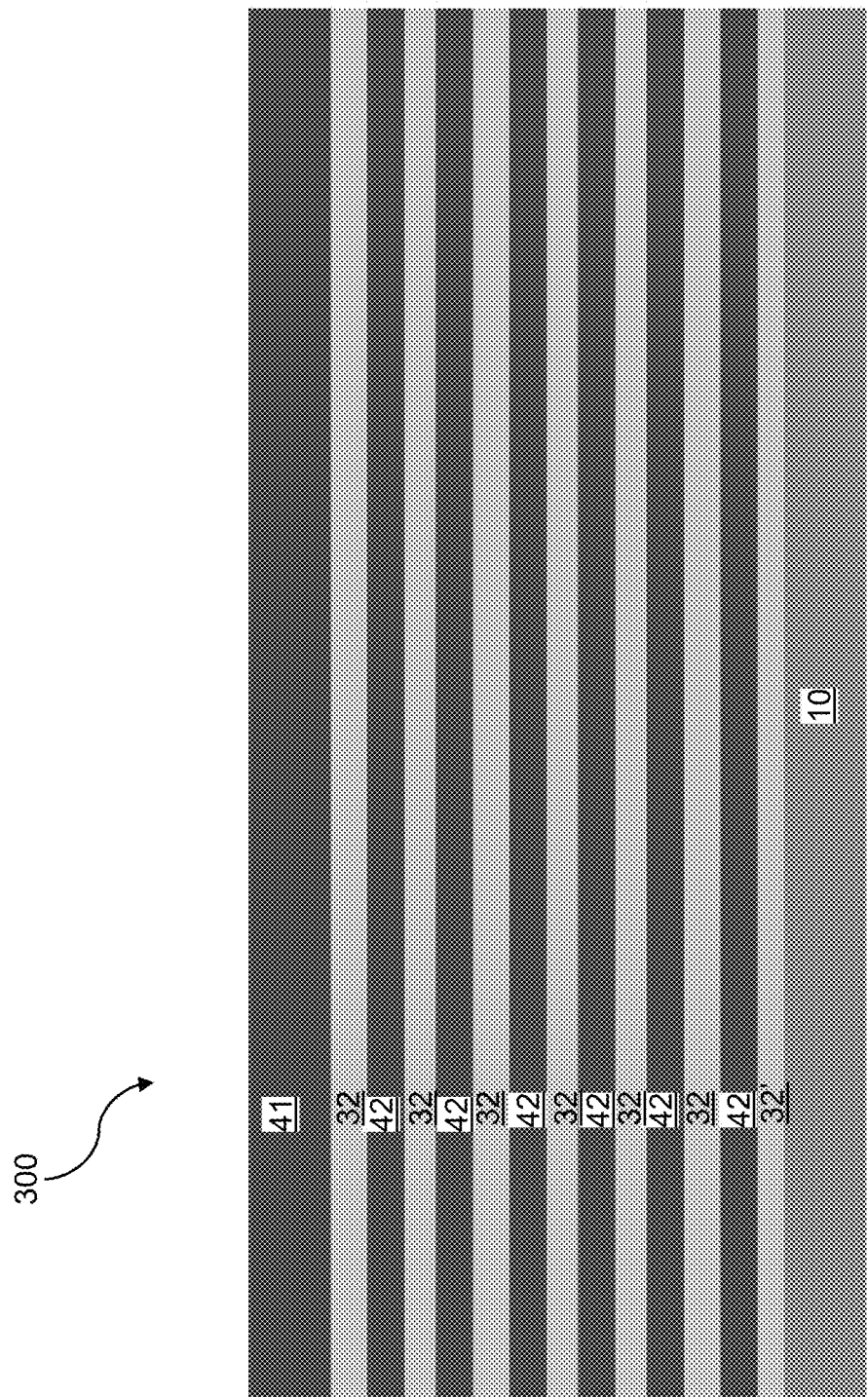
FIG. 3 is a vertical cross-sectional view of a contact region of the first exemplary structure of FIG. 2.

Referring to FIG. 3, a contact region 300 of the first exemplary structure of FIG. 2 is shown.

Figure 4:
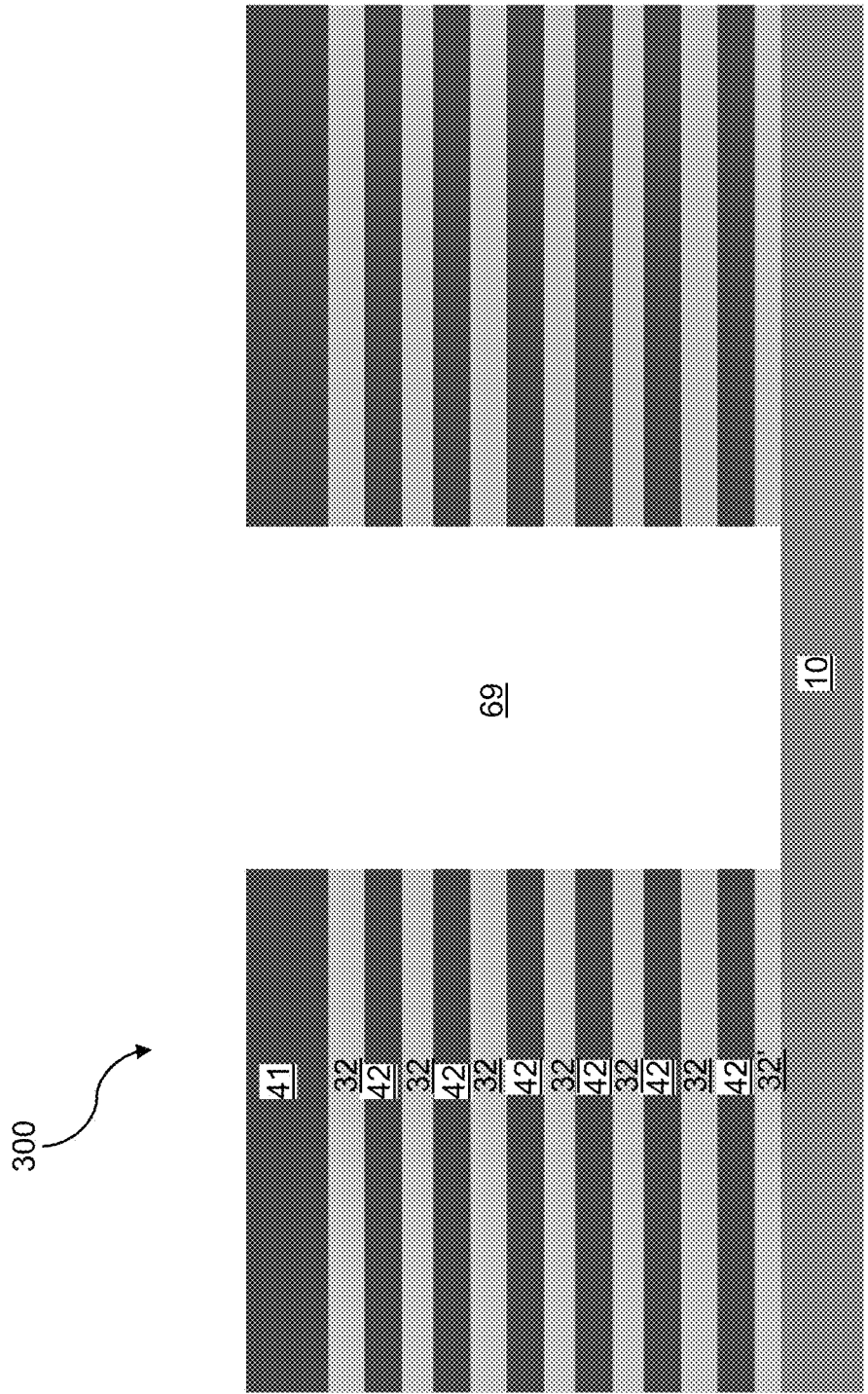
FIG. 4 is a vertical cross-sectional view of the contact region of the first exemplary structure after formation of a trench according to an embodiment of the present disclosure.

Referring to FIG. 4, a trench 69 can be formed through the hard mask layer 41 and the alternating stack (32, 42), for example, by applying a photoresist layer on the top surface of the hard mask layer 41, lithographically patterning the photoresist layer to form an opening therein, and transferring the pattern of the opening through the hard mask layer 41 and the alternating stack (32, 42) by at least one anisotropic etch. In one embodiment, the anisotropic etch can be selective to the semiconductor material of the semiconductor material layer 10. The photoresist layer can be subsequently removed, for example, by ashing. The trench 69 vertically extends through the alternating stack (32, 42) and the hard mask layer 41. The sidewalls of the trench 69 can be substantially vertical, or can be tapered.

The stack of first material layers 32 and second material layers 42 constitutes an alternating plurality of separator layers 42 and interlayers 32 formed over a substrate (9, 10). The sidewalls of the separator layers 42 and interlayers 32 are exposed to the trench 69 upon formation of the trench 69.

Figure 5:
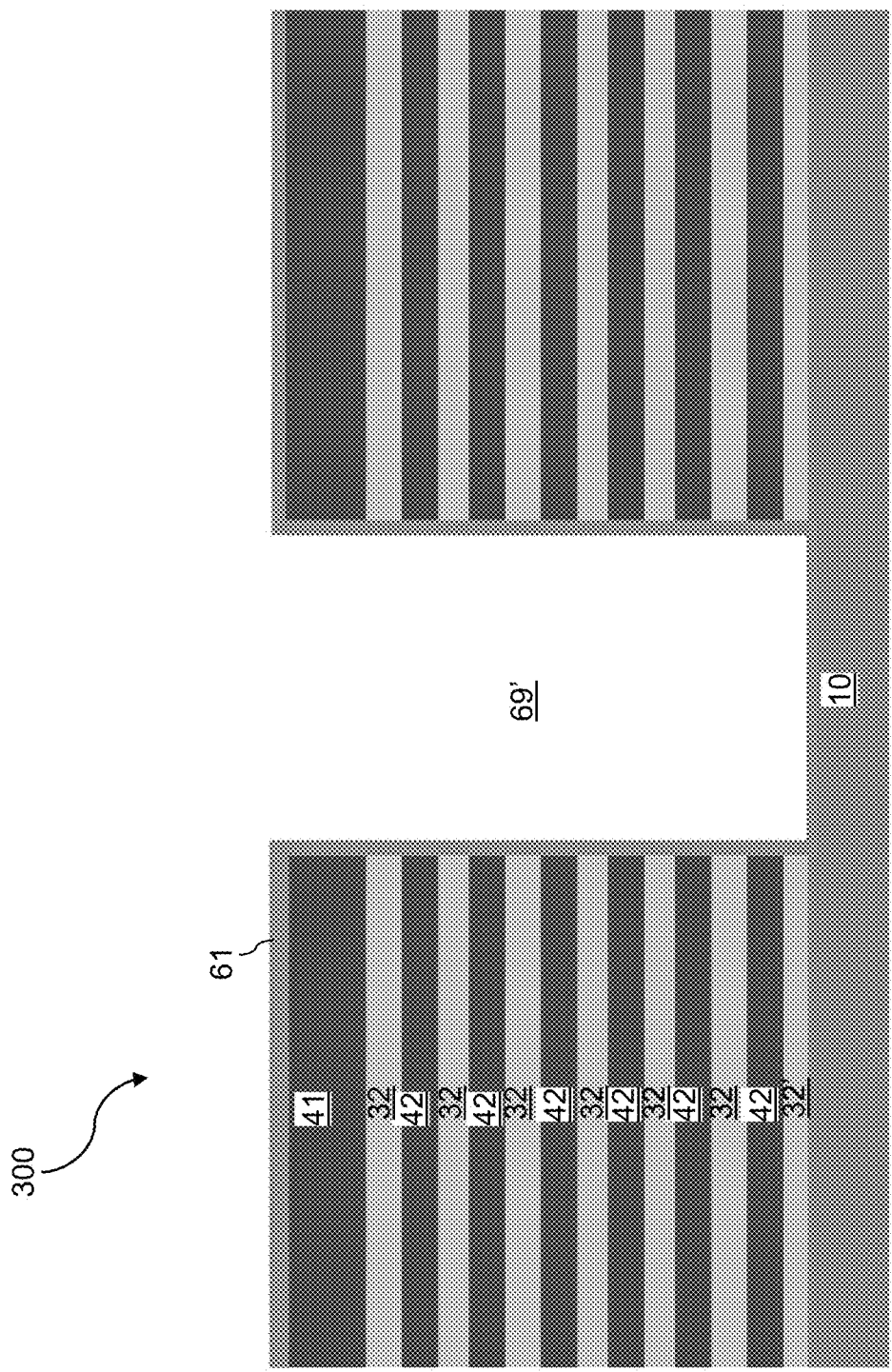
FIG. 5 is a vertical cross-sectional view of the contact region of the first exemplary structure after formation of a dielectric material liner according to an embodiment of the present disclosure.

Referring to FIG. 5, a dielectric material liner 61 can be formed on a top surface and sidewalls of the hard mask layer 41, the sidewalls of the alternating stack (32, 42), and a bottom surface of the trench 69, which may be a portion of the top surface of the semiconductor material layer 10 underlying the trench 69 or of another liner. The dielectric material liner 61 includes a dielectric material that can be etched simultaneously with the first material of the insulator layers 32, and selective to the second material of the sacrificial material layers 42. In one embodiment, the dielectric material liner 61 can include the same material as the insulator layers 32, i.e., the first material.

In one embodiment, the dielectric material liner 61 and the first material layers (e.g., the insulator layers 32) can comprise silicon oxide, and the second material layers (e.g., the sacrificial material layers 42) can comprise a material different from silicon oxide. In one embodiment, the dielectric material liner 61 and the insulator layers 32 can include silicon oxide, and the sacrificial material layers 42 can include silicon nitride or a semiconductor material such as germanium, a silicon-germanium alloy, or silicon. In another embodiment, the dielectric material liner 61 and the insulator layers 32 can include silicon nitride, and the sacrificial material layers 42 can include silicon oxide or a semiconductor material such as germanium, a silicon-germanium alloy, or silicon. In an exemplary illustration, the dielectric material liner 61 and the insulator layers 32 can include silicon oxide, and the sacrificial material layers 42 and the hard mask layer 41 can include silicon nitride. If the dielectric material liner 61 includes silicon oxide, the silicon oxide material of the dielectric material liner 61 can be undoped silicon oxide.

The dielectric material liner 61 may be deposited by a conformal deposition method or a non-conformal deposition method. For example, the dielectric material liner 61 can be deposited by low pressure chemical vapor deposition (LP-CVD) or by plasma enhanced chemical vapor deposition (PECVD). The thickness of a vertical portion of the dielectric material liner 61 can be in a range from 3 nm to 100 nm, although lesser and greater thicknesses can also be employed. A cavity 69' is formed in a portion of the trench 69 that is not filled with the dielectric material liner 61.

Figure 6:
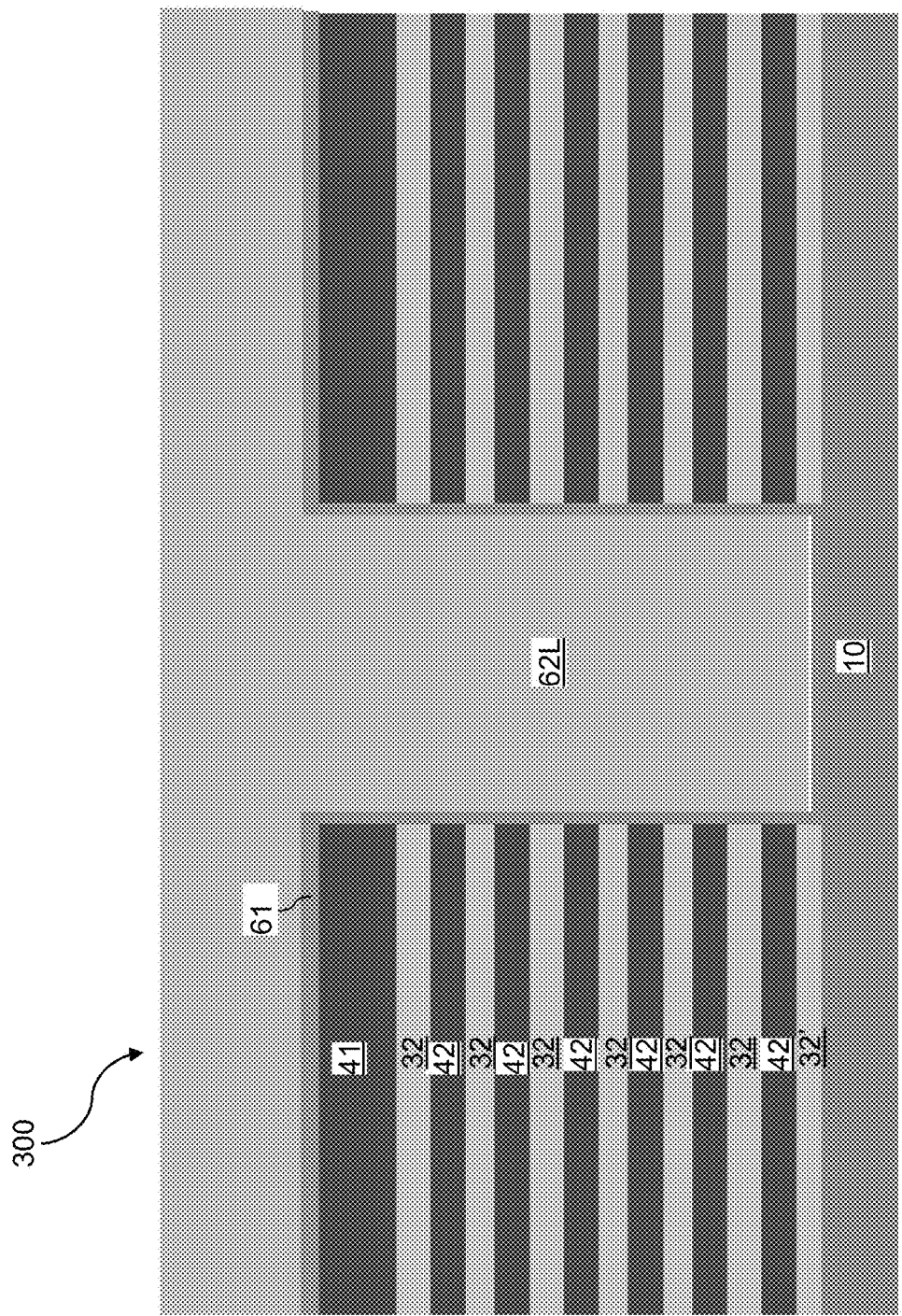
FIG. 6 is a vertical cross-sectional view of the contact region of the first exemplary structure after formation of a trench fill material layer according to an embodiment of the present disclosure.

Referring to FIG. 6, a trench fill material layer 62L is deposited in the cavity 69' and over the topmost surface of the dielectric material liner 61. In one embodiment, the trench fill material layer 62L includes a self-planarizing material or a planarizable (for example, by a recess etch or chemical mechanical planarization) material. In one embodiment, the trench fill material liner 62L includes a material selected from a photoresist material, an organic planarization material, an inorganic planarization material, and amorphous carbon. The trench fill material liner 62L can be formed, for example, by spin coating. Alternatively, the trench fill material layer 62L can be deposited such that the trench fill material layer 62L only partially fills the trench 69, for example, by spin-coating.

Figure 7:
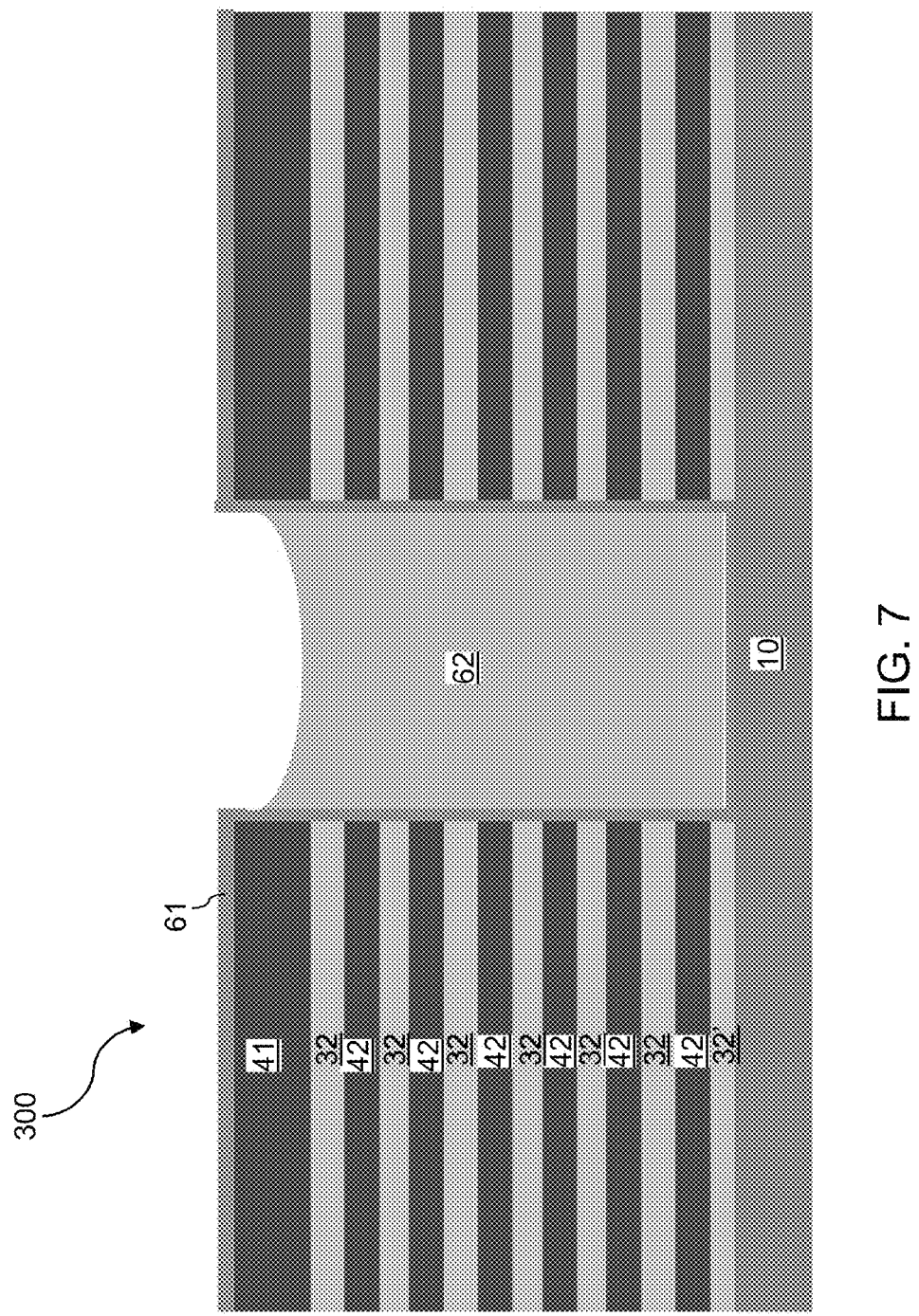
FIG. 7 is a vertical cross-sectional view of the contact region of the first exemplary structure after formation of a trench fill material portion according to an embodiment of the present disclosure.

Referring to FIG. 7, the trench fill material layer 62L can be recessed by an etch process or a trimming process. The etch process or the trimming process can be an isotropic process or an anisotropic process. The portion of the trench fill material layer 62L above the topmost surface of the dielectric material liner 61 is removed. The remaining portion of the trench fill material layer 62L inside the trench is herein referred to as a trench fill material portion 62. A top surface of the trench fill material portion 62 can be recessed below the topmost surface of the dielectric material liner 61. In one embodiment, a periphery of a top surface of the trench fill material portion 62 can be located below the horizontal plane including the topmost surface of the dielectric material liner 61, and above the horizontal plane including the bottom surface of the hard mask layer 41.

Figure 8:
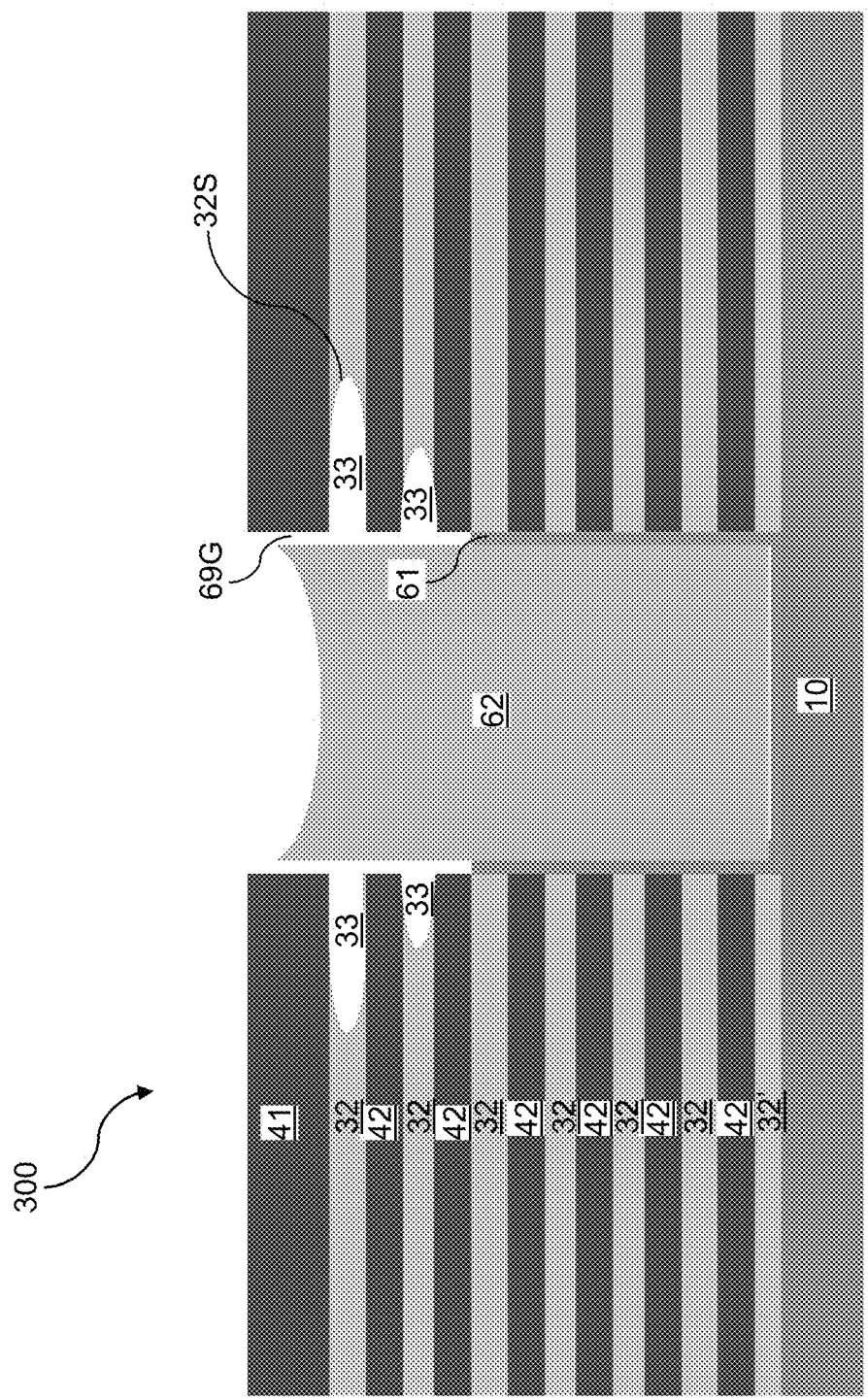
FIG. 8 is a vertical cross-sectional view of the contact region of the first exemplary structure at a first point in time during an isotropic etch of the dielectric material liner and portions of insulator layers according to an embodiment of the present disclosure.

Referring to FIG. 8, an isotropic etch process is performed to gradually remove the material of the dielectric material liner 61 and the first material of the insulator layers 32. FIG. 8 illustrates the first exemplary structure at a first point in time during the isotropic etch process. The isotropic etch process can be selective to the material of the trench fill material portion 62 and to the first material of the insulator layers 32. The isotropic etch process can simultaneously remove portions of the dielectric material liner 61 and portions of the insulator layers 32 that come to contact with the etchant employed in the isotropic etch process. Vertical portions of the dielectric material liner 61 are vertically recessed during the isotropic etch. A gap 69G between the trench fill material portion 62 and the alternating stack (32, 42) is vertically extanded during the isotropic etch. The portions of the insulator layer 32 that are proximal to the gap 69G around the trench fill material portion 62 are laterally recessed during the anisotropic etch.

The bottom surface of the gap 69G around the trench fill material portion 62 moves downward at the etch rate of the dielectric material liner 61 during the anisotropic etch. For each pair of an overlying first material layer (e.g., an overlying insulator layer 32) and an underlying first material layer (e.g., an underlying insulator layer 32), a sidewall of the overlying first material layer becomes physically exposed to the gap 69G before a sidewall of the underlying first material layer becomes physically exposed to the gap. Thus, a lateral recess 33 that is formed by removing a portion of the overlying first material layer (e.g., the overlying insulator layer 32) extends farther away from the gap 69G than another lateral recess 33 that is formed by removing a portion of the underlying first material layer (e.g., the underlying insulator layer 32). Thus, for each pair of an overlying first material layer and an underlying first material layer, the overlying first material layer is laterally recessed to a greater later extent than the underlying first material layer.

The isotropic etch process can be a wet etch process or a dry etch process such as a chemical downstream etch or a vapor phase etch. In one embodiment, the dielectric material liner 61 and the first material layers (e.g., the insulator layers 32) can include silicon oxide, and the isotropic etch process can be a wet etch process employing hydrofluoric acid or a vapor phase etch process employing a vapor of hydrofluoric acid. The etch rate of the material of the first material layers (e.g., the insulator layers 32) that is physically exposed to the lateral recesses 33 is dependent on the supply rate of the etchant molecules during the isotropic etch process. Because a middle portion of the sidewall surface 32S of each remaining portion of the first material layers tends to be exposed to a higher influx of etchant molecules than the topmost portion and the bottommost portion of the sidewall surface, the sidewall surface of each etched first material layer can have a concave surface.

Figure 9:
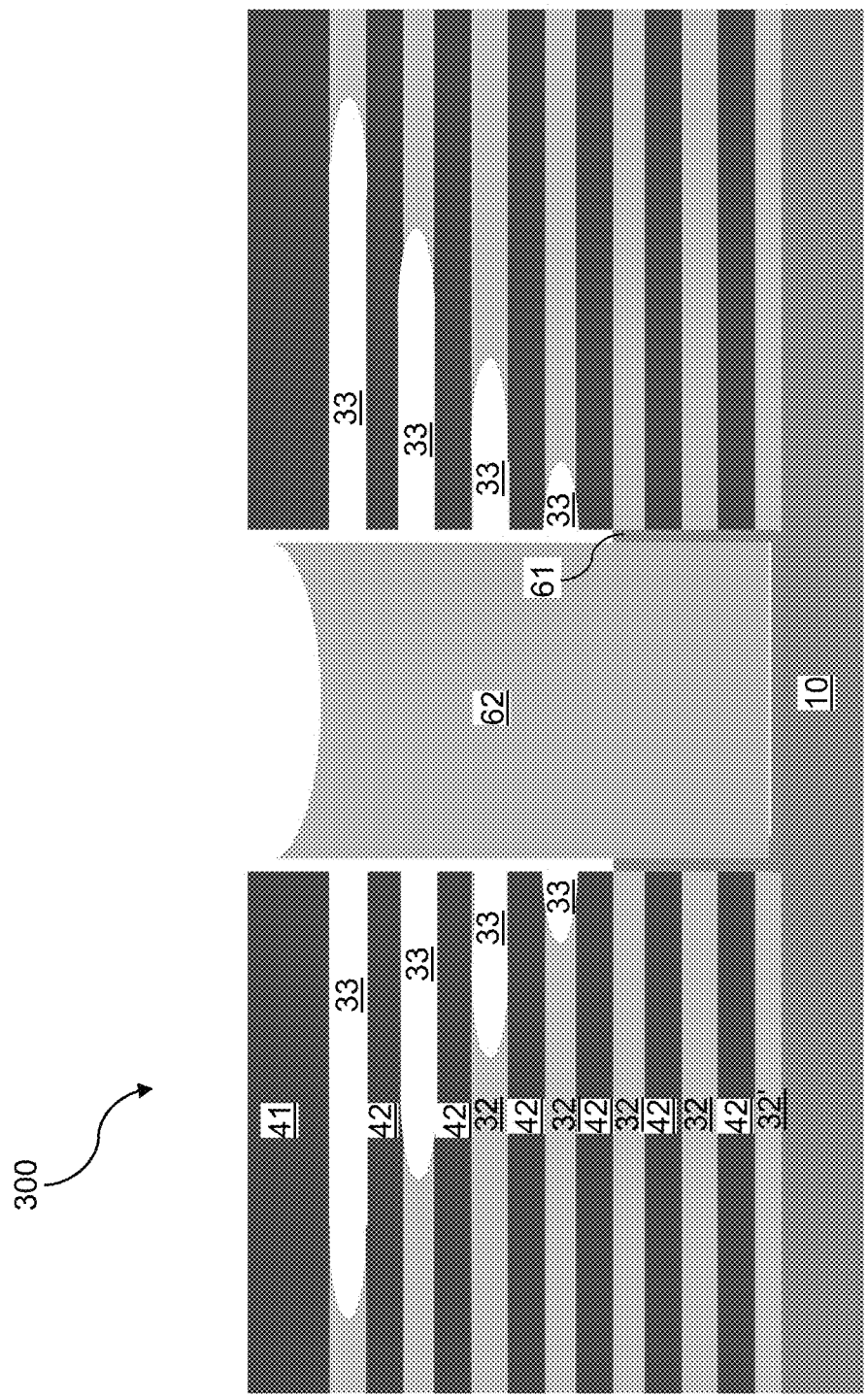
FIG. 9 is a vertical cross-sectional view of the contact region of the first exemplary structure at a second point in time during the isotropic etch of the dielectric material liner and portions of insulator layers according to an embodiment of the present disclosure.

Referring to FIG. 9, the first exemplary structure is shown at a second point in time during the isotropic etch of the dielectric material liner 61 and portions of the first material layers (e.g., the insulator layers 32). Each pre-existing lateral recess 33 is laterally expanded further as an additional material of the first material layer in the same level as the pre-existing lateral recess is removed as the isotropic etch process progresses. Additional lateral recesses 33 are formed at levels in which the dielectric material liner 61 is newly removed as the isotropic etch process progresses.

Figure 10:
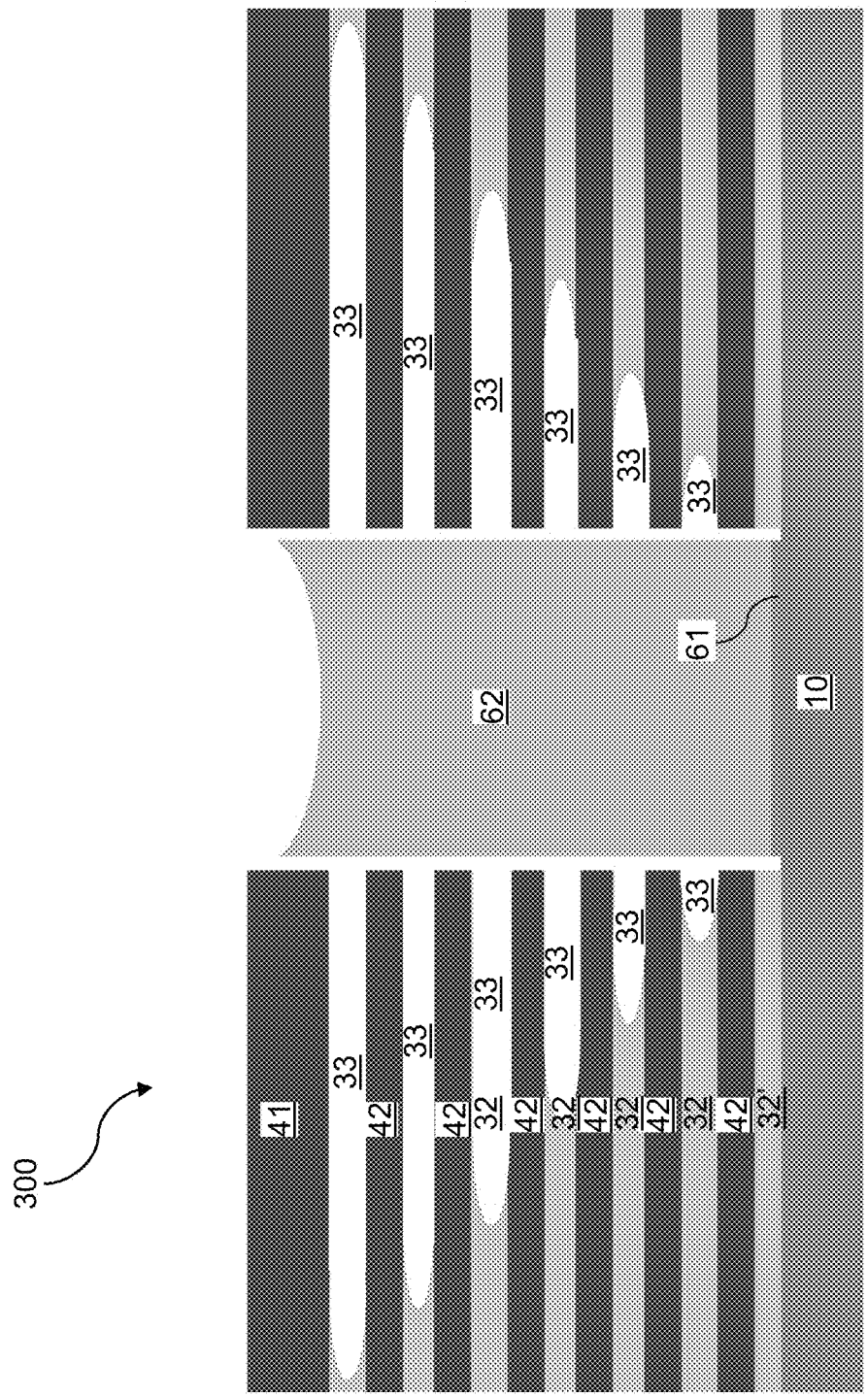
FIG. 10 is a vertical cross-sectional view of the contact region of the first exemplary structure at a third point in time during the isotropic etch of the dielectric material liner and portions of insulator layers according to an embodiment of the present disclosure.

Referring to FIG. 10, the first exemplary structure is shown at a third point in time during the isotropic etch of the dielectric material liner 61 and portions of the first material layers (e.g., the insulator layers 32). Each pre-existing lateral recess 33 is laterally expanded further as an additional material of the first material layer in the same level as the pre-existing lateral recess is removed as the isotropic etch process progresses. Additional lateral recesses 33 are formed at levels in which the dielectric material liner 61 is newly removed as the isotropic etch process progresses. The isotropic etch process progresses until the gap reaches at least the bottommost layer among the first material layers (e.g., the insulator layers 32), or the top surface of the semiconductor material layer 10, and/or until the vertical portions of the dielectric material liner 61 are removed and only a horizontal portion of the dielectric material liner 61 remains underneath the trench fill material portion 62.

Referring collectively to the processing steps of FIGS. 8-10, the stack of first material layers 32 and second material layers 42 constitutes an alternating plurality of separator layers 42 and interlayers 32 formed on a substrate (9, 10). A first sidewall of a first interlayer 32 (e.g., a second-from-the-top interlayer 32) located between a first separator layer (e.g., the topmost second material layer 42) and second separator layer 42 (e.g., the second-from-the-top second material layer 42) is exposed without exposing a second sidewall of a second interlayer 32 (e.g., a third-from-the-top insulator layer 32) that is located below the first and second separator layers 42 and above a third separator layer 42 (e.g., a third-from-the-top second material layer 42). The first interlayer 32 is laterally recessed without etching the second interlayer 32, for example, during an earlier part of the processing step shown in FIG. 8. The second sidewall of the second interlayer 32 is exposed without exposing a third sidewall of the third interlayer 32, for example, during a later part of the processing step shown in FIG. 8. The first interlayer 32 and the second interlayer 32 are laterally recessed simultaneously. Exposing the second sidewall and laterally recessing the first interlayer 32 are performed at a same processing step employing a same etch chemistry, for example, during between the earlier part and the later part of the processing step shown in FIG. 8. The first interlayer 32 and the second interlayer 32 are laterally recessed from the trench 69.

The first interlayer 32 can be laterally recessed to a greater lateral extent than the second interlayer 32. A set of processing steps can be repeatedly performed. The processing steps include exposing a previously unexposed sidewall of an underlying interlayer 32 from below a subset of the stack (32, 42) that includes layers having a physically exposed sidewall (which are the layers located above the recessed surface of the dielectric material liner 61), and laterally recessing the underlying interlayer 32 that has a newly exposed sidewall.

Figure 11:
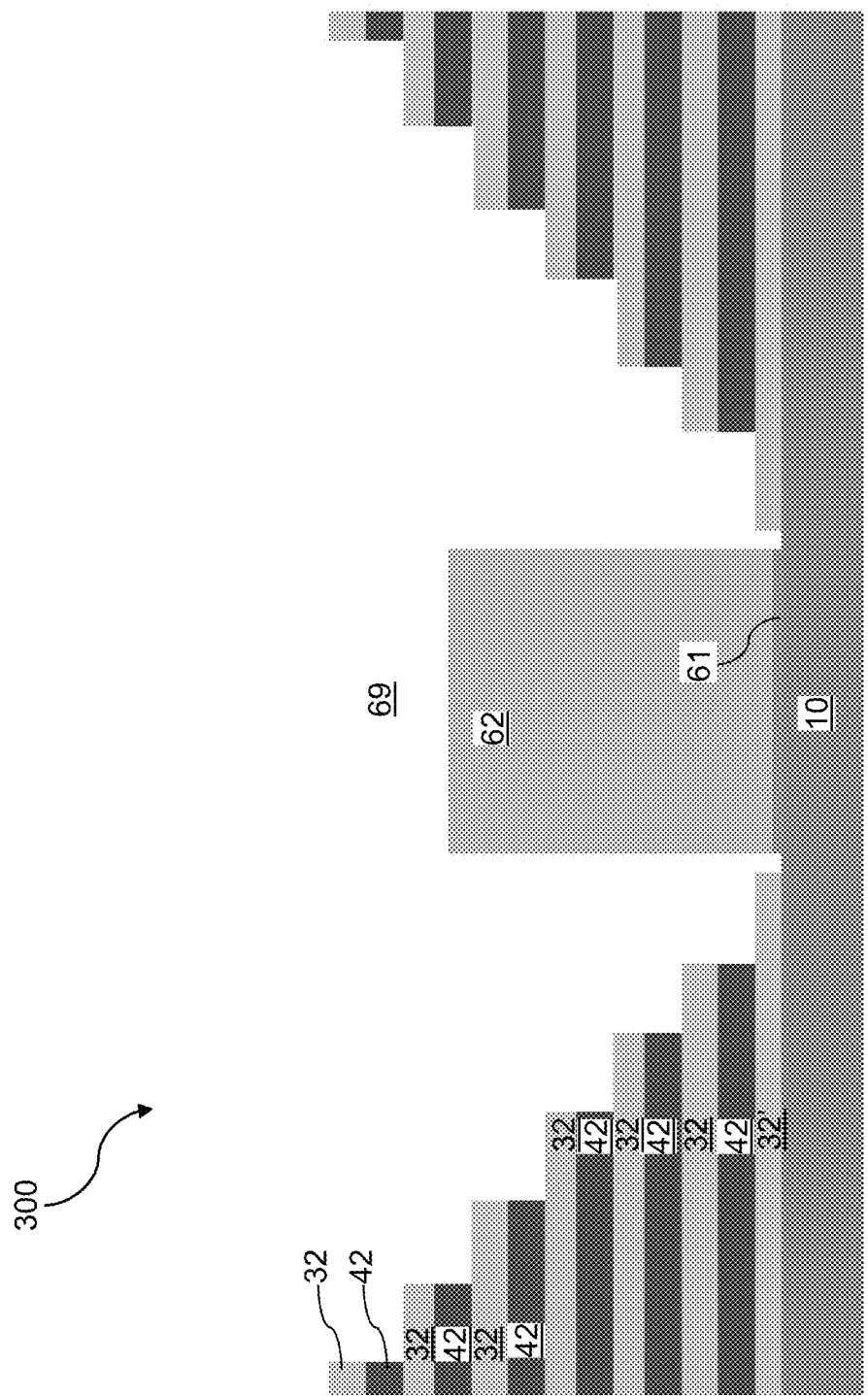
FIG. 11 is a vertical cross-sectional view of the contact region of the first exemplary structure after an anisotropic etch that removes the materials of the hard mask layer and the sacrificial material layers selective to the material of the insulator layers and formation of a set of stepped surfaces according to an embodiment of the present disclosure.

Referring to FIG. 11, an anisotropic etch is performed to remove the material of the hard mask layer 41. Portions of the second material layers (e.g., the sacrificial material layers 42) can be anisotropically etched employing an etch process that is selective the material of the first material layers (e.g., the insulator layers 32). Specifically, the chemistry of the anisotropic etch can be selective to the material of the first material layers (e.g., the insulator layers 32) so that each first material layer functions as an etch mask for underlying second material layer (e.g., the underlying sacrificial material layer 42). Portions of the second material layers (e.g., the sacrificial material layers 42) that are not physically covered by a remaining portion of the first material layers (e.g., the insulator layers 32) are removed by the anisotropic etch.

A set of stepped surfaces is formed on the alternating stack (32, 42) in the contact region 300. The cavity laterally surrounding the trench fill material portion 62 includes stepped surfaces at the bottom, and thus, is a stepped cavity 69. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having a set of stepped surfaces.

Each laterally protruding step of the set of stepped surfaces can includes a pair of a first material layer and a second material layer that have the same lateral extent. Each vertical step of the set of stepped surfaces can include a sidewall of a first material layer and a sidewall of a second material layer that are vertically coincident. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Figure 12:
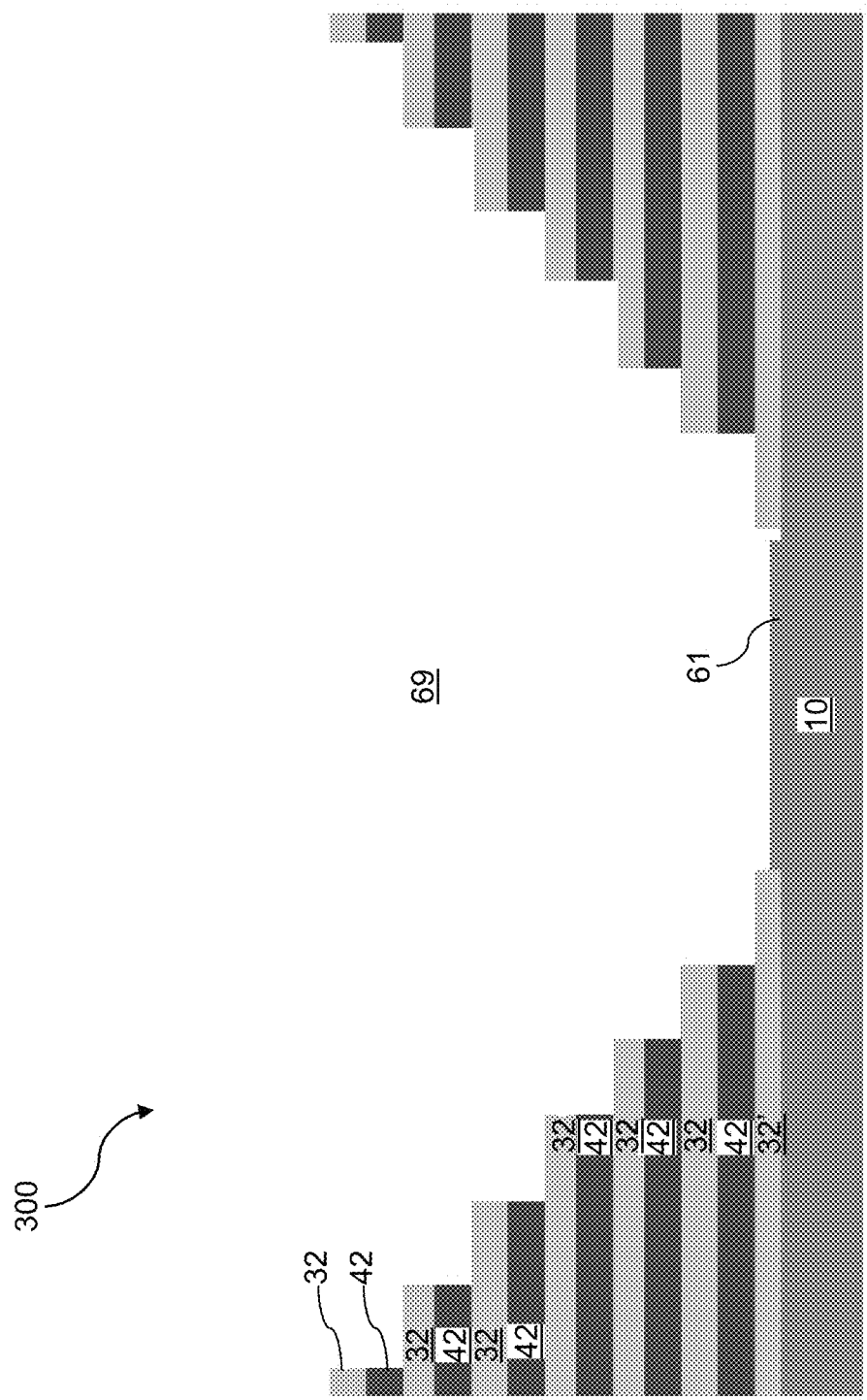
FIG. 12 is a vertical cross-sectional view of the contact region of the first exemplary structure after removal of the trench fill material portion according to an embodiment of the present disclosure.

Referring to FIG. 12, the trench fill material portion 62 can be removed selective to the materials of the alternating stack (32, 42). In one embodiment, the trench fill material portion 62 can be removed selective to the first and second material layers (32, 42) and a remaining horizontal portion of the dielectric material liner 61. In one embodiment, the fill material portion 42 can include a photoresist material, an organic planarizing material, or amorphous carbon, and the removal of the fill material portion 62 can be performed employing an ashing process. A set of stepped surfaces including sidewalls of the interlayers 32 and sidewalls of the separator layers 42 is formed.

Figure 13:
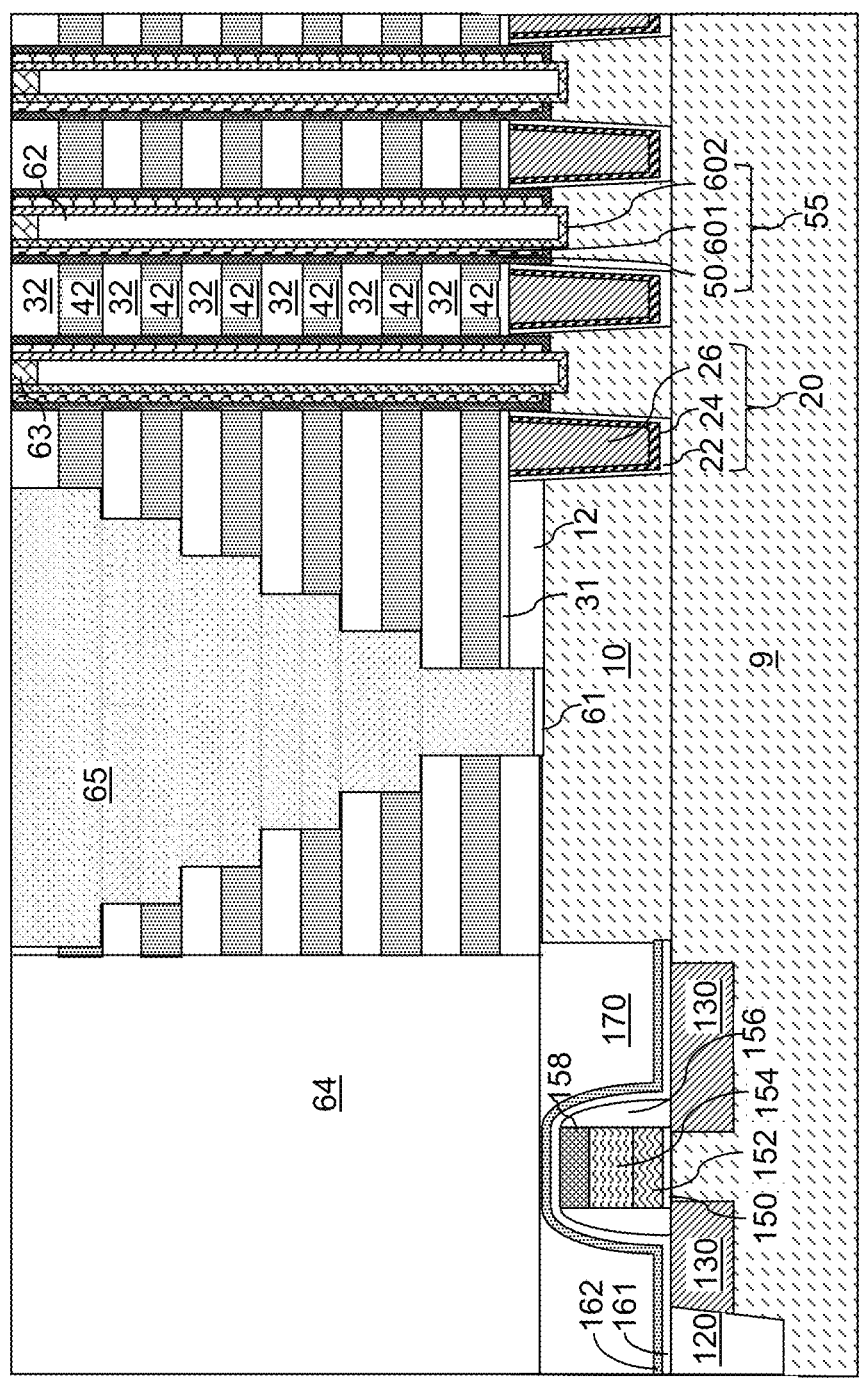
FIG. 13 is a vertical cross-sectional view of the first exemplary structure after formation of a retro-stepped dielectric fill material portion according to an embodiment of the present disclosure.

Referring to FIG. 13, a dielectric material portion 65 (i.e., insulating fill material portion) can be formed in the stepped cavity 69 by deposition of a dielectric material therein. A dielectric material such as silicon oxide can be deposited in the stepped cavity 69. Excess portions of the deposited dielectric material can be removed from above the top surface of the topmost insulator layer 32, for example, by chemical mechanical planarization (CMP). The remaining portion of the deposited dielectric material filling the stepped cavity 69 constitutes the dielectric material portion 65. The dielectric material portion 65 is formed over the stepped structure of the alternating stack (32, 42), and can have a planar top surface.

The dielectric material portion 65 is retro-stepped, i.e., is a retro-stepped dielectric material portion. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

The retro-stepped dielectric material portion 65 is formed on a set of stepped surfaces, and has a vertically-varying horizontal cross-sectional area that increases stepwise at each step of the set of stepped surfaces as a function of a vertical distance from a top surface of the substrate (9, 10). In one embodiment, the horizontal dielectric material liner 61 comprises an undoped silicon oxide, and the retro-stepped dielectric material portion 65 comprises a dielectric material including silicon, oxygen, and at least one element different from silicon and oxygen. In this case, the composition of the retro-stepped dielectric material portion 65 can differ from the composition of the horizontal dielectric material liner 61 only by the presence of the at least one element different from silicon and oxygen, which can be, for example, B, P, a combination of B and P, or F.

Figure 14A:
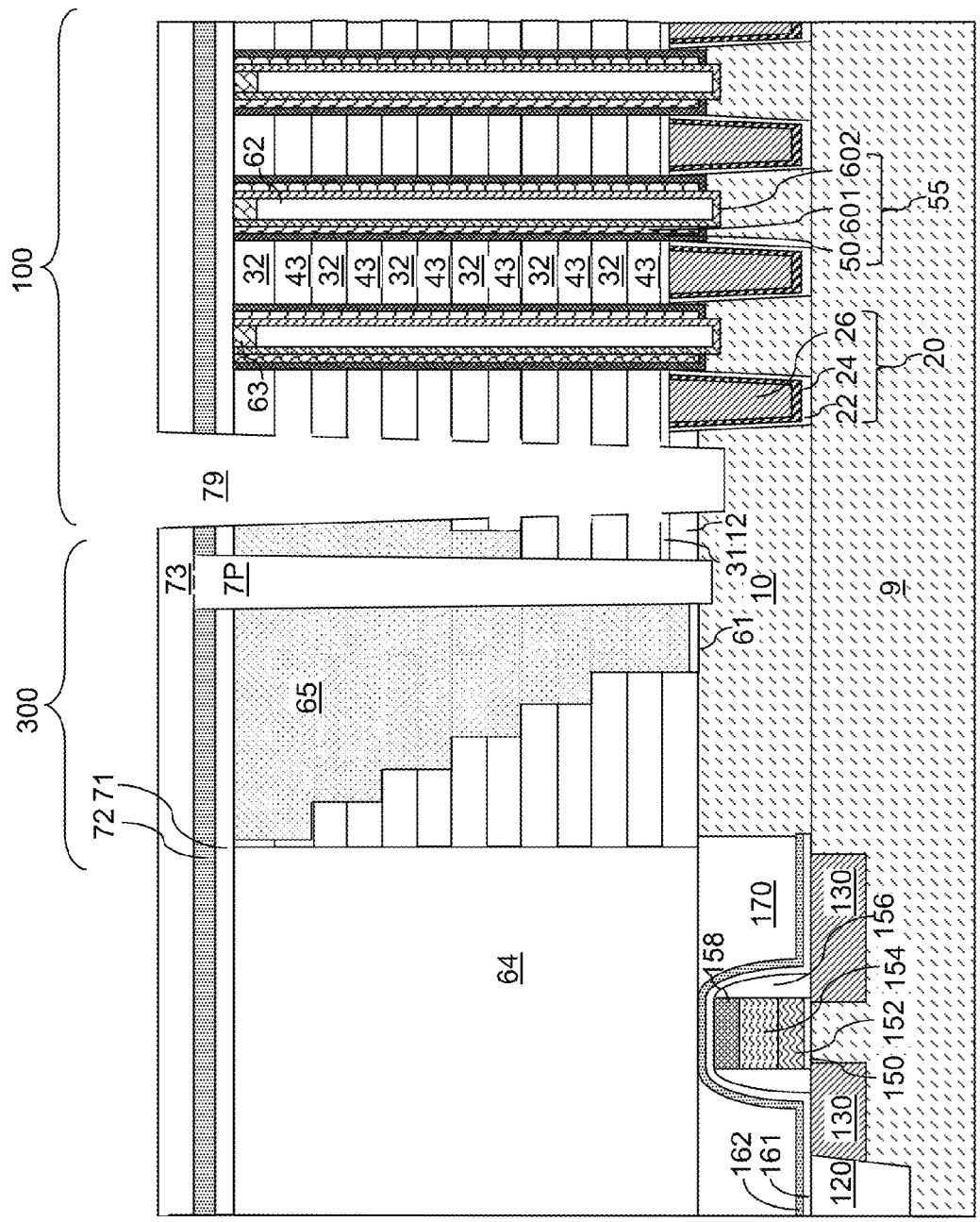
FIG. 14A is a vertical cross-sectional view of the first exemplary structure after formation of a support pillar structure, a backside via cavity, and backside recesses according to an embodiment of the present disclosure.
Figure 14B:
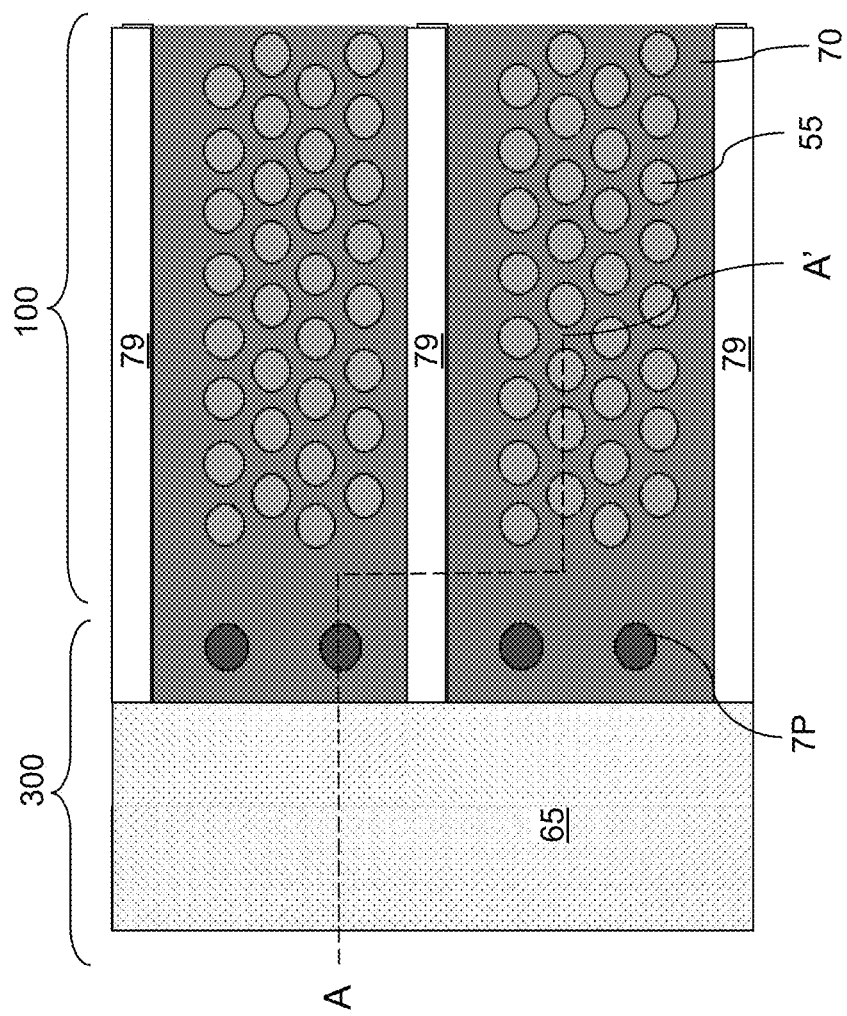
FIG. 14B is a see-through top-down view of the first exemplary structure of FIG. 14A. The zig-zag vertical plane A-A' corresponds to the plane of the vertical cross-sectional view of FIG. 14A.

Referring to FIGS. 14A and 14B, at least one dielectric cap layer (71, 72) can be optionally formed over the topmost insulator layer 32 of the alternating stack (32, 42). In one embodiment, the at least one dielectric cap layer (71, 72) can include a first dielectric cap layer 71 and a second dielectric cap layer 72. In one embodiment, the first and second dielectric cap layers (71, 72) can include dielectric materials such as silicon oxide, a dielectric metal oxide, and/or silicon nitride.

At least one dielectric support pillar 7P may be optionally formed through the at least one dielectric cap layer (71, 72), the retro-stepped dielectric material portion 65, and/or the alternating stack (32, 42). The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar 7P can be present over the at least one dielectric cap layer (71, 72) as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer (71, 72) concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer (71, 72) can be physically exposed.

A photoresist layer (not shown) can be applied over the alternating stack (32, 42) and/or the retro-stepped dielectric material portion 65, and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the substrate semiconductor layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as germanium, a silicon-germanium alloy, polysilicon, and the materials of the insulator layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally-extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region comprises an array of monolithic three dimensional NAND strings having a plurality of device levels disposed above the substrate 8. In this case, each backside recess 43 can define a space for receiving a respective word line of the array of monolithic three dimensional NAND strings.

Each of the plurality of backside recesses 43 can extend substantially parallel to the top surface of the substrate 8. A backside recess 43 can be vertically bounded by a top surface of an underlying insulator layer 32 and a bottom surface of an overlying insulator layer 32. In one embodiment, each backside recess 43 can have a uniform height throughout.

Figure 15:
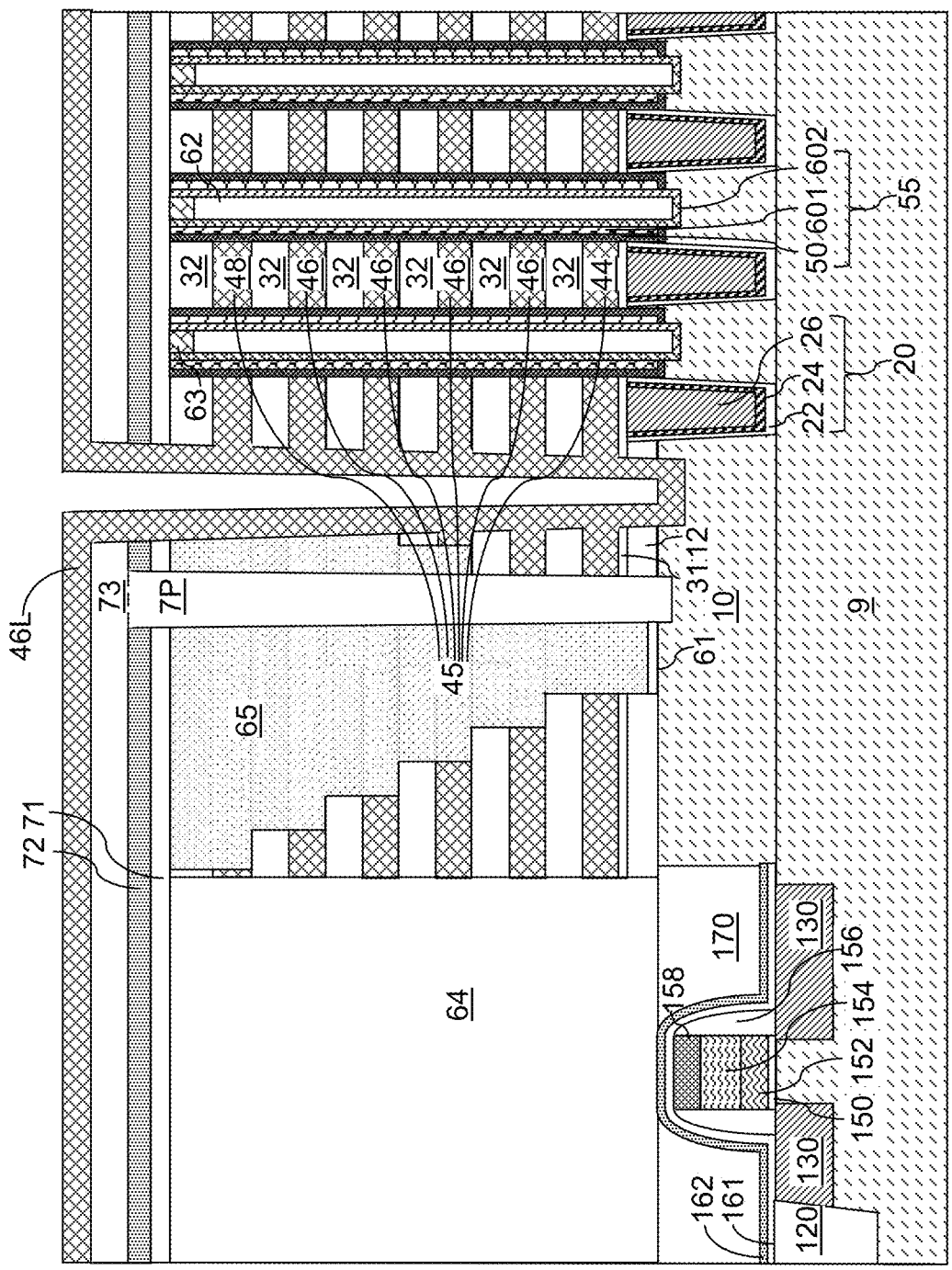
FIG. 15 is a vertical cross-sectional view of the first exemplary structure after formation of electrically conductive layers according to an embodiment of the present disclosure.

Referring to FIG. 15, a conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of backside recesses 43 can be selected from tungsten and a combination of titanium nitride and tungsten. In one embodiment, the conductive material can be deposited by chemical vapor deposition. At least a portion of each of the second material layers can be replaced with a respective conductive material layer, i.e., electrically conductive layer 45, that contacts a sidewall of the retro-stepped dielectric material portion 65.

A plurality of electrically conductive layers 45 is formed in the plurality of backside recesses 43, and an electrically conductive layer 46L can be formed on the sidewalls of each backside contact trench 79 and over the dielectric pillar material layer 73 (or the topmost layer of the exemplary structure in case the dielectric pillar material layer 73 is not employed). Thus, at least a portion of each sacrificial material layer 42 can be replaced with an electrically conductive layer 45, which is a conductive material portion and can be a conductive line structure.

The electrically conductive layers 45 include lower level electrically conductive layers 44, which can be employed as source select gate electrodes that determine which memory stack structure is to become active within the array of memory stack structures during operation of the memory device. The electrically conductive layers 45 further include upper level electrically conductive layers 48, which can be employed as drain select gate electrodes that determine which memory stack structure is to become active within the array of memory stack structures during operation of the memory device. The electrically conductive layers 45 further include control gate level electrically conductive layers 46, which include control gate electrodes for the three-dimensional memory stack structure. The total number of the control gate level electrically conductive layers 46 can be at least the same as the number of levels of control gate electrodes employed in the three-dimensional memory device including the memory stack structures 55. Each control gate level electrically conductive layer 46 can be a conductive line including control gate electrodes for the three-dimensional memory device.

Figure 16A:
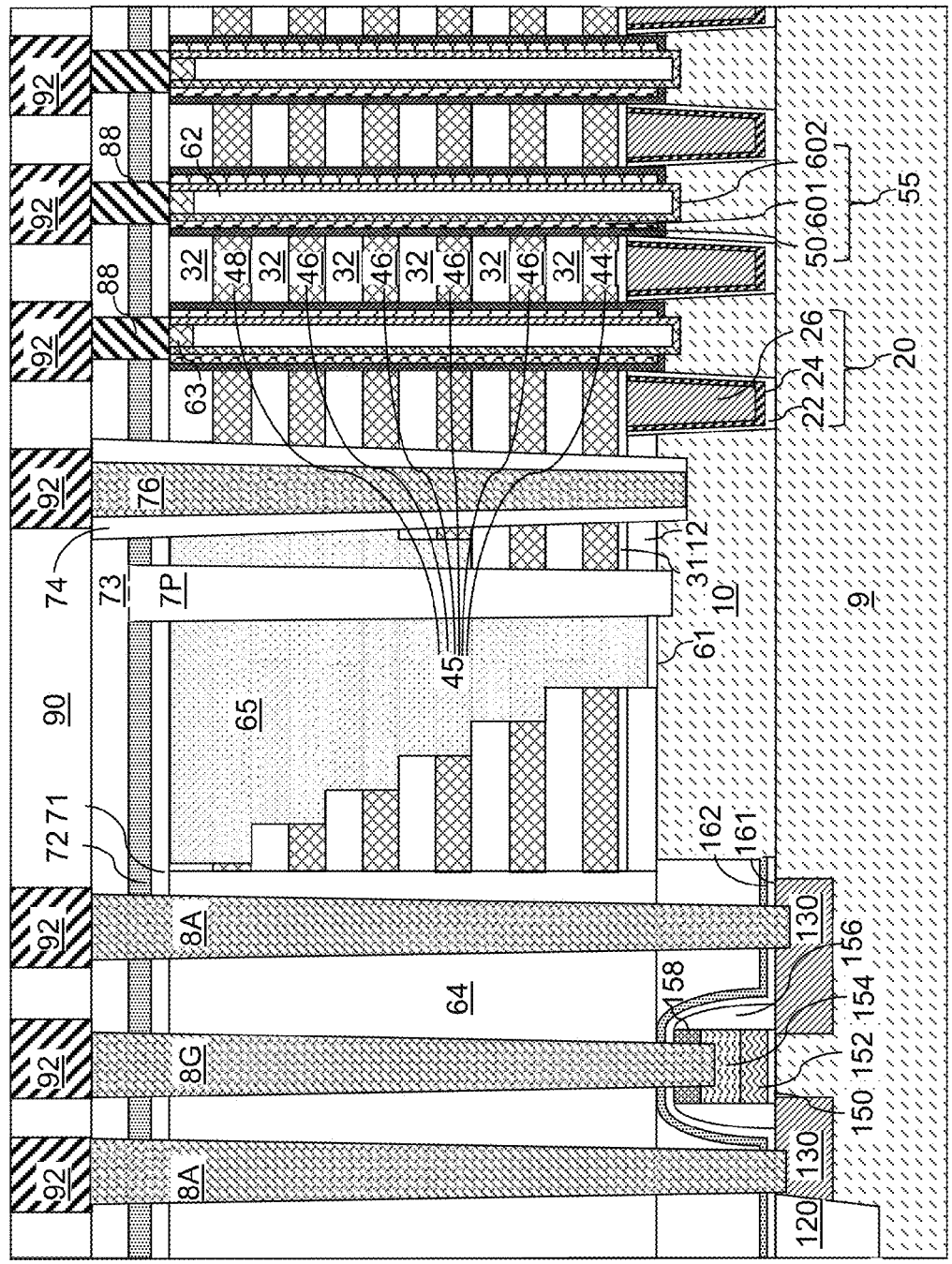
FIGS. 16A and 16B are vertical cross-sectional views of regions of the first exemplary structure after formation of a backside trench spacer, a backside contact via structure, and conductive line structures according to an embodiment of the present disclosure.
Figure 16B:
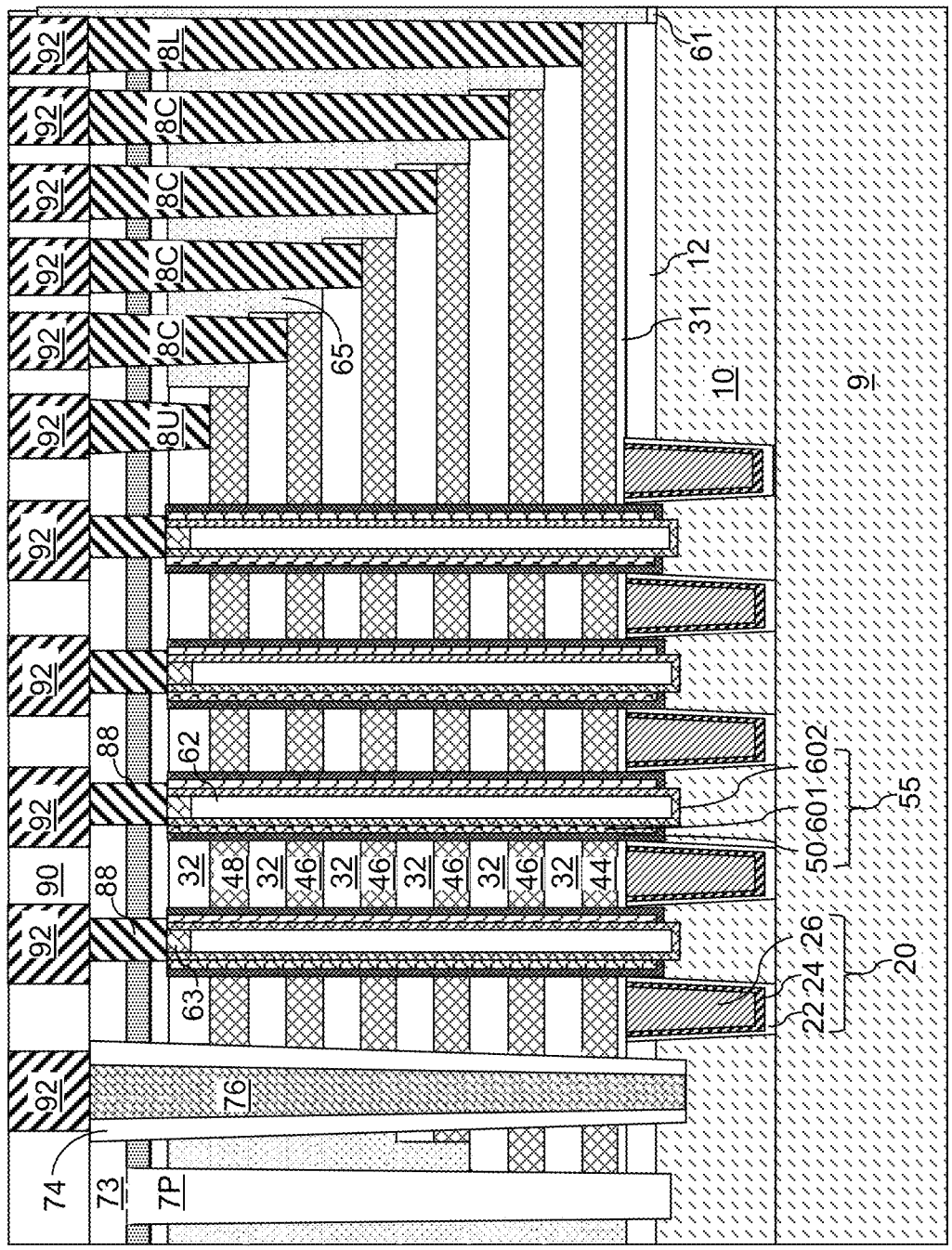

Referring to FIGS. 16A and 16B, the deposited conductive material can be etched back from the sidewalls of each backside contact trench 79 and from above the dielectric pillar material layer 73 (or the topmost layer of the exemplary structure in case the dielectric pillar material layer 73 is not employed), for example, by an isotropic etch. An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A conductive material can be deposited within the cavity surrounded by the insulating spacer to fill the cavity. The deposited conductive material can be removed from above the topmost layer of the exemplary structure (which can be, for example, the dielectric pillar material layer 73) by a planarization process, which can be, for example, a chemical mechanical planarization (CMP) process. The remaining portion of the conductive material below the topmost layer of the exemplary structure and within the insulating spacer 74 constitutes a backside contact via structure 76. The backside contact via structure 76 can be a source line that extends through a dielectric insulated trench, i.e., the backside contact trench 79 filled with the dielectric spacer 74 and the backside contact via structure 76, in the stack to electrically contact a source region (not shown) within the substrate (9, 10). The source region can be in contact with the horizontal portion of the semiconductor channel in an upper portion of the substrate semiconductor layer 10.

Each electrically conductive layer 45, which is located outside the volume of the backside contact cavity, can remain in its respective level. Each control gate level electrically conductive layer 46 can function as a combination of a plurality of control gate electrodes and a word line electrically connecting, i.e., electrically shorting, the plurality of control gate electrodes. The plurality of control gate electrodes within control gate level electrically conductive layer 46 can include control gate electrodes located at the same level for the vertical memory devices including the memory stack structures 55. In other words, each control gate level electrically conductive layer 46 can be a word line that functions as a common control gate electrode for the plurality of vertical memory devices.

Each lower level electrically conductive layer 44 can function as a combination of a plurality of source select gate electrodes and a source select line electrically connecting, i.e., electrically shorting, the plurality of source select gate electrodes. The plurality of source select gate electrodes within lower level electrically conductive layer 44 can include source select gate electrodes located at the same level for the vertical memory devices including the memory stack structures 55. In other words, each lower level electrically conductive layer 44 can be a source select line that functions as a common source select gate electrode for the plurality of vertical memory devices.

Each upper level electrically conductive layer 48 can function as a combination of a plurality of drain select gate electrodes and a drain select line electrically connecting, i.e., electrically shorting, the plurality of drain select gate electrodes. The plurality of drain select gate electrodes within upper level electrically conductive layer 48 can include drain select gate electrodes located at the same level for the vertical memory devices including the memory stack structures 55. In other words, each upper level electrically conductive layer 48 can be a drain select line that functions as a common drain select gate electrode for the plurality of vertical memory devices.

The backside contact via structure 76 can be a source line that extends through a dielectric insulated trench, i.e., the backside contact trench 79 filled with the dielectric spacer 74 and the backside contact via structure 76, in the stack to electrically contact the source region (not shown). The source region can be in contact with the horizontal portion of the semiconductor channel in an upper portion of the semiconductor material layer 10. An array of drain regions 63 contacts a respective semiconductor channel (601, 602) within the array of memory stack structures 55. A drain contact via structure 88, formed over a top surface of each drain region 63, electrically contacts an underlying drain region 63. As used herein, a first element "electrically contacts" a second element if the first element is electrically shorted to the second element.

Peripheral contact via structures (8G, 8A) can be formed through the dielectric pillar material layer 73, the at least one dielectric cap layer (71, 72), the dielectric material portion 64, and optionally through the planarization dielectric layer 170 to provide electrical contact to various nodes of peripheral devices.

Prior to, concurrently with, or after, formation of the backside contact via structure 76 by deposition and planarization of a conductive material, contact via structures contacting the electrically conductive layers 45 can be formed. For example, a photoresist layer (not shown) can be applied over the topmost layer of the exemplary structure (which can be, for example, the dielectric pillar material layer 73), and can be lithographically patterned to form opening therein. Each opening in the photoresist layer can overlie a horizontal surface of the set of stepped surfaces in contact with the retro-stepped dielectric material portion 65. The pattern in the photoresist layer is transferred through the dielectric pillar material layer 73, the at least one dielectric cap layer (71, 72), and the retro-stepped dielectric material portion 65 and an insulator layer 32 by an anisotropic etch to form various contact via cavities. A top surface of an electrically conductive layer 45 is physically exposed at a bottom of each contact via cavity.

A conductive material can be deposited in the various contact via cavities to form various electrode contact via structures (8U, 8C, 8L). A plurality of contact via structures (8U, 8C, 8L) can be formed through the retro-stepped dielectric material portion 65 to the various conductive material layers, i.e., the electrically conductive layers 45. Deposition of the conductive material in the various contact via cavities can be performed in a separate processing step, or in conjunction with deposition of the conductive material in other types of contact via cavities such as the backside contact cavity and/or contact via cavities for peripheral devices. A control gate contact via structures 8C can be formed on a top surface of each control gate level electrically conductive layer 46, a lower level contact via structure 8L can be formed on a top surface of each lower level electrically conductive layer 44, and an upper level contact via structure 8U can be formed on a top surface of each upper level electrically conductive layer 48.

A line level dielectric layer 90 can be formed over the top surface of the dielectric pillar material layer 73. The line level dielectric layer 90 includes a dielectric material such as silicon oxide, organosilicate glass, and/or silicon nitride. Conductive liner structures 92 can be formed in the line level dielectric layer 90 to provide electrical connection to the various contact via structures (8U, 8C, 8L, 88, 76, 8G, 8A) located underneath.

The first exemplary structure includes a stack including an alternating plurality of first material layers (e.g., the insulator layers 32) and second material layers (e.g., the electrically conductive layers 45) located on a substrate (9, 10). A portion of the stack (32, 45) is configured as a set of stepped surfaces at which each vertically adjoined pair of a first material layer (e.g., an insulator layer 32) and a second material layer (e.g., a conductive material layer 45) laterally protrudes farther outward than an immediately overlying vertically adjoined pair of another first material layer and another second material layer.

The retro-stepped dielectric material portion 65 contacts surfaces of the set of stepped surfaces, and has a vertically-varying horizontal cross-sectional area that increases stepwise at each step of the set of stepped surfaces as a function of a vertical distance from the top surface of the substrate (9, 10). In one embodiment, the horizontal dielectric material liner 61 contacts a bottom surface of, and has a different composition from, the retro-stepped dielectric material portion 65. In one embodiment, an entire periphery of the horizontal dielectric material liner 61 can be on, or within, an area defined by a set of sidewalls of the retro-stepped dielectric material portion 65 that is located at the level of a bottommost layer. In other words, the entirety of the horizontal dielectric material liner 61 can be located below the retro-stepped dielectric material portion 65. In one embodiment, a sidewall among the set of sidewalls of the retro-stepped dielectric material portion 65 contacts a sidewall of the bottommost layer of the alternating stack, i.e., among the alternating plurality of the first material layers (e.g., the insulator layers 32) and the second material layers (e.g., the electrically conductive layers 45).

A plurality of contact via structures (8U, 8C, 8L) can extend through the retro-stepped dielectric material portion 65 and contact a respective second material layer, i.e., a respective electrically conductive layer 45. In one embodiment, a bottom surface of the horizontal dielectric material liner 61 can be located at, or below, a horizontal plane including a bottom surface of a bottommost layer (e.g., the bottommost electrically conductive layer 45) within the alternating stack (32, 45). In case an insulator layer 32 is employed in lieu of a combination of the dielectric pad layer 12 and a dielectric cap layer 31, the bottom surface of the horizontal dielectric material liner 61 can be located with the horizontal plane including the bottom surface of the bottommost layer, i.e., the bottommost insulator layer, within the alternating stack (32, 45).

In one embodiment, the device located on the semiconductor substrate can include a vertical NAND device located in the device region, and at least one of the electrically conductive layers 46 in the stack (32, 45) can comprise, or can be electrically connected to, a word line of the NAND device. The device region can include a plurality of semiconductor channels (601, 602). At least one end portion of each of the plurality of semiconductor channels (601, 602) extends substantially perpendicular to a top surface of the semiconductor substrate. The device region further includes a plurality of charge storage regions located within each memory layer 50. Each charge storage region is located adjacent to a respective one of the plurality of semiconductor channels (601, 602). The device region further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of electrically conductive layers 46 in the stack (32, 45) can be in electrical contact with, or can comprise, the plurality of control gate electrodes, and extends from the device region to a contact region including a plurality of electrically conductive contact via structures, i.e., the contact via structures (8U, 8C, 8L).

In case the exemplary structure includes a three-dimensional NAND device, a stack (32, 45) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 45). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 45).

In a non-limiting illustrative example, the insulating layers 32 can comprise silicon oxide layers, the plurality of word lines 46 can comprise tungsten or a combination of titanium nitride and tungsten, the at least one charge storage region can comprises a tunneling dielectric, a blocking dielectric layer, and either a plurality of floating gates, conductive nanoparticles, or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region. The plurality of word lines 46 extends from the device region to the contact region.

Figure 17A:
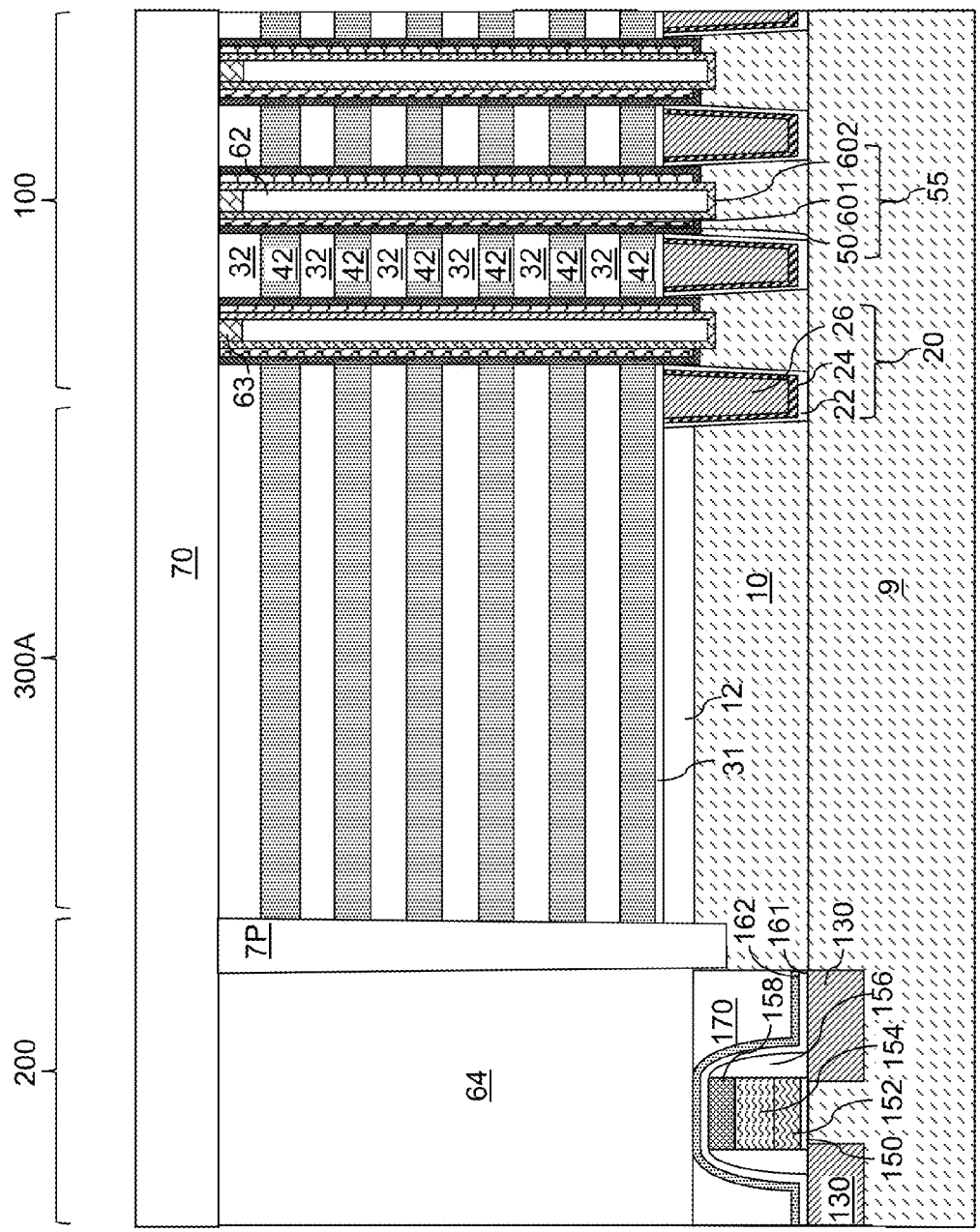
FIGS. 17A and 17B are vertical cross-sectional views of regions of a second exemplary structure after formation of a hard mask layer according to a second embodiment of the present disclosure.
Figure 17B:
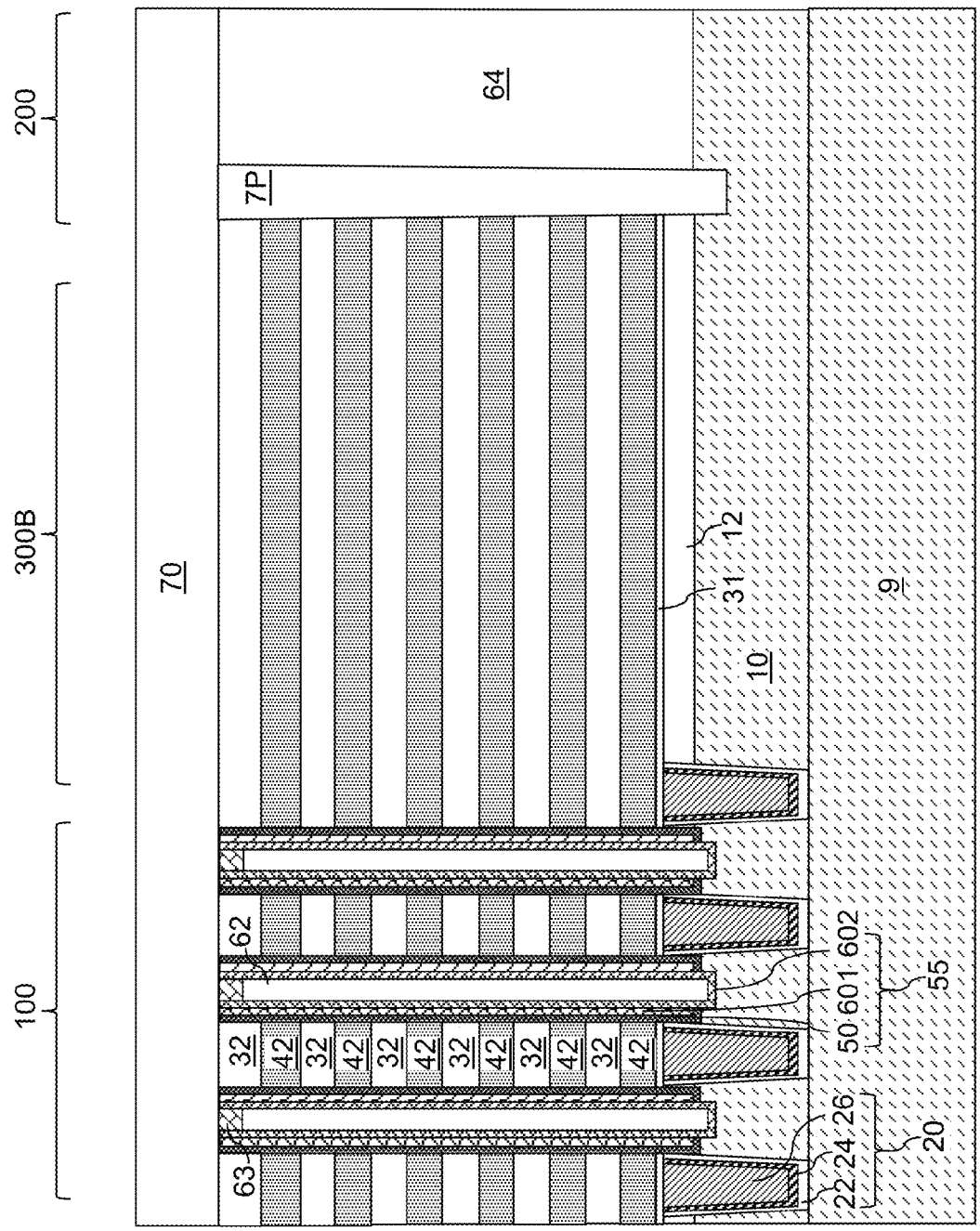

Referring to FIGS. 17A, 17B, and 18, a second exemplary structure according to a second embodiment of the present disclosure can be derived from the first exemplary structure of FIG. 2 by omitting formation of a hard mask layer 41, and by sequentially forming a dielectric material portion 64, at least one dielectric support pillar 7P, and a hard mask layer 70. Depending on the configuration and layout of various regions (100, 200, 300A, 300B), the vertical cross-sectional views of FIGS. 17A and 17B may be within a same vertical plane, or may be in two different vertical planes.

The dielectric material portion 64 can be formed by replacement of a portion of the alternating stack (32, 42) within a peripheral device region 200 with a dielectric material that is different from the material of the sacrificial material layers 42. For example, the dielectric material portion 64 can include silicon oxide, organosilicate glass, and/or silicon nitride. Optionally, a dielectric pillar material layer including the same material as the at least one dielectric support pillar 7P can be formed over the alternating stack (32, 42) and the dielectric material portion 64 and underneath the hard mask layer 70. In one embodiment, the hard mask layer 70 can be formed as a dielectric pillar material layer, i.e., during formation of the at least one dielectric support pillar 7P. The hard mask layer 70 includes a dielectric material that is different from the dielectric material of the sacrificial material layers 42. The dielectric material of the hard mask layer 70 can be the same as, or different from, the dielectric material of the insulator layers 32. If the hard mask layer 70 includes the same material as the insulator layers 32, the total thickness of the hard mask layer 70 can be greater than the sum of the thicknesses of all insulator layers 32 within the alternating stack (32, 42). If the hard mask layer 70 includes a different dielectric material than the dielectric material of the insulator layers 32, the dielectric material layer of the hard mask layer 70 can be selected so that the first material and the second material can be etched employing the dielectric material of the hard mask layer 70 as an etch mask. In one embodiment, the insulator layers 32 can include silicon oxide, the sacrificial material layers 42 can include silicon nitride, and the hard mask layer 70 can include a dielectric metal oxide. In one embodiment, the insulator layers 32 can include silicon oxide, the sacrificial material layers 42 can include germanium, a silicon-germanium alloy, or silicon, and the hard mask layer 70 can include a dielectric metal oxide or silicon nitride. The thickness of the hard mask layer 70 can be in a range from 100 nm to 2,000 nm, although lesser and greater thicknesses can also be employed.

The contact regions of the second exemplary structure can be formed as two separate regions. In one embodiment, the second exemplary structure can include a first contact region 300A and a second contact region 300B. A backside contact trench region 79' in which a backside contact trench is to be subsequently formed is illustrated in FIG. 18.

Referring to FIGS. 19A and 19B, a first mask layer 77A is applied over the top surface of the hard mask layer 70, and is lithographically patterned with a first pattern to form an opening within the first contact region 300A. In one embodiment, the first mask layer 77A can be a photoresist layer. The opening can be circular, polygonal, or a curvilinear closed shape. In one embodiment, the first pattern includes the opening in the area of the first contact region 300A, and does not include any opening in the area of the second contact region 300B.

Referring to FIGS. 20A and 20B, the first pattern in the first mask layer 77A can be transferred through the hard mask layer 70 by an anisotropic etch, which can be, for example, a reactive ion etch. A first trench 69A (i.e., an opening) can be formed through the hard mask layer 70. The first mask layer 77A may be partially consumed during the anisotropic etch.

Referring to FIGS. 21A and 21B, the first mask layer 77A can be removed selective to the hard mask layer 70 and the topmost first material layer (e.g., the topmost insulator layer 32). The first mask layer 77A can be removed, for example, by ashing.

Figures 22A, 22B:
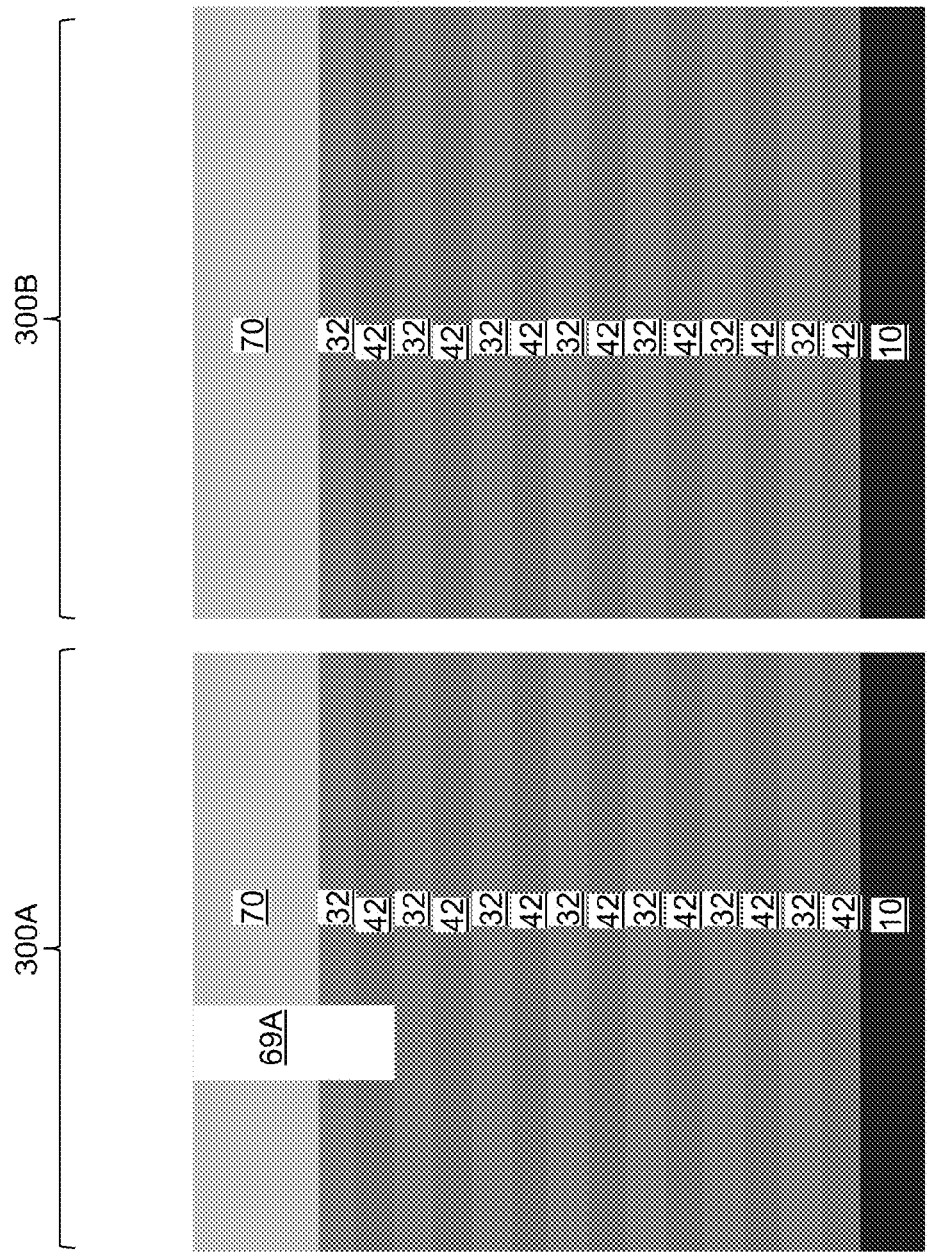
FIGS. 22A and 22B are vertical cross-sectional views of the first and second contact regions after transfer of the first pattern into a set of an insulator layer and a sacrificial material layer according to the second embodiment of the present disclosure.

Referring to FIGS. 22A and 22B, the first pattern can be transferred through a topmost first material layer (e.g., the topmost insulator layer 32) and through a topmost second material layer (e.g., the topmost sacrificial material layer 42) by an anisotropic etch. The anisotropic etch can be performed employing the hard mask layer 70 as an etch mask. The first trench 69A vertically extends through the hard mask layer 70, the topmost first material layer (e.g., the topmost insulator layer 32), and the topmost second material layer (e.g., the topmost sacrificial material layer 42).

Referring to FIGS. 23A and 23B, a second mask layer 77B is applied over the top surface of the hard mask layer 70, and is lithographically patterned with a second pattern to form an opening within the second contact region 300B. In one embodiment, the second mask layer 77B can be a photoresist layer. The opening can be circular, polygonal, or a curvilinear closed shape. In one embodiment, the second pattern includes the opening in the area of the second contact region 300B, and does not include any opening in the area of the first contact region 300A. The first trench 69A can be filled with the second mask layer 77B at this step.

Figures 24A, 24B:
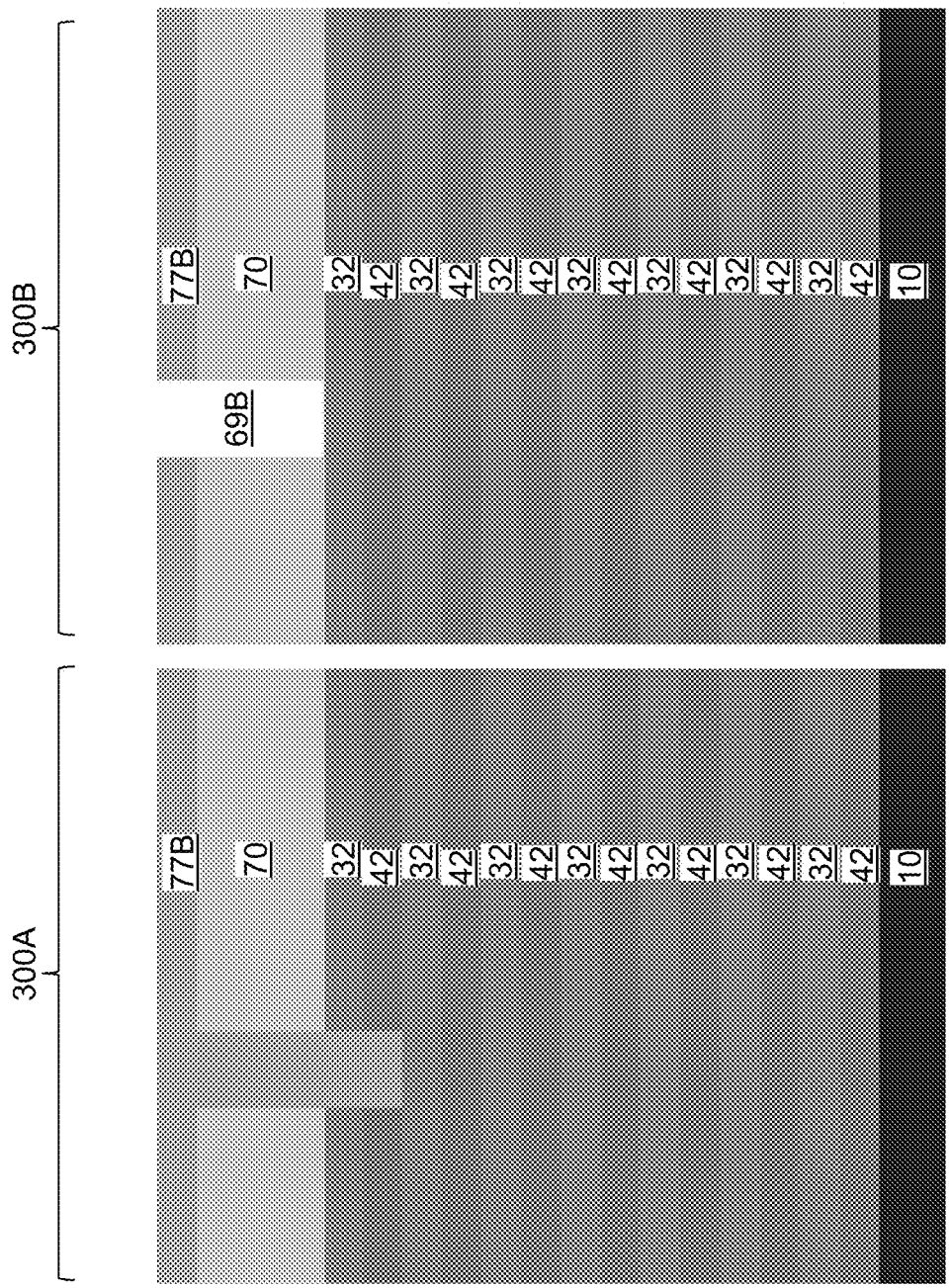
FIGS. 24A and 24B are vertical cross-sectional views of the first and second contact regions after transferring the second pattern in the second mask layer into the hard mask layer according to the second embodiment of the present disclosure.

Referring to FIGS. 24A and 24B, the second pattern in the second mask layer 77B can be transferred through the hard mask layer 70 by an anisotropic etch, which can be, for example, a reactive ion etch. A second trench 69B (i.e., an opening) can be formed through the hard mask layer 70. The second mask layer 77B may be partially consumed during the anisotropic etch.

Referring to FIGS. 25A and 25B, the second mask layer 77B can be removed selective to the hard mask layer 70 and the topmost first material layer (e.g., the topmost insulator layer 32). The second mask layer 77B can be removed, for example, by ashing.

The bottom surface of the first trench 69A in the first contact region 100A and the bottom surface of the second trench 69B in the second contact region 100B can be vertically offset by one level, which corresponds to the level including the topmost insulator layer 32 and the topmost sacrificial material layer 42.

While the present disclosure is described employing an embodiment in which the bottom surface of the first trench 69A and the bottom surface of the second trench 69B are vertically offset by one level, embodiments are expressly contemplated herein in which the bottom surface of the first trench 69A is vertically offset from the bottom surface of the second trench 69B by a plurality of levels. Such embodiments can be derived by etching a plurality of levels of the first and second material layers at the processing step of FIGS. 22A and 22B. Further, while the present disclosure is described employing an embodiment in which two trenches (69A, 69B) are formed, embodiments are expressly contemplated herein in which more than two trenches are formed such that the bottom surfaces of the trenches are vertically offset from one another. In an illustrative example, n trenches (in which n is an integer greater than 2) can be formed through upper portions of an alternating stack such that the a portion of a top surface of an i-th insulator layer (as counted from the top) is physically exposed as the bottom surface of an i-th trench for each positive integer not greater than n. The bottom surface of the i-th trench can be vertically offset from the bottom surface of the first trench (the shallowest trench) by an integer number of levels (e.g. by (i-1)) such that integer number (e.g., (i-1)) is not an integer multiple of n (and can be less than n).

Physically exposed portions of the topmost second material layer (e.g., the topmost sacrificial layer 42) around the first trench 69A can be laterally recessed by an etch process, which can be an isotropic etch process. The etch chemistry of the isotropic etch process can be selected such that the second material of the topmost second material layer (e.g., the topmost sacrificial material layer 42) can be removed selective to the first material of the first material layers (e.g., the insulator layers 32).

In an illustrative example, the hard mask layer 70 and the first material layers (e.g., the insulator layers 32) can include silicon oxide, and the second material layers (e.g., the sacrificial material layers 42) can include silicon nitride, germanium, or a silicon-germanium alloy. In this case, the isotropic etch process can be a wet etch process or an isotropic dry etch process that removes the second material of the second material layers selective to silicon oxide. For example, if the hard mask layer 70 and the first material layers (e.g., the insulator layers 32) include silicon oxide, and if the second material layers (e.g., the sacrificial material layers 42) include silicon nitride, a wet etch process employing phosphoric acid can be employed for the isotropic etch process. If the hard mask layer 70 and the first material layers (e.g., the insulator layers 32) include silicon oxide, and if the second material layers (e.g., the sacrificial material layers 42) include silicon nitride, a dry etch process employing HCl can be employed for the isotropic etch process.

A laterally-extending cavity 68, which extends parallel to the top surface of the substrate (9, 10), can be formed around the first trench 69A at the level of the topmost sacrificial material layer 42. The first trench 69A is a vertically extending cavity, i.e., a cavity that extends vertically, i.e., perpendicular to the top surface of the substrate (9, 10). The laterally-extending cavity 68 has a shape of an annulus, and is connected to the first trench 69A. The outer periphery of the laterally-extending cavity 68 can extend by a same lateral distance from the sidewall of the first trench 69A due to the isotropic nature of the etch process employed to form the laterally-extending cavity 68. For example, the lateral extent of the left portion of the laterally-extending cavity 68 (between a sidewall of the left side portion of the sacrificial material layer 42 and a left side sidewall of the first trench 69A) can be the same as the lateral extent of the right portion of the laterally-extending cavity 68 (between a sidewall of the right side portion of the sacrificial material layer 42 and a right side of the first trench 69A). The first trench 69A and the laterally-extending cavity 68 are of integral construction, i.e., form a single contiguous volume. In one embodiment, the maximum lateral dimension of each laterally-extending cavity 68 (e.g., the diameter of an annular laterally-extending cavity 68) can be greater than the height of the laterally-extending cavity 68. Each laterally-extending cavity 68 can have a uniform height. In one embodiment, the lateral dimension of the laterally-extending cavity 68 parallel to the substrate (9, 10) can be greater than the vertical dimension (height) of the laterally-extending cavity 68 perpendicular to the substrate (9, 10).

Subsequently, a set of sequential processing steps can be repeated multiple times to alternate between vertical expansion of each trench (69A, 69B) and formation of additional laterally-extending cavities 68 and lateral expansion of pre-existing laterally-extending cavities 68. The set of processing steps includes a first processing step employing an anisotropic etch process and a second processing step employing an isotropic etch process can be subsequently performed. The anisotropic etch process employed in the first processing step vertically extends each of the first and second trenches (69A, 69B) through n additional first material layers and n additional second material layers, in which n is an integer greater than 1. The isotropic etch process in the second processing step laterally recesses each second material layer that is physically exposed to the respective trench (69A, 69B), or laterally recesses a pre-existing laterally-extending cavity 68 adjoined to the respective trench (69A, 69B).

Referring to FIGS. 26A and 26B, an instance of a first processing step within a first set of processing steps can be performed. Multiple pairs of the first and second material layers are vertically recessed at the bottom of each of the first trench 69A and the second trench 69B. For example, multiple pairs of the insulator layers 32 and the sacrificial material layers 42 can be vertically recessed by an anisotropic etch that employs the hard mask layer 70 as an etch mask. The anisotropic etch process can have an alternating plurality of anisotropic etch steps in which the first material of a first material layer and the second material of a second material layer are alternately etched. The etch of the second material is selective to the material of the hard mask layer 70. The etch of the first material may, or may not, be selective to the hard mask layer 70. In one embodiment, the etch of the second material can be selective to the material of the hard mask layer 70, and the etch of the first material layer can be selective to the material of the hard mask layer 70.

The number of pairs within the multiple pairs of the insulator layers 32 and the sacrificial material layers 42 is the same as the number of levels by which each of the trenches (69A, 69B) is vertically extended. If more than three cavities are present through upper portions of the alternating stack (32, 42), each of the cavities can be vertically recessed. If a total of n cavities having bottom surfaces at n different levels are present, n pairs of first and second material layers can be vertically recessed at the bottom of each cavity.

For example, if the first trench 69A and the second trench 69B are present in the upper portion of the alternating stack (32, 42), two pairs of the insulator layers 32 and the sacrificial material layers 42 can be etched through by the anisotropic etch. Thus, each of the first and second trenches (69A, 69B) can be vertically recessed through two levels corresponding to the two pairs of the insulator layers 32 and the sacrificial material layers 42.

Referring to FIGS. 27A and 27B, an instance of a second processing step within the first set of processing steps can be performed. Each second material layer (e.g., the sacrificial material layers 42) that is physically exposed to the first or second trench (69A, 69B) and each laterally-extending cavity 68 adjoined to the first or second trench (69A, 69B) are laterally recessed by the isotropic etch process in the second step of the first set of processing steps. If n number of levels are etched through by the anisotropic etch at the first processing step within the first set of processing steps of FIGS. 26A and 26B, then n new laterally-extending cavities 68 are formed around a bottom portion of each trench (69A, 69B) during the second step of the first set of processing steps. Each pre-existing laterally-extending cavities 68 are laterally expanded by the isotropic etch of the second step of the first set of processing steps.

Figures 28A, 28B:
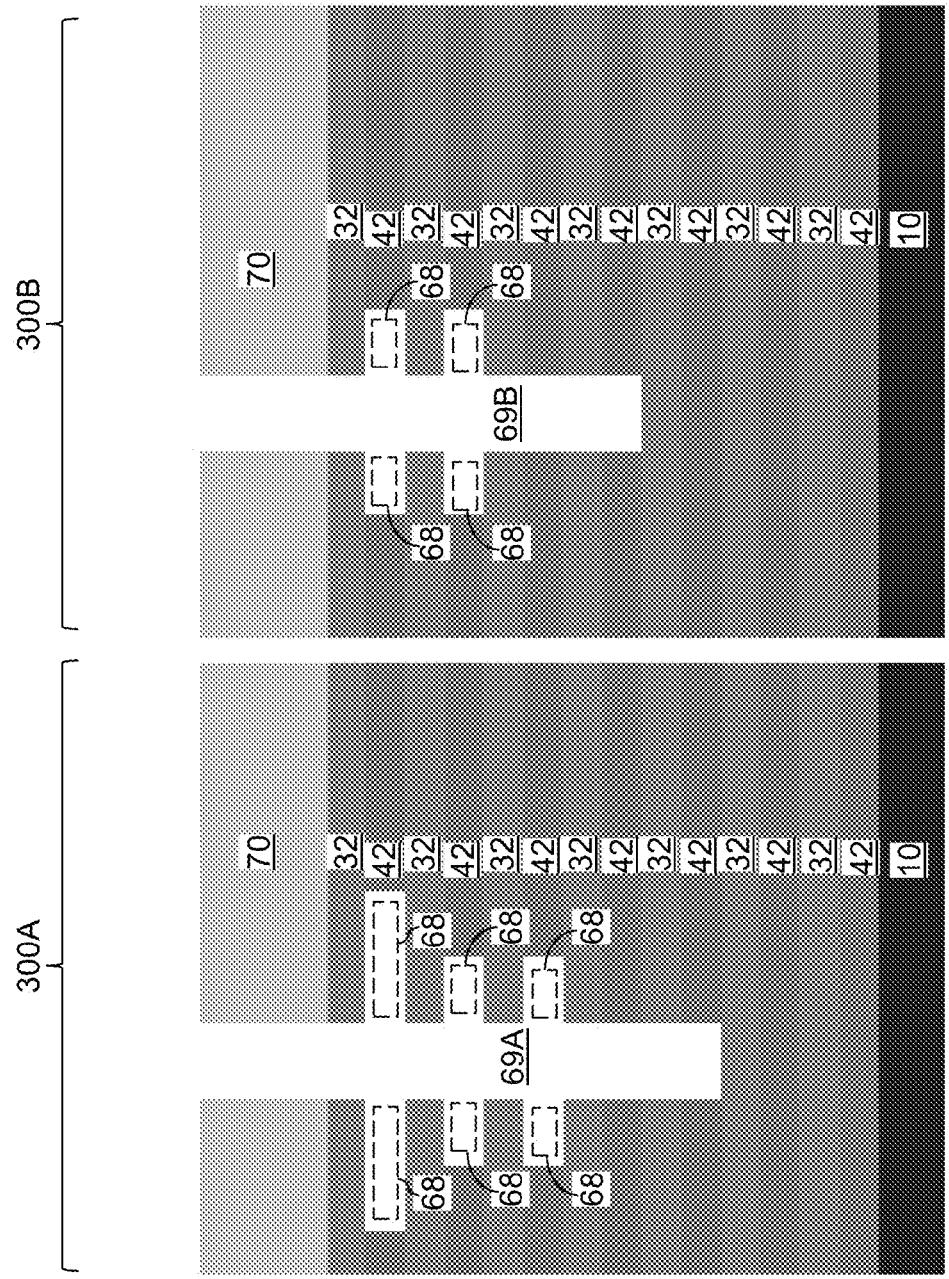
FIGS. 28A and 28B are vertical cross-sectional views of the first and second contact regions after vertical recessing multiple pairs of repetitions of insulator layers and sacrificial material layers according to the second embodiment of the present disclosure.
Figures 30A, 30B:
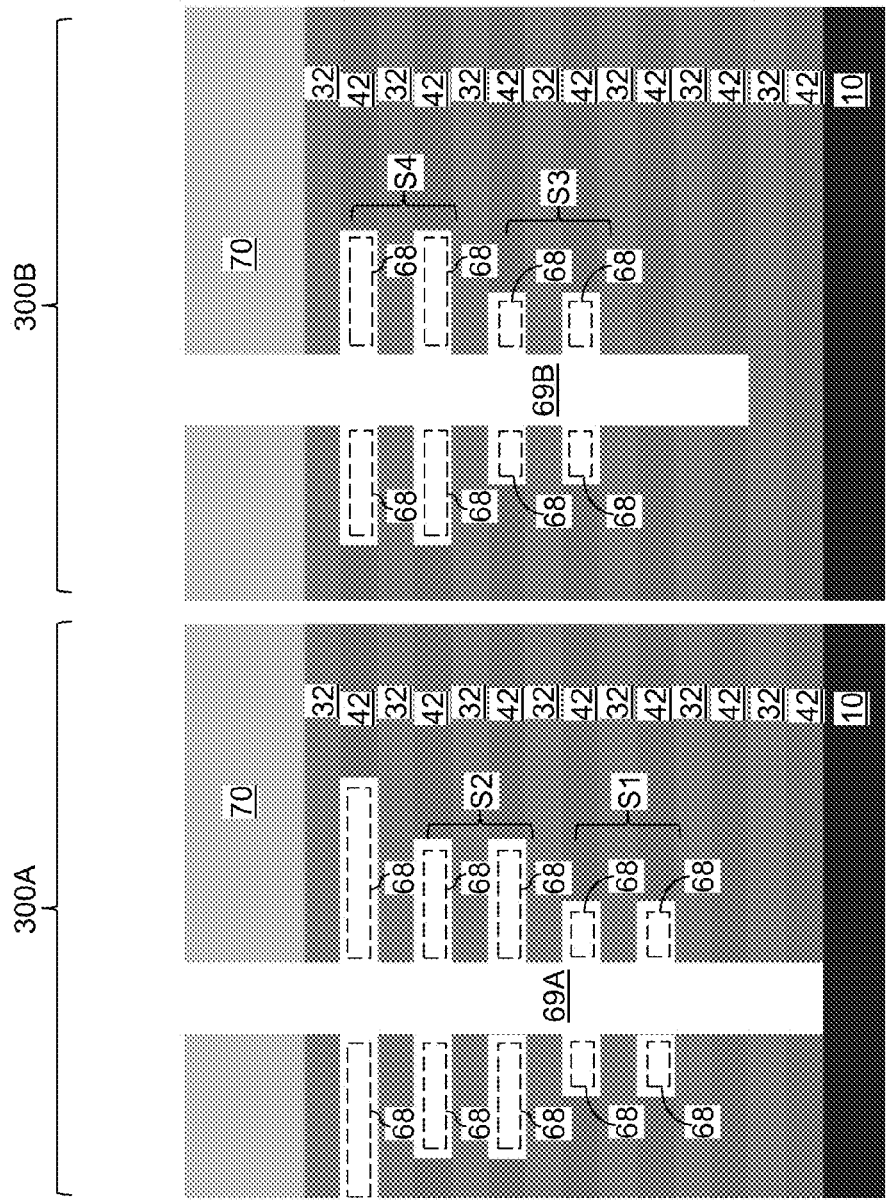
FIGS. 30A and 30B are vertical cross-sectional views of the first and second contact regions after vertical recessing multiple pairs of insulator layers and sacrificial material layers according to the second embodiment of the present disclosure.
Figures 31A, 31B:
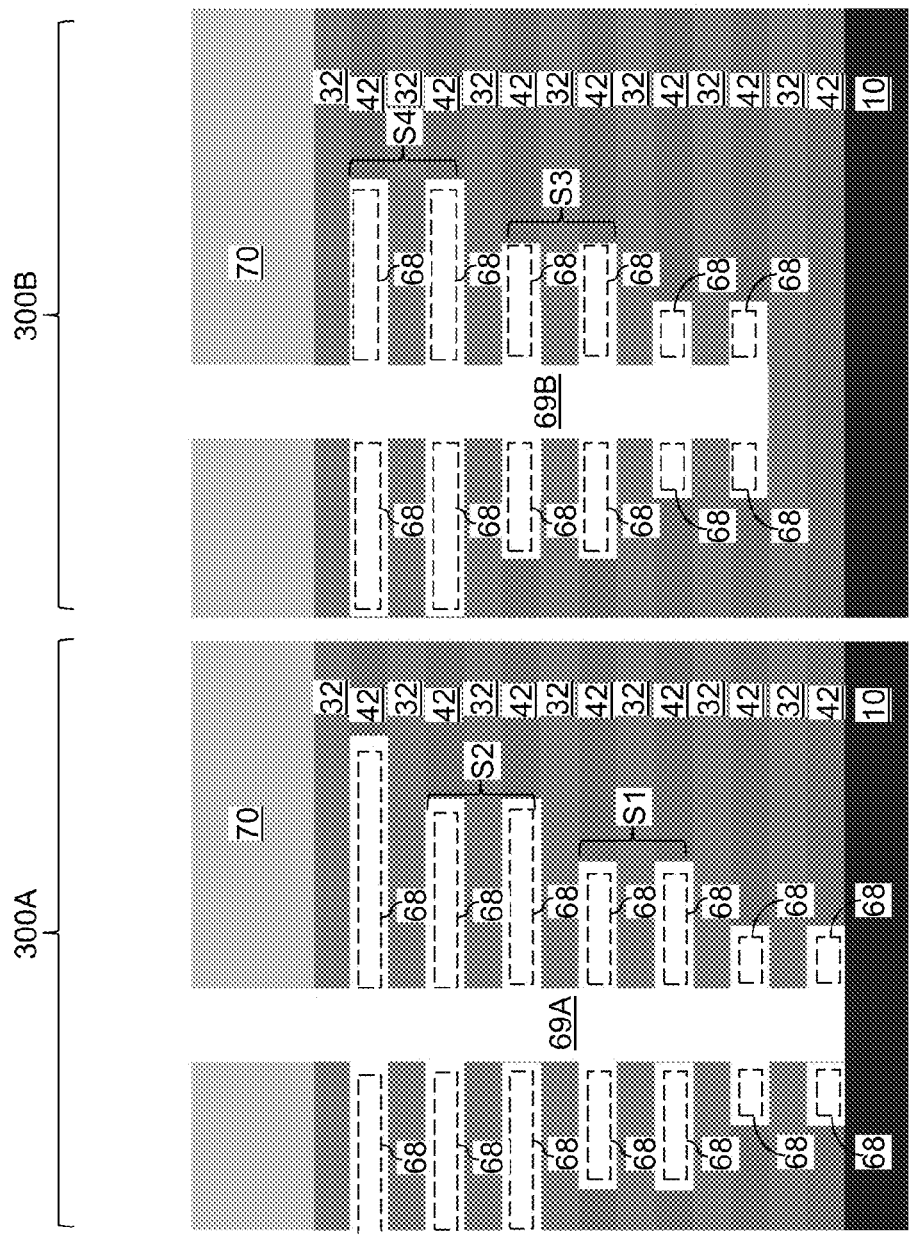
FIGS. 31A and 31B are vertical cross-sectional views of the first and second contact regions after laterally recessing physically exposed portions of sacrificial material layers according to the second embodiment of the present disclosure.

Subsequently, the set of first and second processing steps is performed one or more times. Referring to FIGS. 28A and 28B, an instance of a first processing step within a second set of processing steps can be performed. Multiple pairs of the first and second material layers are vertically recessed at the bottom of each of the first trench 69A and the second trench 69B. In one embodiment, the number of pairs of first and second material layers that are vertically recessed by an anisotropic etch process within the first processing step can be the same as the total number n of trenches (69A, 69B) in the alternating stack (32, 42).

Referring to FIGS. 29A and 29B, an instance of a second processing step within the second set of processing step can be performed. Each second material layer (e.g., the sacrificial material layers 42) that is physically exposed to the first or second trench (69A, 69B) and each laterally-extending cavity 68 adjoined to the first or second trench (69A, 69B) are laterally recessed by the isotropic etch process in the second step of the second set of processing steps. If n number of levels are etched through by the anisotropic etch at the first processing step within the first set of processing steps of FIGS. 28A and 28B, then n new laterally-extending cavities 68 are formed around a bottom portion of each trench (69A, 69B) during the second step of the first set of processing steps. Each pre-existing laterally-extending cavities 68 are laterally expanded by the isotropic etch of the second step of the first set of processing steps.

Referring collectively to FIGS. 17A, 17B, 18, and 19A-29B, the stack (32, 42) of alternating layers including the first material layers 32 and the second material layers 42 as provided at the processing step of FIGS. 17A, 17B, and 18 constitutes a stack including an alternating plurality of separator layers 32 and interlayers 42 over a substrate (9, 10). A first sidewall of a first interlayer 42 (for example, the topmost second material layer 42) located between a first separator layer (e.g., the topmost first material layer 32) and a second separator layer (e.g., the second-from-the-top first material layer 32) is exposed without exposing a second sidewall of a second interlayer 42 (for example, the third-from-the-top second material layer 42) that is located below the first and second separator layers 32 and above a third separator layer 32 (for example, a fourth-from-the-top first material layer 32), for example, as illustrated in FIG. 22A. The first interlayer 42 can be laterally recessed without etching the second interlayer 42, for example, as illustrated in FIG. 25A. The second sidewall of the second interlayer 42 can be laterally recessed without exposing a third sidewall of the third interlayer, as illustrated, as illustrated in FIG. 26A. The first interlayer 42 and the second interlayer 42 can be laterally recessed simultaneously, for example, as illustrated in FIG. 27A. Exposing the second sidewall and laterally recessing the first interlayer 42 are performed at separate processing steps employing different etch processes. For example, exposing of the second sidewall is performed at the processing step of FIG. 26, and laterally recessing of the first and second interlayers 42 is simultaneously performed at the processing step of FIG. 27A. The first sidewall and the second sidewall become exposed to the trench 69A during vertical extension of the trench 69A. The first interlayer 42 and the second interlayer 42 are laterally recessed from the trench 69A. The first interlayer 42 is laterally recessed to a greater lateral extent than the second interlayer 42.

Referring to FIGS. 30A, 30B, 31A, and 31B, the set of processing steps employed at the processing steps of FIGS. 26A, 26B, 27A, and 27B (or at the processing steps of FIGS. 28A, 28B, 29A, and 29B) can be repeatedly performed to alternately expand each trench (69A, 69B) vertically and laterally-extending cavities 68 laterally. The set of processing steps includes a first processing step of vertically extending each trench (69A, 69B) through n additional first material layers and n additional second material layers, in which n is an integer greater than 1 and can be equal to the total number of trenches (69A, 69B), and a second processing step of laterally recessing each second material layer (e.g., the sacrificial material layers 42) that is physically exposed to the trenches (69A, 69B) or a pre-existing laterally-extending cavity 65 adjoined to the trenches (69A, 69B).

Each set of processing steps includes a step of exposing a previously unexposed sidewall of an underlying interlayer (e.g., an underlying second material layer 42) from below a subset of the stack (32, 42) that includes layers having a physically exposed sidewall (e.g., layers of the stack (32, 42) located above the bottom surface of a trench (69A or 69B), and a step of laterally recessing the underlying interlayer that has a newly exposed sidewall.

In one embodiment, at least two pairs of the first material layers (e.g., the insulator layers 32) and the second material layers (e.g., sacrificial material layers 42) can be vertically recessed from the bottom surface of each trench (69A, 69B) during each first processing step. In one embodiment, the number of pairs of first and second material layers that are etched during each first processing step can be an integer not less than 2, and may be the same as the number n of trenches (e.g., 69A, 69B) having bottom surfaces at different levels. Each of the first processing steps can be performed employing an alternating set of etch chemistries such that the first material of first material layers (e.g., insulator layers 32) and the second material of second material layers (e.g., sacrificial material layers 42) is removed employing the hard mask layer 70 as an etch mask. Further, each instance of the first processing steps vertically extends the trenches (69A, 69B).

In one embodiment, at least two of the second material layers (e.g., sacrificial material layers 42) can be laterally recessed by a same lateral distance from a sidewall of each trench (69A, 69B) during each second processing step. In one embodiment, the number of laterally-extending cavities 68 around each trench (69A or 69B) that are newly formed during each second processing step can be the same as the number of pairs of first and second material layers that are etched during an immediately preceding first processing step, and may be an integer not less than 2, and may be the same as the number n of trenches (e.g., 69A, 69B) having bottom surfaces at different levels. Each of the second processing steps can be performed employing an etch chemistry that removes the second material of the second material layers (e.g., the sacrificial material layers 42) selective to the first material of the first material layers (e.g., the insulator material layers 32). Further, each instance of the second processing steps laterally extends each pre-existing laterally-extending cavity 68 embedded within the alternating stack (32, 42).

The laterally-extending cavities 68 around each cavity (69A or 69B) includes multiple sets (S1, S2, S3, S4) of vertically neighboring laterally-extending cavities 68 such that vertically neighboring laterally-extending cavities 68 within each same set among the multiple sets (S1, S2, S3, S4) laterally extend by a same lateral distance from a sidewall of the respective trench (69A or 69B). In one embodiment, each laterally-extending cavity 68 can be an annulus having a center axis coinciding with the axis of the first cavity 69A or the axis of the second cavity 69B. In one embodiment, the outer radius of each annulus within a same set of vertically neighboring laterally-extending cavities 68 can be the same, and the outer radius of the annulus can differ among different sets of neighboring laterally-extending cavities 68. For each pair of an overlying set (e.g., S2 or S4) of vertically neighboring laterally-extending cavities 68 and an underlying set (e.g., S1 or S3) of vertically neighboring laterally-extending cavities 68 among the multiple sets (S1, S2, S3, S4), the overlying set (e.g., S2 or S4) of vertically neighboring laterally-extending cavities 68 laterally protrudes farther than the underlying set (e.g., S1 or S3) of vertically neighboring laterally-extending cavities 68. The first cavity 69A and the set of all laterally-extending cavities 68 adjoined to the first cavity 69A collectively constitutes a first contiguous cavity (69A, 68), and the second cavity 69B and the set of all laterally-extending cavities 68 adjoined to the second cavity 69B collectively constitutes a second contiguous cavity (69B, 68). A bottommost laterally-extending cavity 68 within the second contiguous cavity (69B, 68) can be formed at the same level as a non-bottommost laterally-extending cavity 68 within the first contiguous cavity (69A, 68). In general, a total of n contiguous cavities can be formed such that the bottommost surface of each contiguous cavity is vertically offset from the bottommost surface of other contiguous cavities. In this case, the bottommost laterally-extending cavity 68 of each contiguous cavity can be vertically offset from one another. The number n can be an integer not less than 2.

The set of processing steps employed at the processing steps of FIGS. 26A, 26B, 27A, and 27B (or at the processing steps of FIGS. 28A, 28B, 29A, and 29B) can be repeatedly performed to alternately expand each trench (69A, 69B) vertically and laterally-extending cavities 68 laterally until one of the trenches (69A, 69B) extends through the bottommost second material layer (e.g., the bottommost sacrificial material layer 42). In one embodiment, a top surface of the semiconductor material layer 10 can be physically exposed at the bottom of one of the trenches (69A, 69B).

Referring to FIGS. 32A and 32B, each trench (e.g., the second trench 69B) that does not extend through the bottommost second material layer (e.g., the bottommost sacrificial material layer 42) can be etched employing an anisotropic etch process to vertically extend the respective trench through the bottommost second material layer. In one embodiment, a top surface of the semiconductor material layer 10 can be physically exposed at the bottom of each trench (69A, 69B).

Figures 33A, 33B:
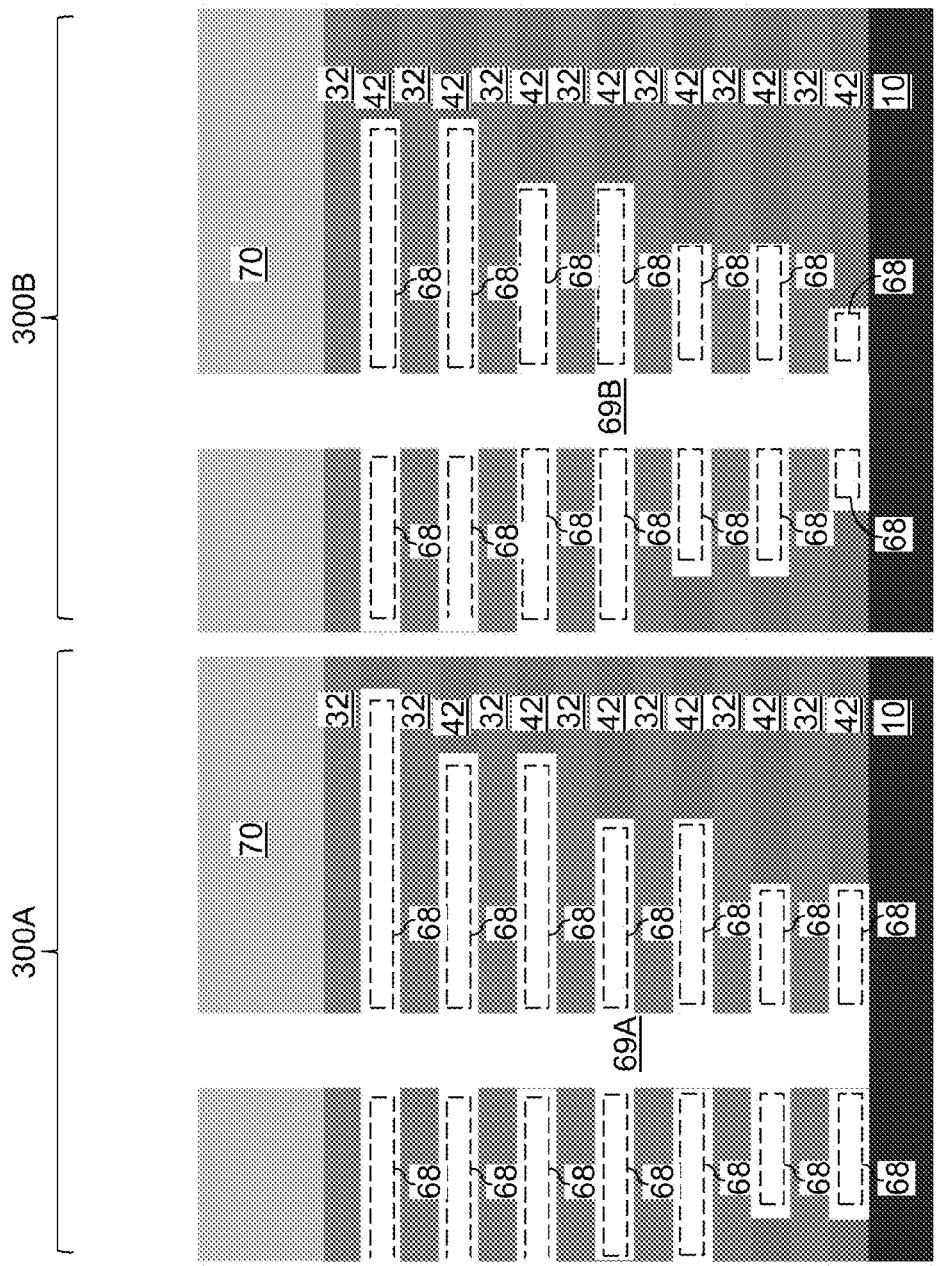
FIGS. 33A and 33B are vertical cross-sectional views of the first and second contact regions after laterally recessing physically exposed portions of sacrificial material layers according to the second embodiment of the present disclosure.
Figure 33C:
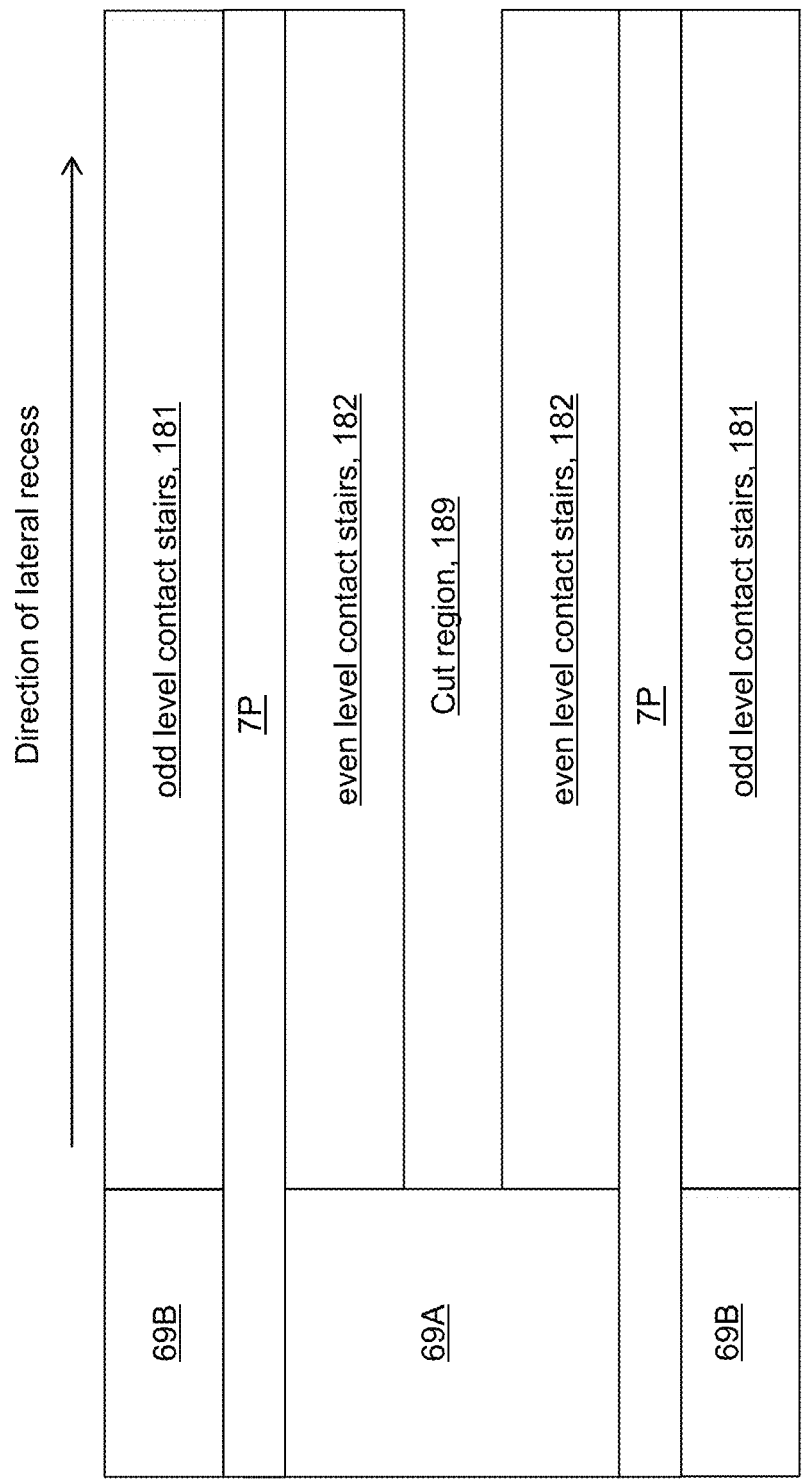
FIG. 33C is a schematic plan view of the third exemplary structure for an exemplary arrangement of first contact regions and second contact regions according to an embodiment of the present disclosure.
Figure 33E:
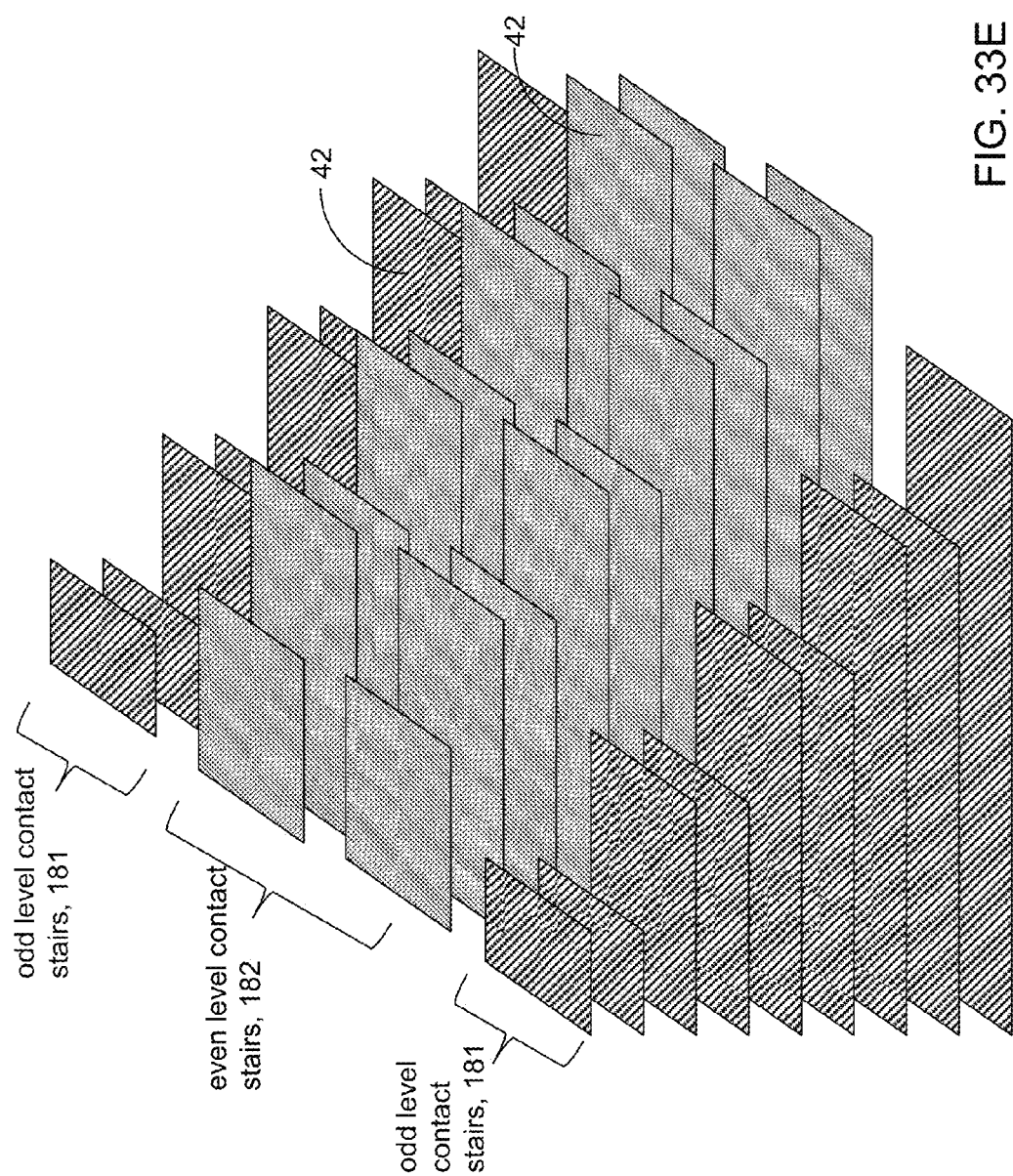
FIG. 33E is a schematic bird's eye view of the portion of the third exemplary structure of FIG. 33C from another angle in which areas of the sacrificial material layers in first and second contact regions are schematically represented according to an embodiment of the present disclosure.
Figures 34A, 34B:
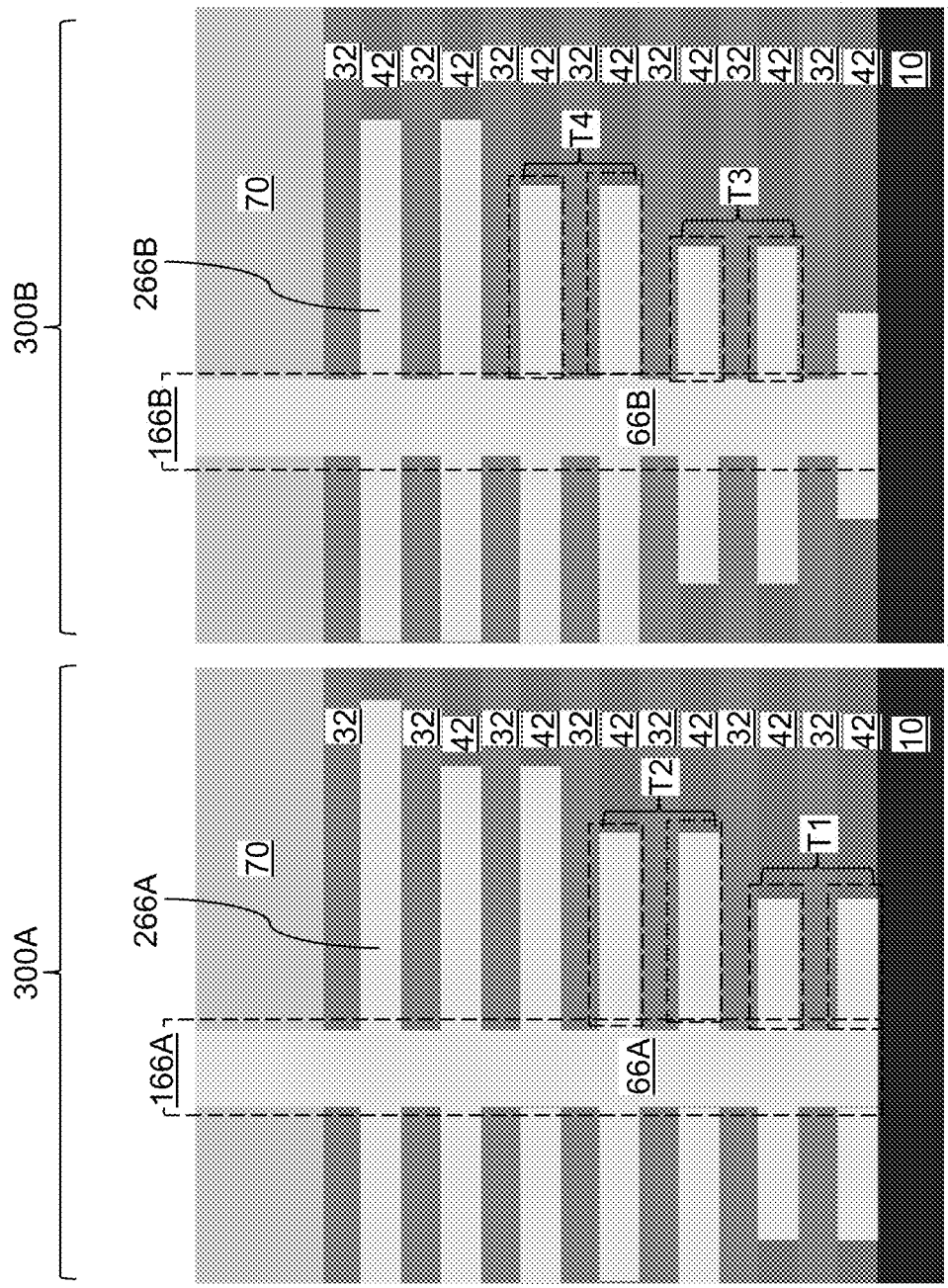
FIGS. 34A and 34B are vertical cross-sectional views of the first and second contact regions after formation of integrated dielectric structures according to an embodiment of the present disclosure.
Figure 35A:
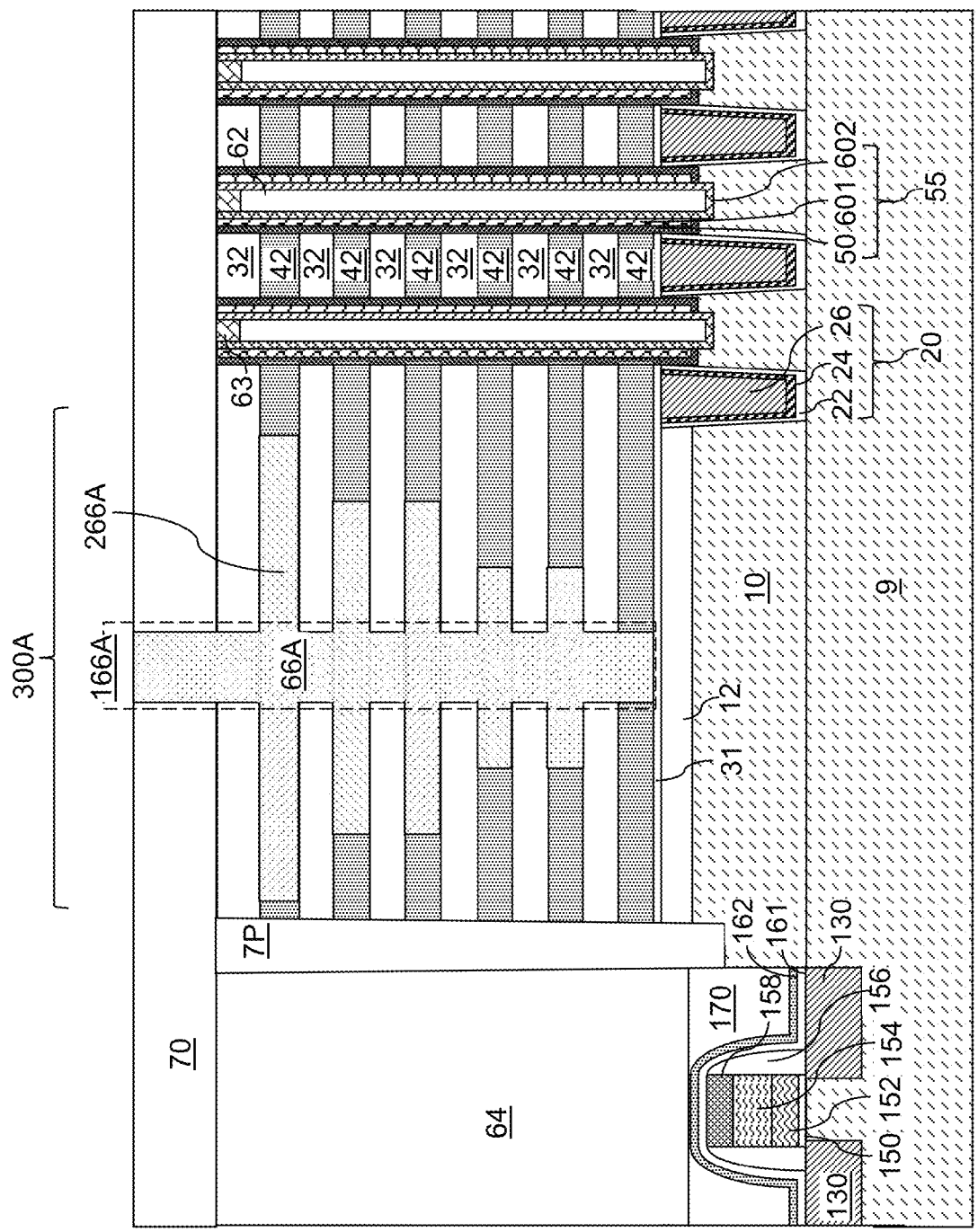
FIGS. 35A and 35B are vertical cross-sectional views of the second exemplary structure incorporating the first and second contact regions illustrated in FIGS. 34A and 34B according to an embodiment of the present disclosure.
Figure 35B:
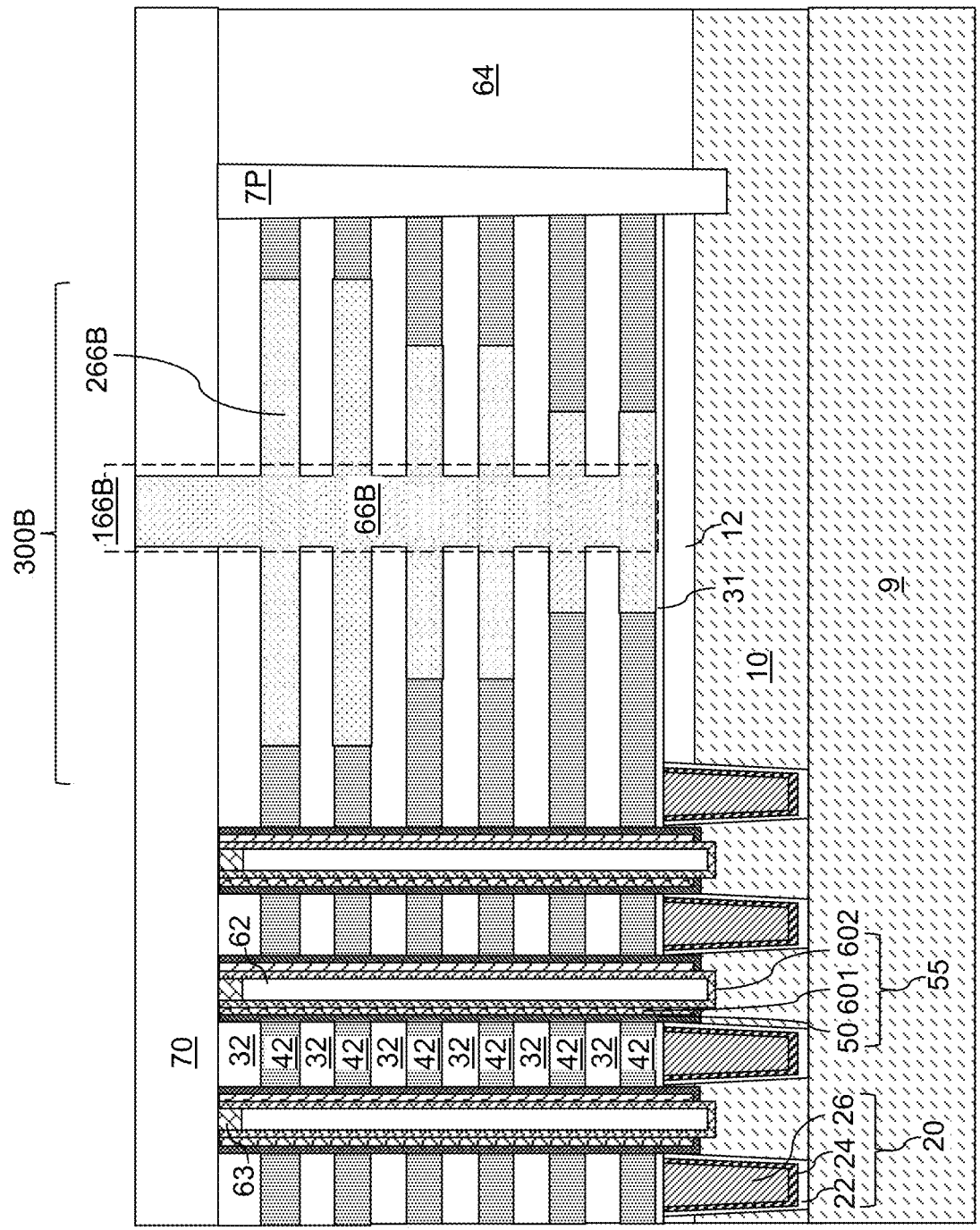

Referring to FIGS. 33A-33E, a last instance of the second processing step can be performed so that laterally-extending cavities 68 can be present at each level of the second material layers (e.g., the sacrificial material layers 42). Multiple instances of the first contact region illustrated in FIG. 33A and multiple instances of the second contact region in FIG. 33B can be incorporated into the third exemplary structure employing a various layout, an example of a top view of which is illustrated in FIG. 33C. FIG. 33D provides a bird's eye view in which the insulator layers 32 are omitted for clarity. In FIG. 33E, the insulator layers 32 and the at least one dielectric support pillar 7P are omitted for clarity, and the sacrificial material layers 42 are represented as rectangles to illustrate the spatial relationship between the lateral extent of the various sacrificial material layers 42 upon completion of formation of the laterally-extending cavities 68. Even level contact stairs 182 represent a set of top surfaces of the sacrificial material layers 42 that do not underlie any other sacrificial material layer 42 in a first contact region 300A, and odd level contact stairs 181 represent a set of top surfaces of the sacrificial material layers 42 that do not underlie any other sacrificial material layer 42 in a second contact region 300B. A cut region 189 can be provided between a neighboring pair of first contact regions 300A, or between a neighboring pair of second contact regions 300B so that a common trench (69A or 69B) can be employed to laterally recess the sacrificial material layers for multiple even level contact stairs or for multiple odd level contact stairs. In this example, the at least one dielectric support pillar 7P can be strips rather than cylindrical columns.

Referring to FIGS. 34A, 34B, 35A, and 35B, a dielectric material can be deposited within each integrated cavity {(69A, 68) or (69B, 68)} to fill each integrated cavity (69A, 69B, 68). The dielectric material can be deposited by a self-planarizing deposition process such as spin-coating, or by a conformal deposition process such as low pressure chemical vapor deposition (LPCVD) or atomic layer deposition (ALD). The deposited dielectric material can be spin-on glass (SOG) (which can be deposited by spin-coating), doped silicate glass, undoped silicate glass, or silicon nitride (if the sacrificial material layers 42 include a material different from silicon nitride). Excess portion of the dielectric material can be removed from above the hard mask layer 70 by a planarization process, which can include, for example, a chemical mechanical planarization (CMP) process and/or a recess etch process.

Each remaining portion of the deposited dielectric material constitutes an integrated dielectric structure (66A, 66B). A first integrated dielectric structure 66A can be formed in the volume of the first contiguous cavity (69A, 68), and a second integrated dielectric structure 66B can be formed in the volume of the second contiguous cavity (69B, 68). The first integrated dielectric structure 66A comprises a first dielectric pillar 166A and first horizontal dielectric fins 266A that are vertically spaced apart and adjoined to the first dielectric pillar. The volume of the first dielectric pillar can be the same as the volume of the first trench 69A, and the volume of the first horizontal dielectric fins can be the same as the volume of the laterally-extending cavities 68 that are adjoined to the first trench 69A prior to formation of the first integrated dielectric structure 66A. The second integrated dielectric structure 66B comprises a second dielectric pillar 166B and second horizontal dielectric fins 266B that are vertically spaced apart and adjoined to the second dielectric pillar. The volume of the second dielectric pillar can be the same as the volume of the second trench 69B, and the volume of the second horizontal dielectric fins can be the same as the volume of the laterally-extending cavities 68 that are adjoined to the second trench 69B prior to formation of the second integrated dielectric structure 66B.

The horizontal dielectric fins (266A or 266B) within each integrated dielectric structure (66A or 66B) include multiple sets {(T1, T2) or (T3, T4)} of vertically neighboring horizontal dielectric fins. The vertically neighboring horizontal dielectric fins within a same set (e.g., T1) among the multiple sets laterally extend by a same lateral distance from a dielectric pillar (e.g., the first dielectric pillar 166A). For any pair of an overlying set (e.g., T2) of vertically neighboring horizontal dielectric fins and an underlying set (e.g., T1) of vertically neighboring horizontal dielectric fins among the multiple sets, the overlying set (e.g., T2) of vertically neighboring horizontal dielectric fins laterally protrudes farther than the underlying set (e.g., T1) of vertically neighboring horizontal dielectric fins.

It is understood that the alternating stack (32, 42) may, or may not, contact the top surface of the substrate (9, 10), that the bottommost layer of the alternating stack (32, 42) may be an insulator layer 32 or a sacrificial material layer 42, that the topmost surface of the alternating stack (32, 42) may be an insulator layer 32 or a sacrificial material layer 42, that intervening layers such as a dielectric pad layer 12 and/or the dielectric cap layer 31 may, or may not, be present, and that each integrated dielectric structure (66A, 66B) may, or may not, contact the top surface of the substrate (9, 10).

Figure 36A:
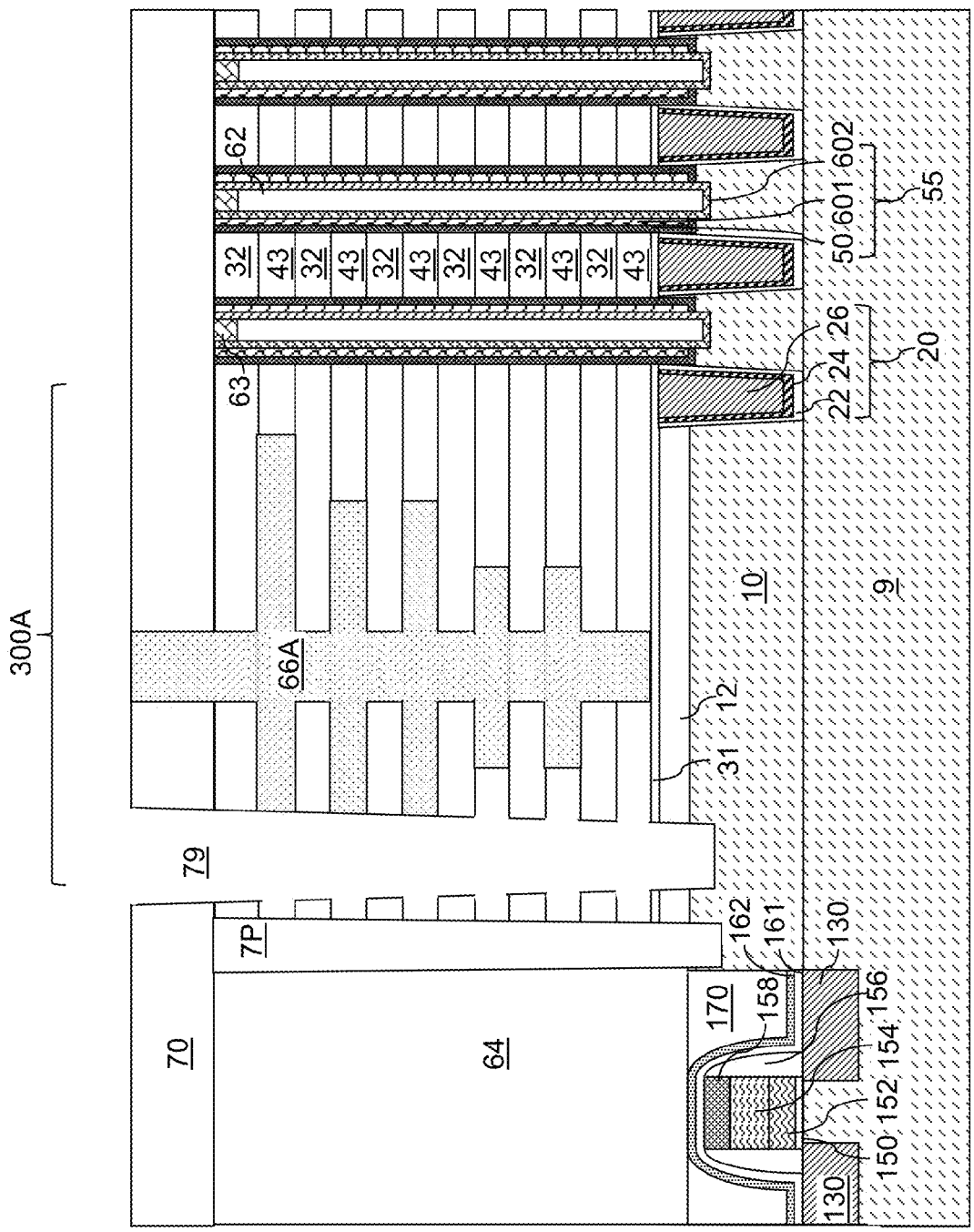
FIGS. 36A and 36B are vertical cross-sectional views of the second exemplary structure after formation of backside via cavities and backside recesses according to an embodiment of the present disclosure.
Figure 36B:
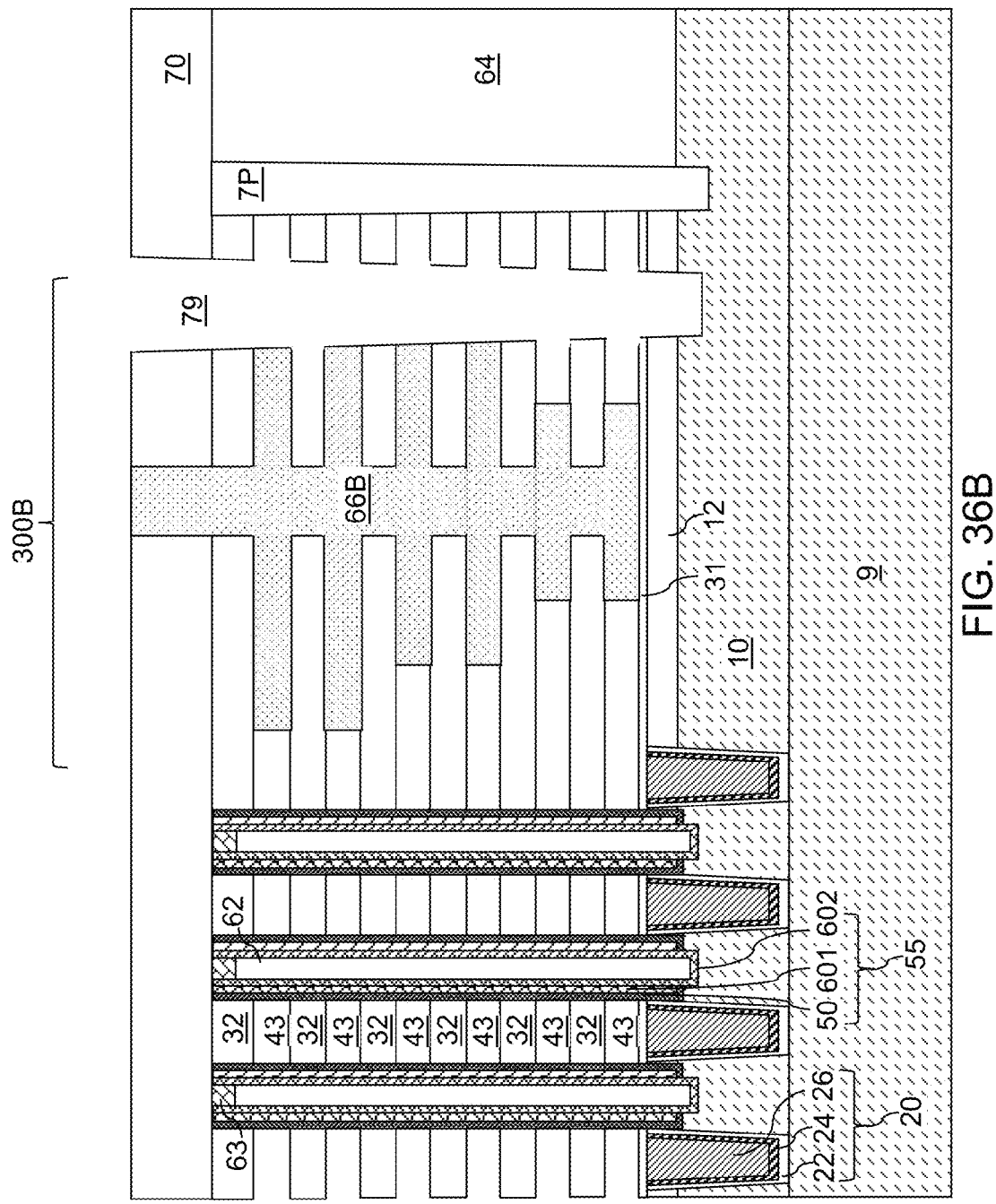

Referring to FIGS. 36A and 36B, a photoresist layer (not shown) can be applied over the hard mask layer 70 and the alternating stack (32, 42), and lithographically patterned to form at least one opening in the first and second contact regions (300A, 300B). The pattern in the photoresist layer can be transferred through the alternating stack (32, 42) and/or the integrated dielectric structures (66A, 66B) employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region (not shown) may be formed by implantation of dopant atoms into a portion of the substrate semiconductor layer 10 through the backside contact trench 79.

An etchant that selectively etches the second material of the sacrificial material layers 42 with respect to the first material of the insulator layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulator layers 32, the material of the at least one dielectric support pillar 7P, the material of the retro-stepped dielectric material portion 65, the semiconductor material of the substrate semiconductor layer 10, and the material of the outermost layer of the memory films 50. In one embodiment, the sacrificial material layers 42 can include silicon nitride, and the materials of the insulator layers 32, the at least one dielectric support pillar 7P, and the integrated dielectric structures (66A, 66B) can be selected from silicon oxide and dielectric metal oxides. In another embodiment, the sacrificial material layers 42 can include a semiconductor material such as polysilicon, and the materials of the insulator layers 32, the at least one dielectric support pillar 7P (that may have a shape of a rail), and the integrated dielectric structures (66A, 66B) can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, the integrated dielectric structures (66A, 66B), and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region comprises an array of monolithic three dimensional NAND strings having a plurality of device levels disposed above the substrate (9, 10). In this case, each backside recess 43 can define a space for receiving a respective word line of the array of monolithic three dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout. In one embodiment, each backside recess 43 can be laterally bounded by a sidewall of an integrated dielectric structure (66A or 66B).

Figure 37A:
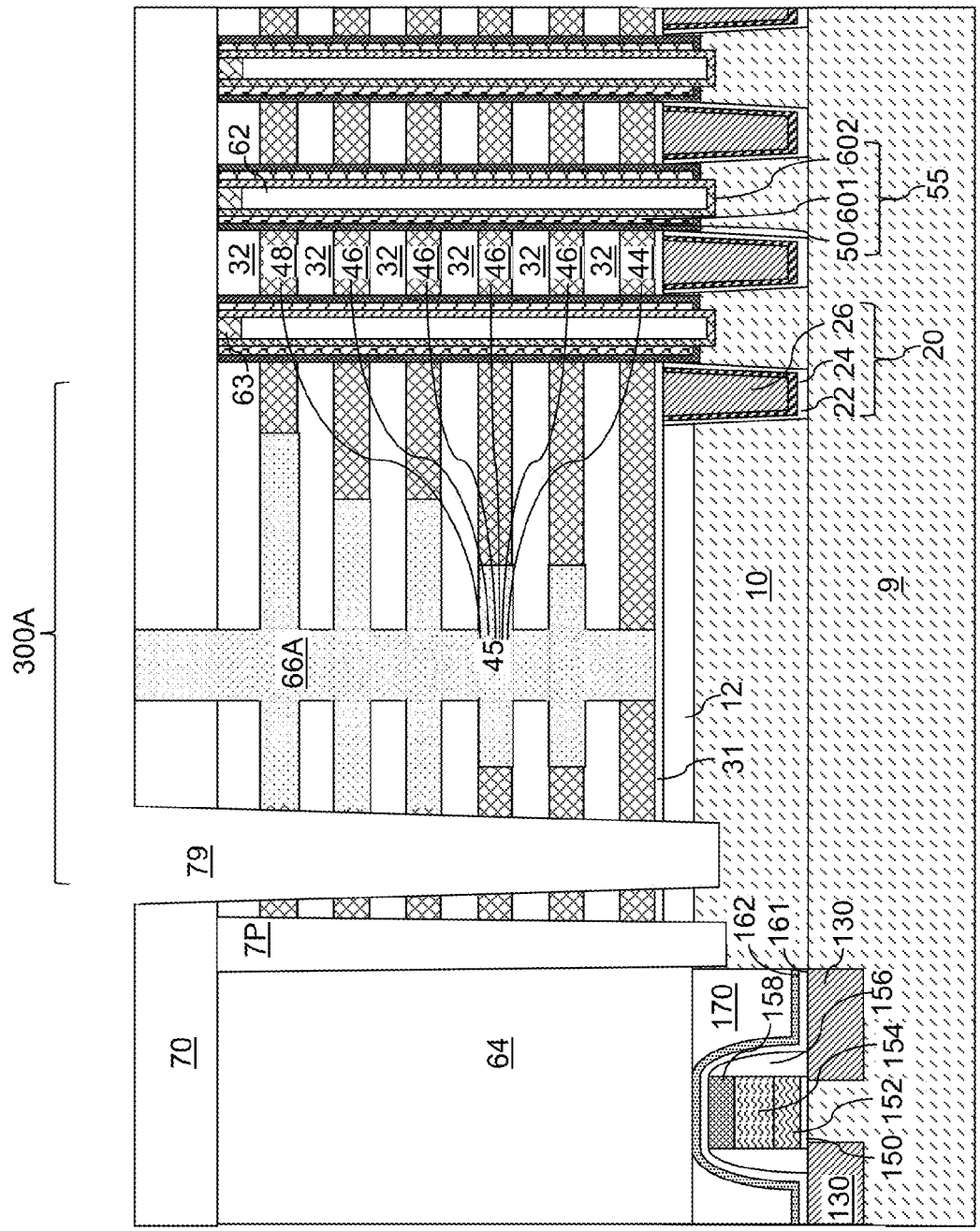
FIGS. 37A and 37B are vertical cross-sectional views of the second exemplary structure after formation of electrically conductive layers according to an embodiment of the present disclosure.
Figure 37B:
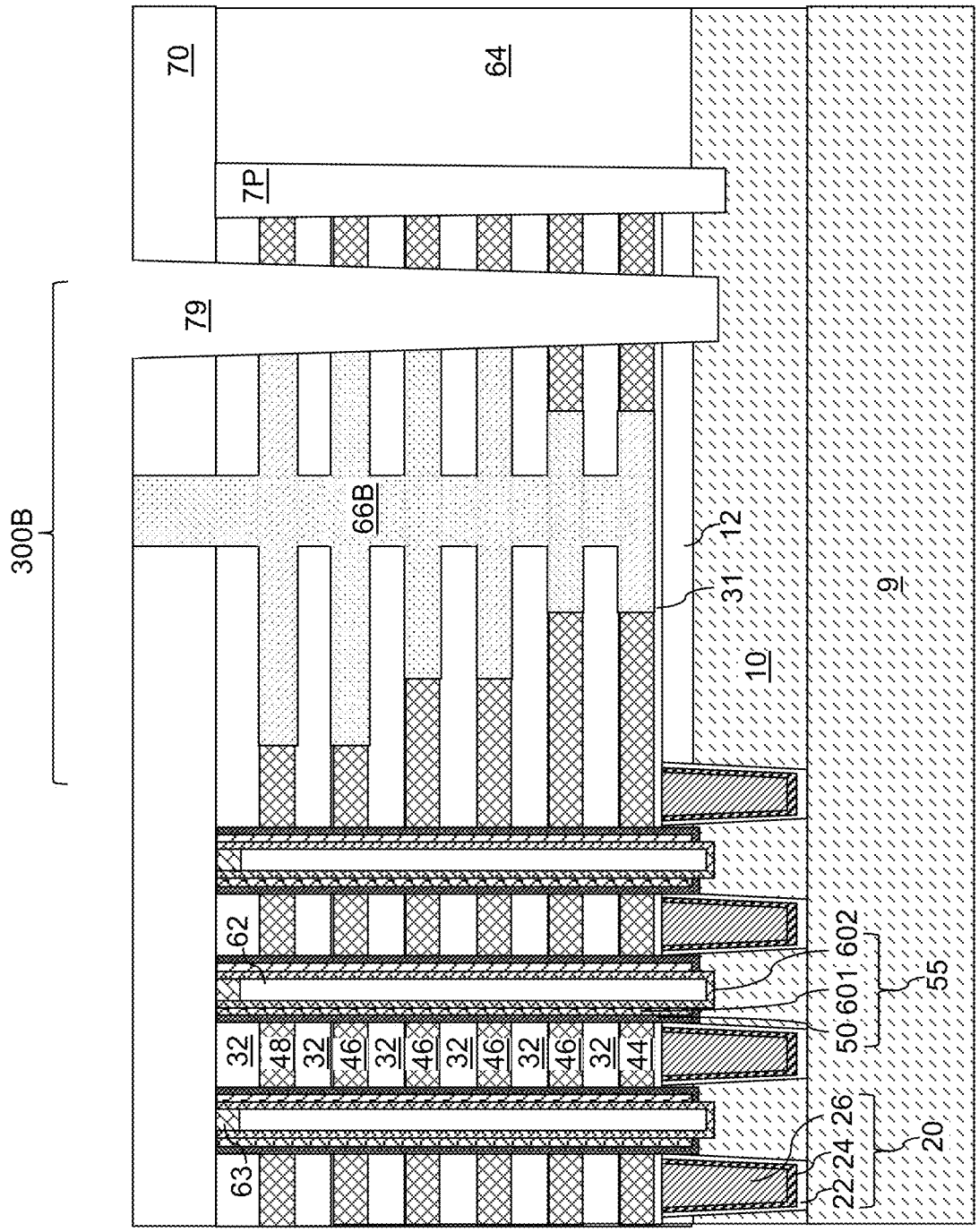

Referring to FIGS. 37A and 37B, the processing steps of FIG. 15 can be performed to form a plurality of electrically conductive layers 45 in the plurality of backside recesses 43, and to form an electrically conductive layer on the sidewalls of each backside contact trench 79 and over the hard mask layer 70. The deposited conductive material can be etched back from the sidewalls of each backside contact trench 79 and from above the hard mask layer 70, for example, by an isotropic etch. Each remaining portion of the deposited conductive material constitutes an electrically conductive layer 45.

Sidewalls of the plurality of electrically conductive layers 45 can contact sidewalls of the horizontal dielectric fins of the integrated dielectric structures (66A, 66B). The electrically conductive layers 45 may include at least one lower level electrically conductive layer 44, and/or at least one upper level electrically conductive layer 48. The electrically conductive layers 45 further include control gate level electrically conductive layers 46, which can include control gate electrodes for the memory stack structures 55.

Each control gate level electrically conductive layer 46 can function as a combination of a plurality of control gate electrodes and a word line electrically connecting, i.e., electrically shorting, the plurality of control gate electrodes. The plurality of control gate electrodes within control gate level electrically conductive layer 46 can include control gate electrodes located at the same level for the vertical memory devices including the memory stack structures 55. In other words, each control gate level electrically conductive layer 46 can be a word line that functions as a common control gate electrode for the plurality of vertical memory devices.

Each lower level electrically conductive layer 44 can function as a combination of a plurality of source select gate electrodes and a source select line electrically connecting, i.e., electrically shorting, the plurality of source select gate electrodes. The at least one lower level electrically conductive layer 44 can include source select gate electrodes for the vertical memory devices including the memory stack structures 55. In other words, each lower level electrically conductive layer 44 can be a source select line that functions as a common source select gate electrode for the plurality of vertical memory devices.

Each upper level electrically conductive layer 48 can function as a combination of a plurality of drain select gate electrodes and a drain select line electrically connecting, i.e., electrically shorting, the plurality of drain select gate electrodes. The at least one upper level electrically conductive layer 48 can include drain select gate electrodes for the vertical memory devices including the memory stack structures 55. In other words, each upper level electrically conductive layer 48 can be a drain select line that functions as a common drain select gate electrode for the plurality of vertical memory devices.

Figure 38A:
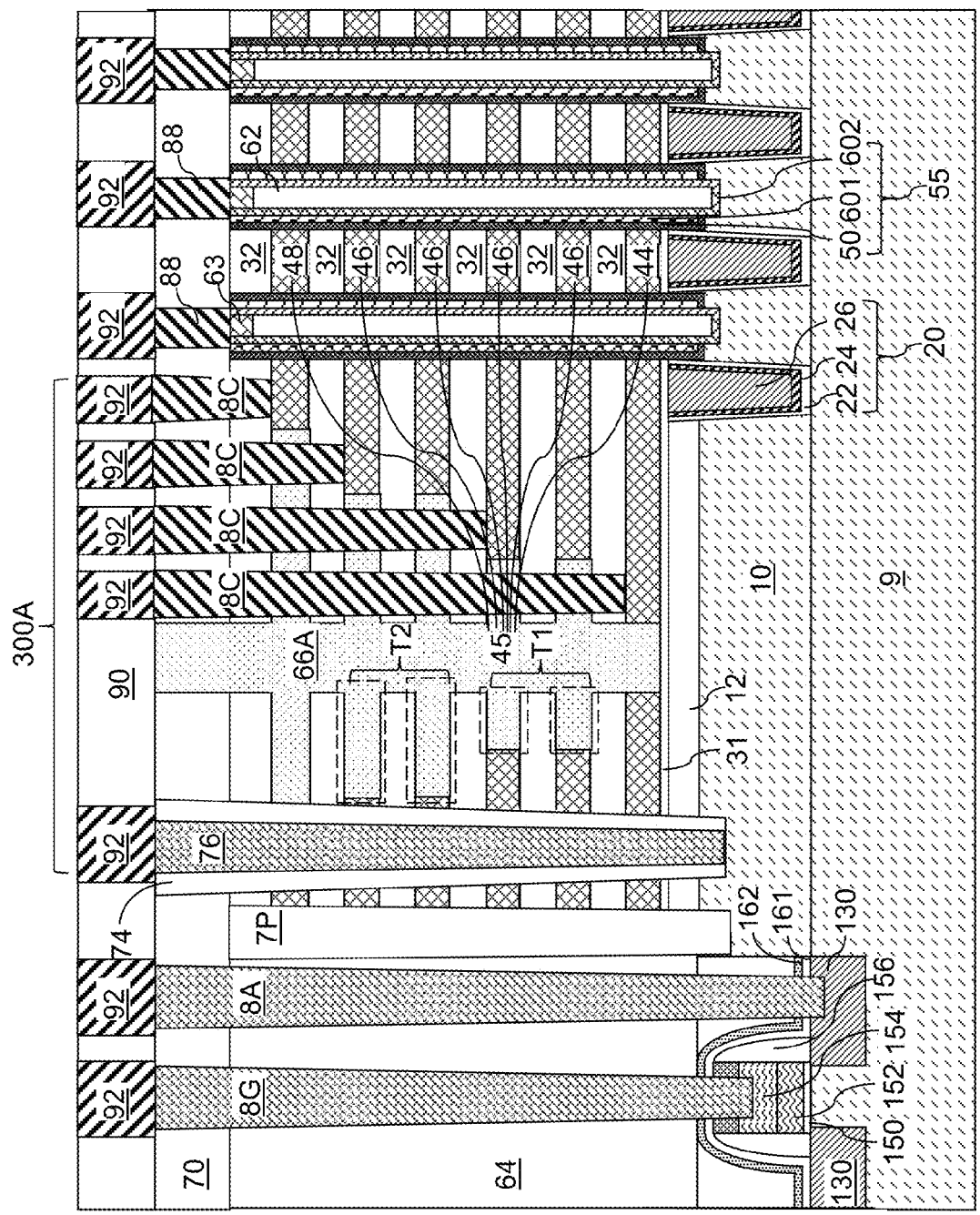
FIGS. 38A and 38B are vertical cross-sectional views of the second exemplary structure after formation of conductive via structures according to an embodiment of the present disclosure.
Figure 38B:
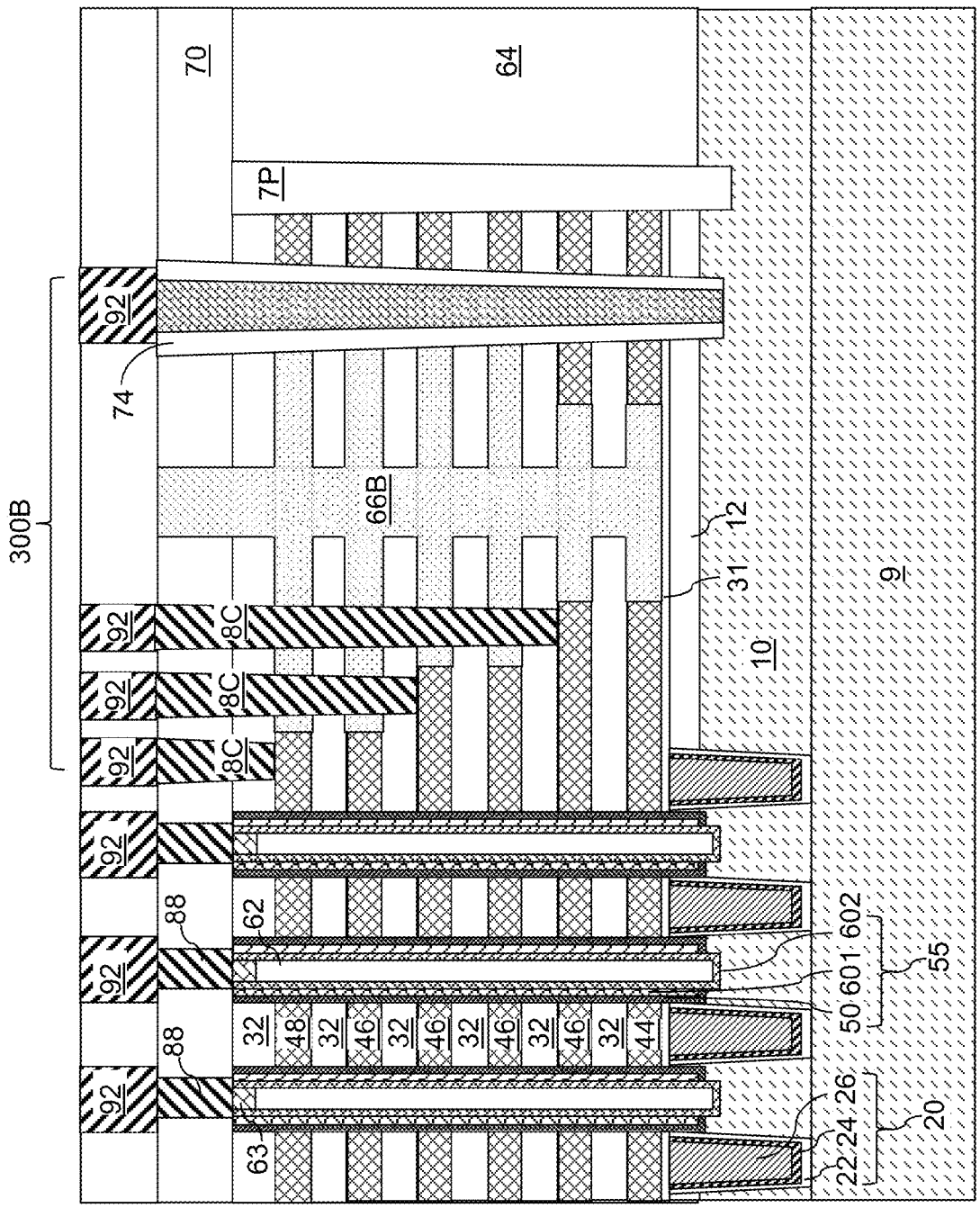

Referring to FIGS. 38A and 38B, the processing steps of FIGS. 16A and 16B can be performed to form at least one insulating spacer 74, at least one backside via contact structure 76, a line level dielectric layer 90, and various conductive line structures 92. The second exemplary structure is a three-dimensional structure that comprises a stack (32, 42) including an alternating plurality of first material layers (e.g., the insulator layers 32) and second material layers (e.g., the electrically conductive layers 46) located on a substrate (9, 10), and a first integrated dielectric structure 66A comprising a dielectric pillar (166A or 166B) and horizontal dielectric fins (266A or 266B) that are vertically spaced apart and adjoined to the dielectric pillar (166A or 166B). The horizontal dielectric fins (266A, 266B) include multiple sets (T1, T2) of vertically neighboring horizontal dielectric fins. Vertically neighboring horizontal dielectric fins within a same set among the multiple sets laterally extend by a same lateral distance from the dielectric pillar. For any pair of an overlying set (e.g., T2) of vertically neighboring horizontal dielectric fins and an underlying set (e.g., T1) of vertically neighboring horizontal dielectric fins among the multiple sets (e.g., (T1, T2)), the overlying set of vertically neighboring horizontal dielectric fins laterally protrudes farther than the underlying set of vertically neighboring horizontal dielectric fins. In one embodiment, each set (e.g., T1 or T2) among the sets of vertically neighboring horizontal dielectric fins includes the same number (e.g., 2) of vertically neighboring horizontal dielectric fins.

A plurality of contact via structures 8C can extend through the first integrated dielectric structure 66A, and can contact a respective second material layer (e.g., a respective electrically conductive layer 46). In one embodiment, a first array of contact via structures 8C can be formed through the first integrated dielectric structure 66A, and a second array of contact via structures 8C can be formed through the second integrated dielectric structure 66B. In one embodiment, each contact via structure 8C in the first array passes through only a single horizontal dielectric fin or an odd number of horizontal dielectric fins, and each contact via structure in the second array can pass through an even number of horizontal dielectric fins. If n trenches having different bottom surfaces and n different integrated dielectric structures corresponding to the n trenches are formed, contact via structures that pass through the i-th integrated dielectric structure can pass through kn+i number of horizontal dielectric fin(s) in which k is a non-negative integer, n is an integer greater than 1 and equaling the total number of trenches having bottom surfaces at different levels during the processing steps of FIGS. 34A, 34B, 35A, and 35B, and i is a positive integer not greater than n.

Each of the horizontal dielectric fins (266A or 266B) can be located at the same level as a respective second material layer (e.g., a respective electrically conductive layer 46). In addition to the first integrated dielectric structure 66A, a second integrated dielectric structure 66B is also present, which comprise a second dielectric pillar 166B and additional horizontal dielectric fins that are vertically spaced apart and adjoined to the second dielectric pillar. The additional horizontal dielectric fins include additional sets of vertically neighboring horizontal dielectric fins. Vertically neighboring horizontal dielectric fins within each additional set laterally extend by the same lateral distance from the second dielectric pillar. Each bottommost horizontal dielectric fin of a set among the multiple sets can be located at the same level as a non-bottommost horizontal dielectric fin of an additional set among the additional sets of vertically neighboring horizontal dielectric fins.

In one embodiment, each set (e.g., T1 or t2) among the multiple sets (T1, T2) of vertically neighboring horizontal dielectric fins can have sidewalls that are vertically coincident and vertically spaced by at least one of the first material layers (e.g., the insulator layers 32). In one embodiment, sidewalls of the first material layers can contact sidewalls of the dielectric pillar of each integrated dielectric structure (66A, 66B). In one embodiment, the integrated dielectric structures (66A, 66B) can differ in composition from the first and second material layers.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional structure, comprising:
    forming a stack comprising a plurality of first material layers and a plurality of second material layers, wherein individual first and second material layers alternate in the stack;
    forming a trench vertically extending through at least one second material layer;
    laterally recessing each of the at least one second material layer from the trench; and
    repeatedly performing a set of processing steps that includes:
        a first processing step of vertically extending the trench through at least one additional first material layer and at least one additional second material layer;
        a second processing step of laterally recessing each second material layer that is physically exposed in the trench or in a laterally-extending cavity adjoined to the trench;
    forming a first integrated dielectric structure by depositing a dielectric material within the trench and the laterally-extending cavities after repeated performance of the set of processing steps; and
    replacing portions of the second material layers with a plurality of electrically conductive layers after formation of the integrated dielectric structure.

2. The method of claim 1, wherein:
    the first integrated dielectric structure comprises a dielectric pillar and horizontal dielectric fins that are vertically spaced apart and adjoined to the dielectric pillar;
    the horizontal dielectric fins include multiple sets of vertically neighboring horizontal dielectric fins;
    vertically neighboring horizontal dielectric fins within a same set among the multiple sets laterally extend by a same lateral distance from the dielectric pillar;
    for any pair of an overlying set of vertically neighboring horizontal dielectric fins and an underlying set of vertically neighboring horizontal dielectric fins among the multiple sets, the overlying set of vertically neighboring horizontal dielectric fins laterally protrudes farther than the underlying set of vertically neighboring horizontal dielectric fins; and
    sidewalls of the plurality of electrically conductive layers contact sidewalls of the horizontal dielectric fins.

3. The method of claim 1, further comprising forming a plurality of conductive via structures through the horizontal dielectric fins of the first integrated dielectric structure and directly on the plurality of electrically conductive layers.

4. The method of claim 3, further comprising:
    forming a second integrated dielectric structure comprising a second dielectric pillar and additional horizontal dielectric fins that are vertically spaced apart and adjoined to the second dielectric pillar;
    forming a first array of contact via structures through the first integrated dielectric structure, wherein each contact via structure in the first array passes through only a single horizontal dielectric fin or an odd number of horizontal dielectric fins; and
    forming a second array of contact via structures through the second integrated dielectric structure, wherein each contact via structure in the second array passes through an even number of additional horizontal dielectric fins.

5. A method of forming a three-dimensional structure, comprising:
    forming a stack comprising a plurality of first material layers and a plurality of second material layers, wherein individual first and second material layers alternate in the stack;
    forming a trench vertically extending through at least one second material layer;
    laterally recessing each of the at least one second material layer from the trench;
    repeatedly performing a set of processing steps that includes:
        a first processing step of vertically extending the trench through at least one additional first material layer and at least one additional second material layer; and
        a second processing step of laterally recessing each second material layer that is physically exposed in the trench or in a laterally-extending cavity adjoined to the trench;
    forming a device on the substrate, wherein the device comprises a vertical NAND device; and
    replacing portions of the second material layer with a plurality electrically conductive layers, wherein at least one of the plurality of electrically conductive layers comprises, or is electrically connected to, a word line of the vertical NAND device.

6. The method of claim 5, wherein:
    the vertical NAND device comprises:
        a plurality of semiconductor channels, wherein at least one end portion of each of the plurality of semiconductor channels extends substantially perpendicular to a top surface of the semiconductor substrate;
        a plurality of charge storage elements, each charge storage element located adjacent to a respective one of the plurality of semiconductor channels; and
        a plurality of control gate electrodes having a strip shape extending substantially parallel to the top surface of the substrate;
    the plurality of control gate electrodes comprise at least a first control gate electrode located in the first device level and a second control gate electrode located in the second device level;
    the electrically conductive layers in the stack comprise, or are in electrical contact with, the plurality of control gate electrodes and extends from the device region to a contact region containing the plurality of electrically conductive via connections; and
    the substrate comprises a silicon substrate containing a driver circuit for the vertical NAND device.

7. A method of forming a three-dimensional structure, comprising:
    forming a stack including an alternating plurality of separator layers and interlayers on a substrate;
    exposing a first sidewall of a first interlayer located between first and second separator layers without exposing a second sidewall of a second interlayer that is located below the first and second separator layers and above a third separator layer;
    laterally recessing the first interlayer without etching the second interlayer;
    exposing the second sidewall of the second interlayer without exposing a third sidewall of a third interlayer;

laterally recessing the first and second interlayers simultaneously, wherein exposing the second sidewall and laterally recessing the first and second interlayers simultaneously are performed during separate processing steps employing different etch processes; and forming an integrated dielectric structure comprising a dielectric pillar and horizontal dielectric fins that are vertically spaced apart and adjoined to the dielectric pillar by filling the trench and recessed volumes of the interlayers with a dielectric material, wherein the method comprises at least one feature selected from:

a first feature that the horizontal dielectric fins include multiple sets of vertically neighboring horizontal dielectric fins, vertically neighboring horizontal dielectric fins within a same set among the multiple sets laterally extend by a same lateral distance from the dielectric pillar, and, for any pair of an overlying set of vertically neighboring horizontal dielectric fins and an underlying set of vertically neighboring horizontal dielectric fins among the multiple sets, the overlying set of vertically neighboring horizontal dielectric fins laterally protrudes farther than the underlying set of vertically neighboring horizontal dielectric fins; and a second feature that the method further comprises a step of replacing remaining portions of the interlayer layers with electrically conductive layers after formation of the integrated dielectric structure.

8. The method of claim 7, wherein the first interlayer is laterally recessed to a greater lateral extent than the second interlayer.

9. The method of claim 7, further comprising repeatedly performing a set of additional processing steps that include:

exposing a previously unexposed sidewall of an additional underlying interlayer from below a subset of the stack that includes layers having a physically exposed sidewall; and laterally recessing the additional underlying interlayer that has a newly exposed sidewall.

10. The method of claim 7, wherein the method comprises the first feature.

11. The method of claim 7, wherein the method comprises the second feature.

12. The method of claim 11, further comprising forming a plurality of contact via structures that extend through the integrated dielectric structure and contacting a respective electrically conductive layer.

* * * * *